United States Patent
David et al.

(10) Patent No.: US 11,133,652 B2
(45) Date of Patent: Sep. 28, 2021

(54) OPTICAL DEVICES AND METHODS OF MANUFACTURE AND OPERATION

(71) Applicants: Aurelien David, San Francisco, CA (US); Rafael I. Aldaz, Pleasanton, CA (US)

(72) Inventors: Aurelien David, San Francisco, CA (US); Rafael I. Aldaz, Pleasanton, CA (US)

( * ) Notice: Subject to any disclaimer, the term of this patent is extended or adjusted under 35 U.S.C. 154(b) by 0 days.

(21) Appl. No.: 16/945,719

(22) Filed: Jul. 31, 2020

(65) Prior Publication Data

US 2020/0366067 A1 Nov. 19, 2020

Related U.S. Application Data

(60) Provisional application No. 62/840,566, filed on Apr. 30, 2019.

(51) Int. Cl.
| | |
|---|---|
| *H01S 5/10* | (2021.01) |
| *H01S 5/42* | (2006.01) |
| *B82Y 20/00* | (2011.01) |
| *H01S 5/04* | (2006.01) |
| *H01S 5/14* | (2006.01) |
| H01S 5/183 | (2006.01) |

(52) U.S. Cl.
CPC .............. *H01S 5/423* (2013.01); *B82Y 20/00* (2013.01); *H01S 5/041* (2013.01); *H01S 5/141* (2013.01); H01S 5/1021 (2013.01); H01S 5/18388 (2013.01)

(58) Field of Classification Search
CPC ........ H01S 5/423; H01S 5/1021; H01S 5/183; H01S 5/18305; H01S 5/0651; H01S 5/041; H01S 5/141; B82Y 20/00
See application file for complete search history.

(56) References Cited

U.S. PATENT DOCUMENTS

2002/0176473 A1* 11/2002 Mooradian ............. H01S 5/142
372/92

* cited by examiner

*Primary Examiner* — Michael Carter
(74) *Attorney, Agent, or Firm* — Garrett IP

(57) ABSTRACT

Optical devices and methods of manufacturing and operating such optical devices. In an embodiment, an optical device includes a substrate, a multi-layer structure having a first surface in contact with a first surface of the substrate, a first mirror disposed over a second surface of the multi-layer structure, a second mirror disposed over a second surface of the substrate, an intermediate mirror within the multi-layer structure, and an optical gain structure within the multi-layer structure. The device may include a first optically resonant cavity within the multi-layer structure, bounded by the first mirror and the intermediate mirror, where the first optically resonant cavity includes the optical gain structure. The device may further include a second optically resonant cavity, bounded by the first and second mirrors, where the second optically resonant cavity includes the first optically resonant cavity, the second optically reflective layer, and the substrate.

29 Claims, 40 Drawing Sheets

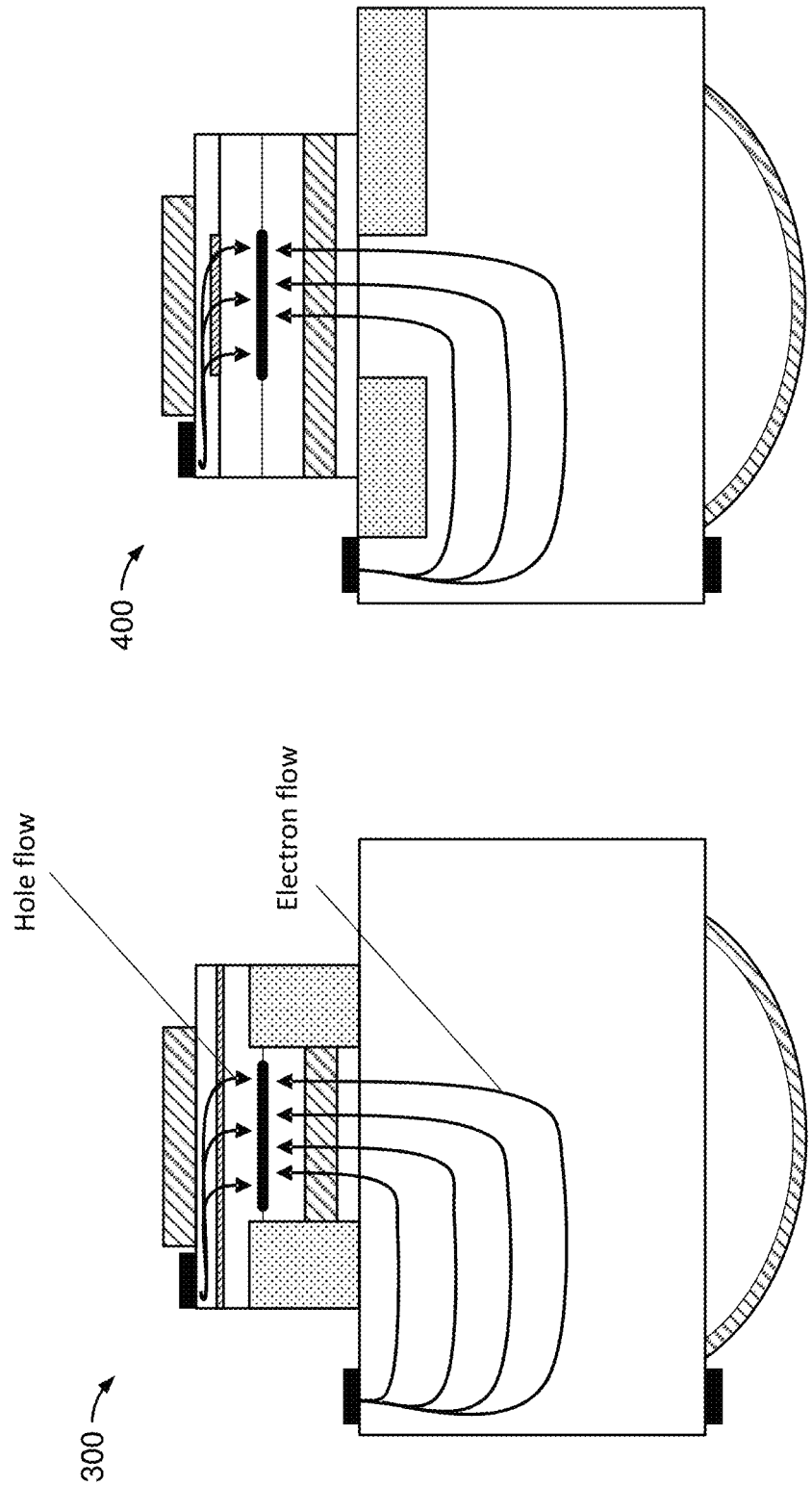

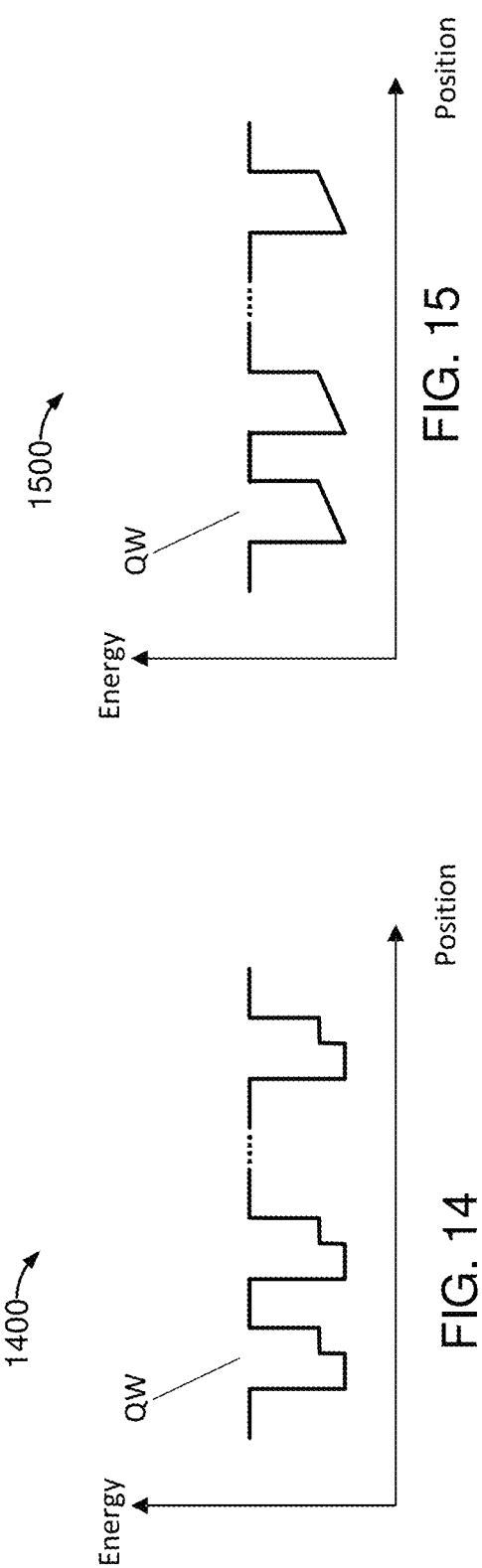

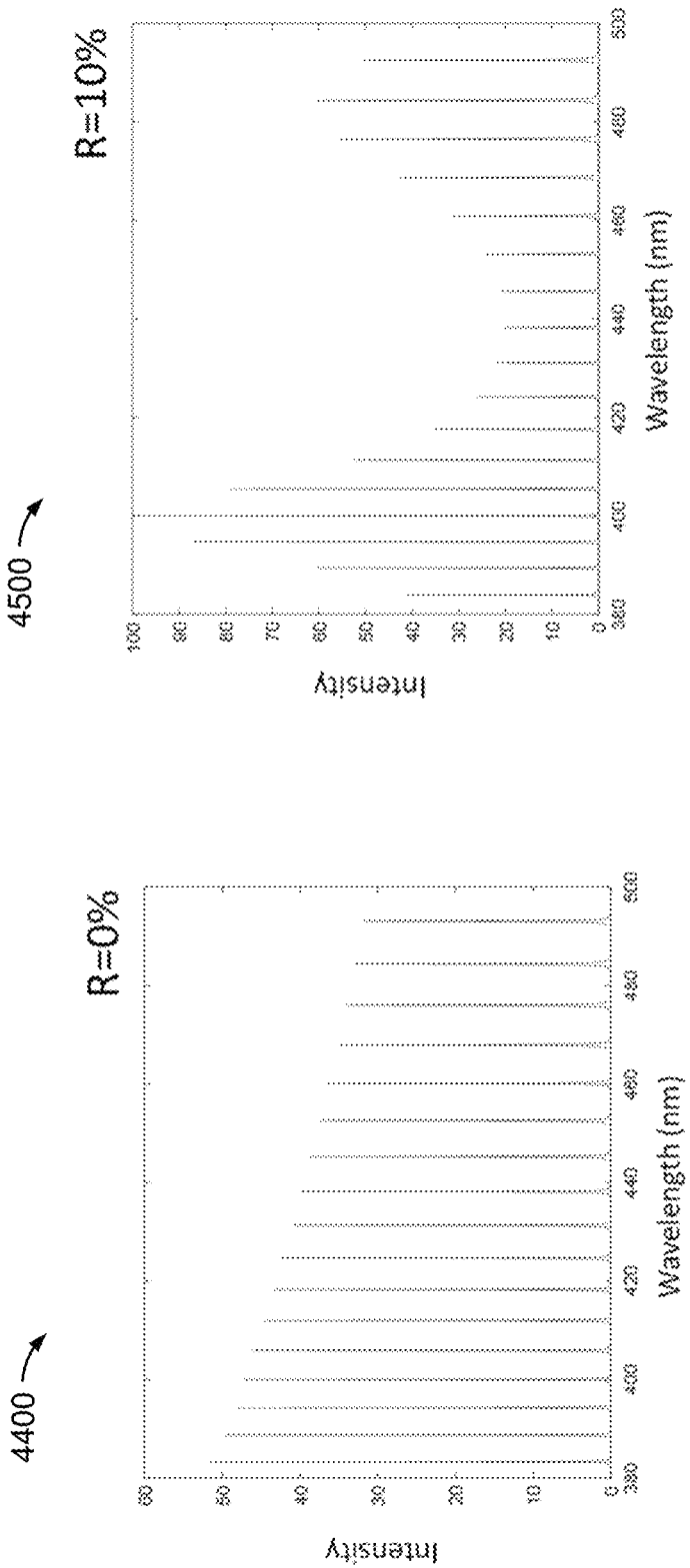

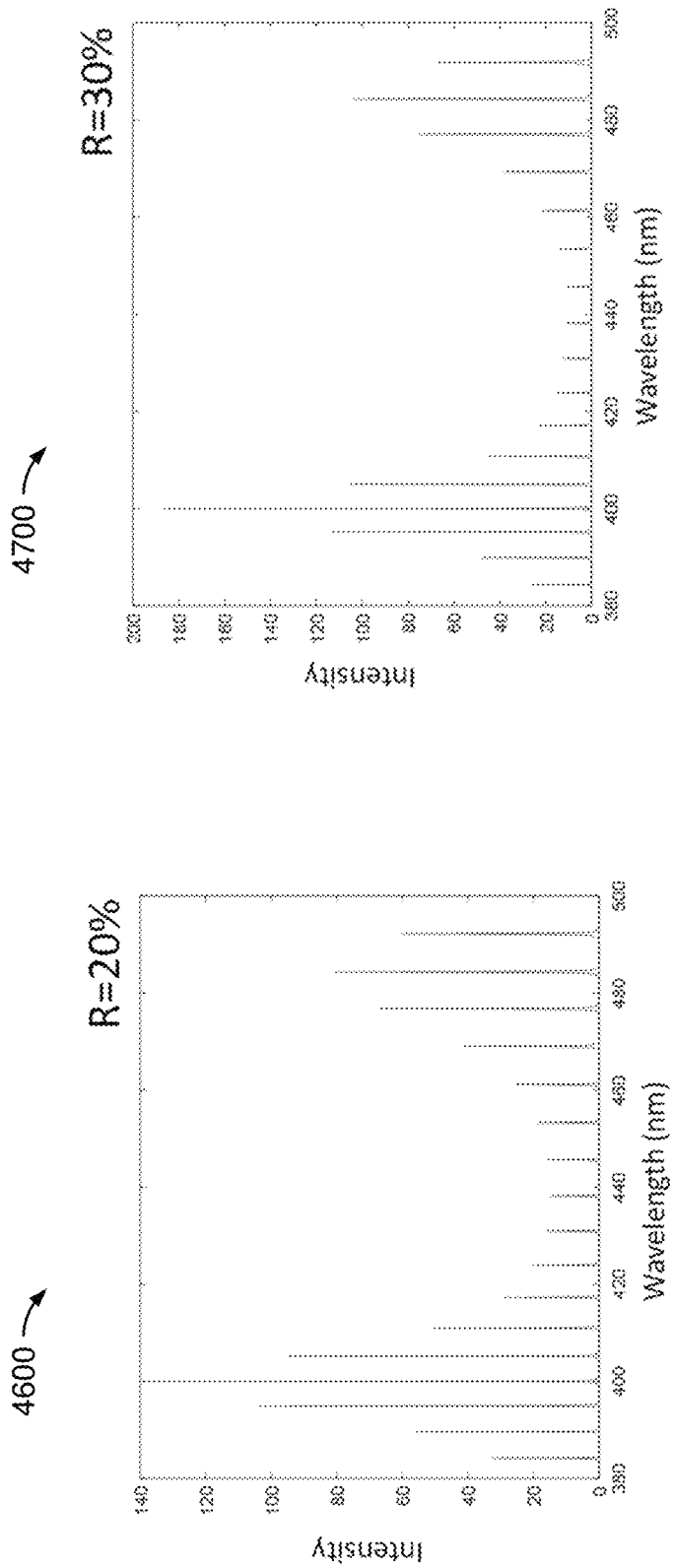

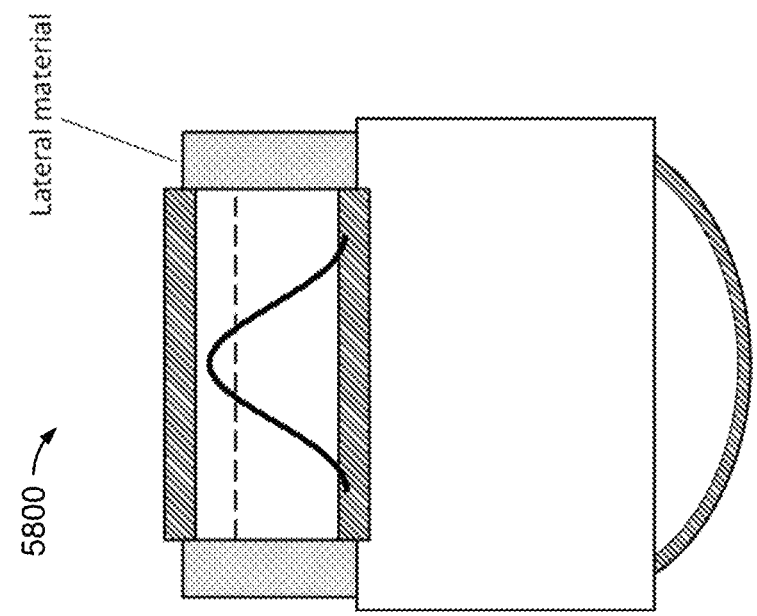
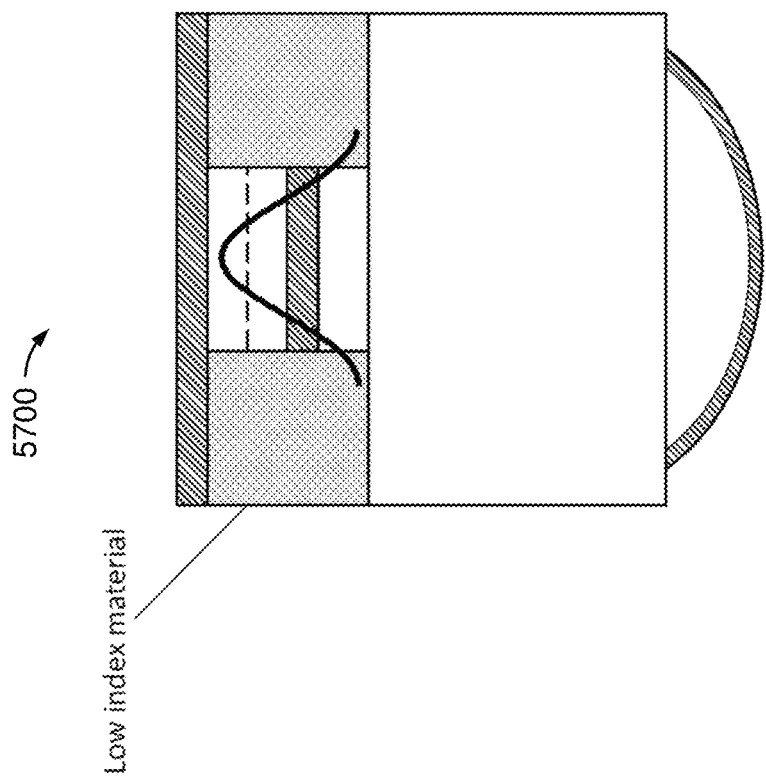
FIG. 57
FIG. 58

OPTICAL DEVICES AND METHODS OF MANUFACTURE AND OPERATION

CROSS REFERENCE TO RELATED APPLICATIONS

This application claims the benefit of U.S. Provisional Patent Application No. 62/840,566, filed Apr. 30, 2019, which is incorporated herein by reference in its entirety.

BACKGROUND

Conventional optical devices that utilize stimulated emission/lasing often use one of two geometries: in-plane or VCSEL-type, each with distinct properties. In some cases, these devices suffer from insufficient performance, which may be caused by improper device design and excessive loss. As an example, III-nitride VCSEL may lack in performance (e.g. excessive losses, high threshold current, low efficiency . . . )

What is needed is a stimulated-emission/lasing device which improves upon these limitations to offer improved performance.

BRIEF DESCRIPTION OF THE DRAWINGS/FIGURES

FIG. 3 is an illustration of another optical device.

FIG. 4 is an illustration of an optical device in which a current aperture is formed in the substrate, controlling electron flow.

FIG. 14 shows multiple quantum wells where the composition is varied in steps.

FIG. 15 shows multiple quantum wells where the composition is varied by grading.

Figure 36:
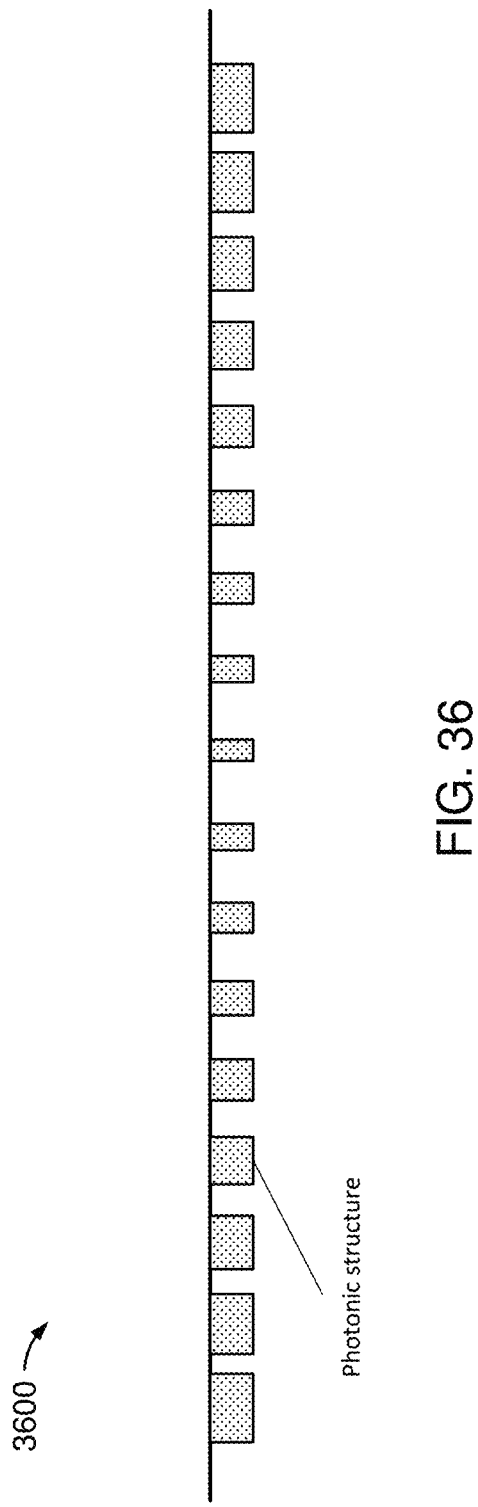
FIG. 36 illustrates a photonic structure whose features vary in shape/size across a lateral dimension.
Figure 39:
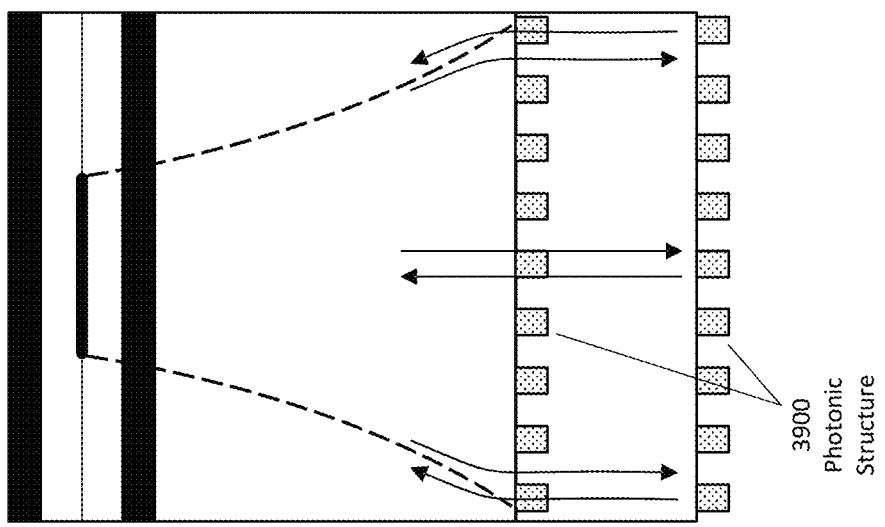
Figure 38:
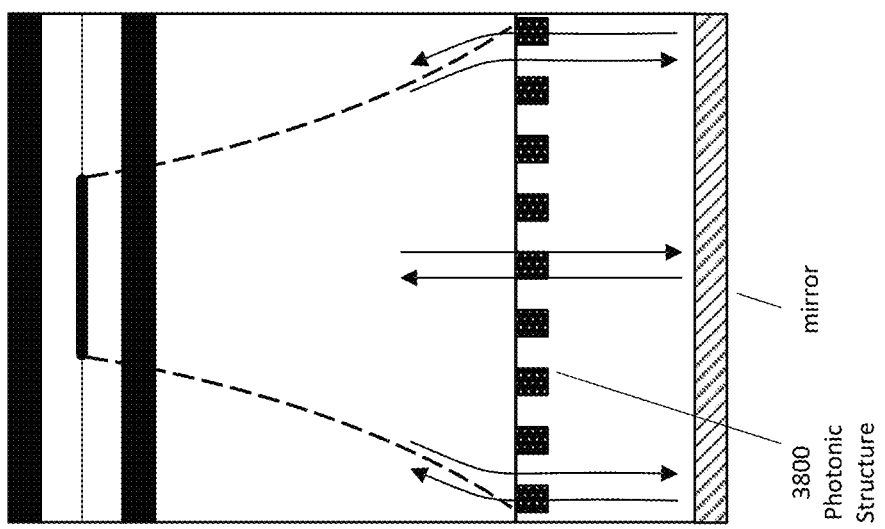
Figure 37:
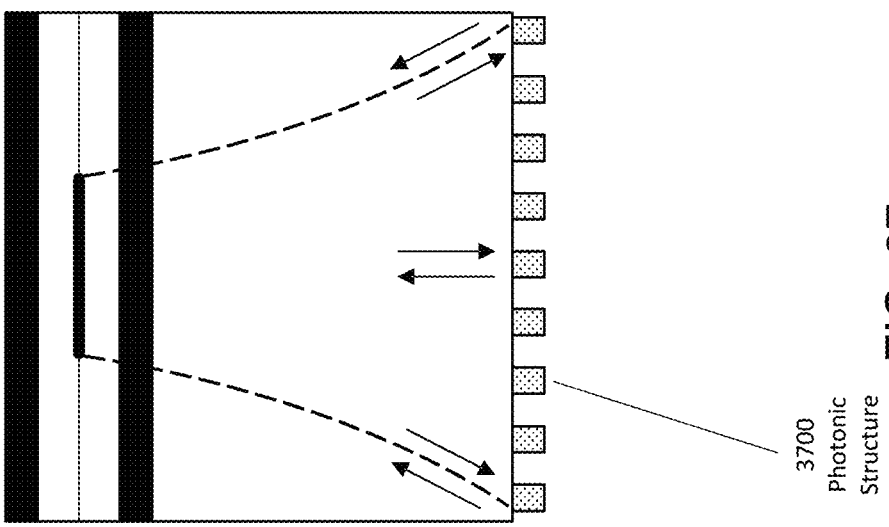

FIGS. 37, 38, and 39 illustrate example modes of operation for photonic structures similar to the photonic structure of FIG. 36.

Figure 40:
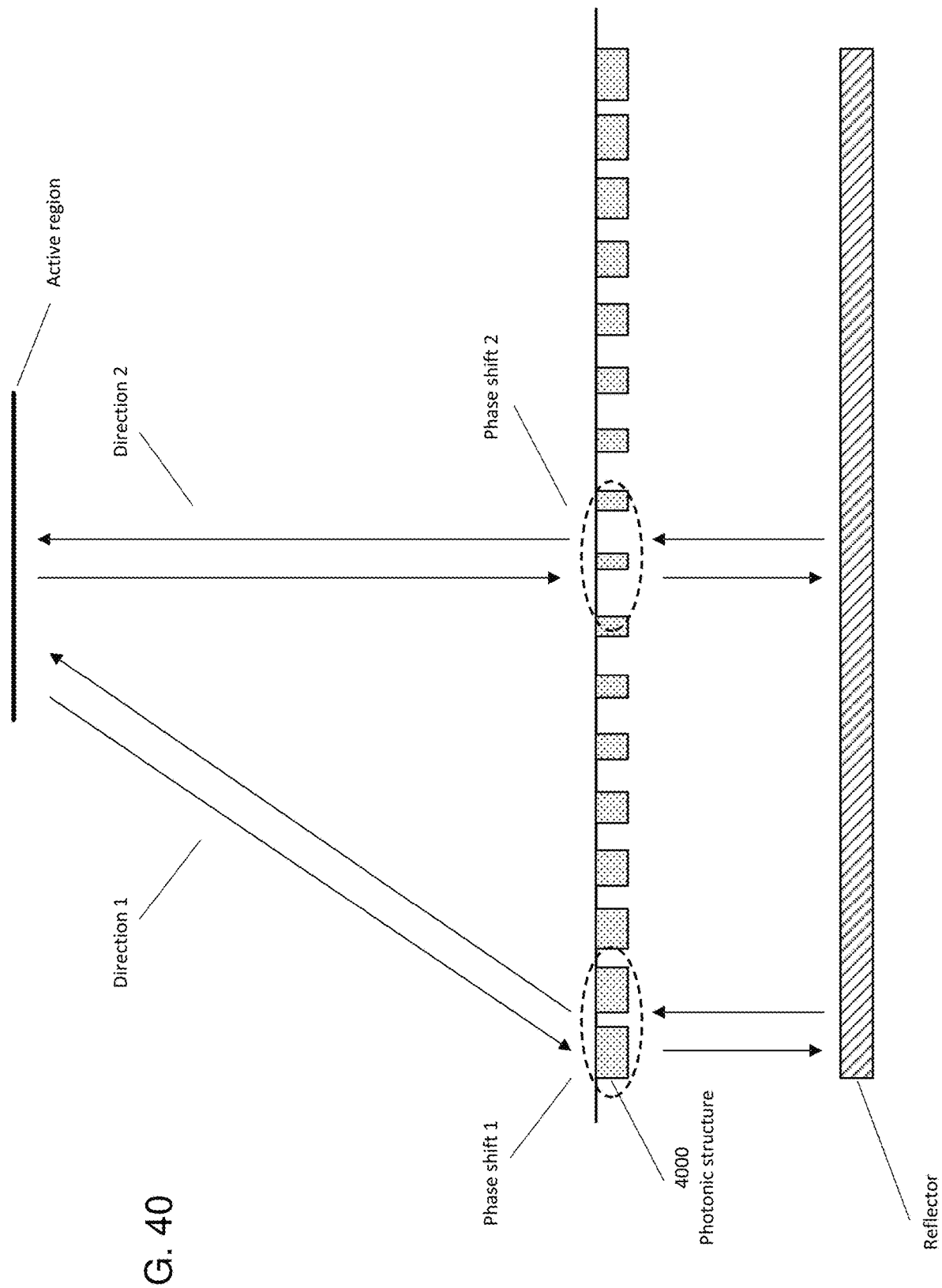

FIG. 40 is an illustration of another photonic structure.

Figure 41:
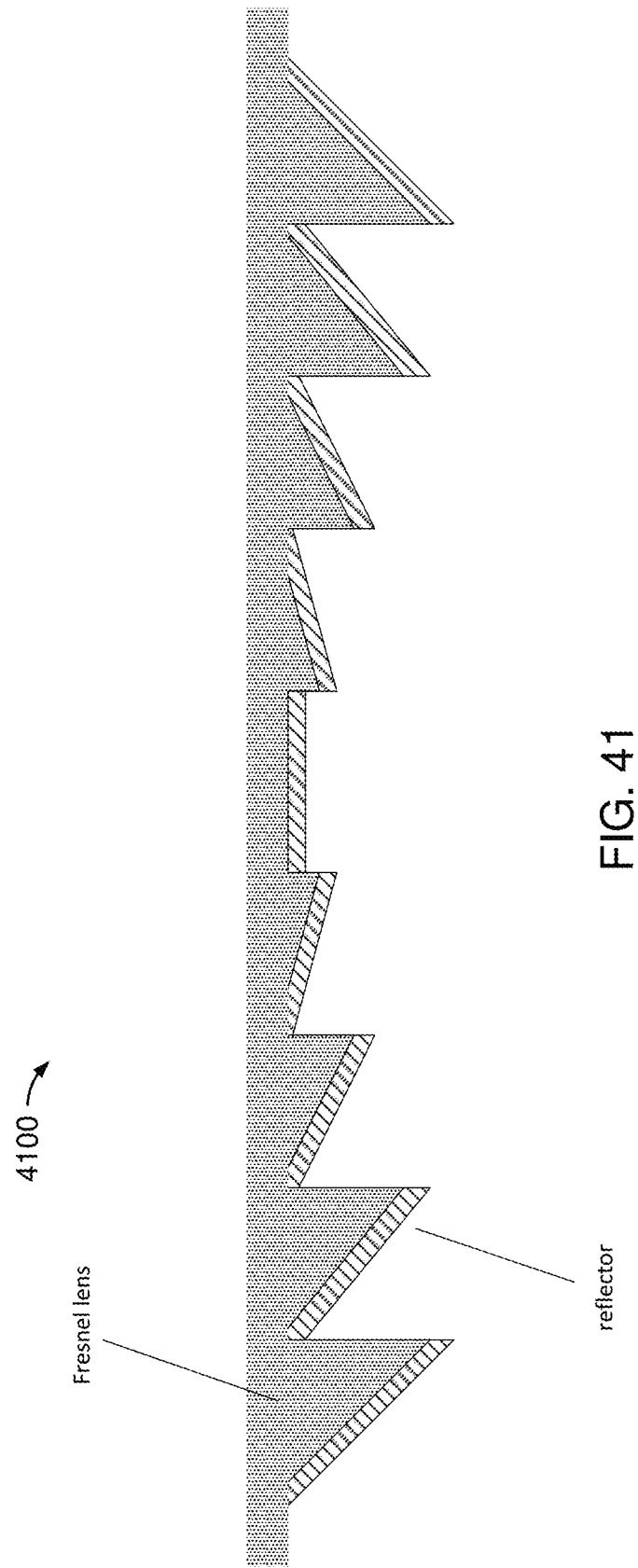

FIG. 41 illustrates a portion of a device in which a bottom mirror includes a Fresnel lens and a reflective material (such as a DBR) formed on the Fresnel lens.

Figure 42:
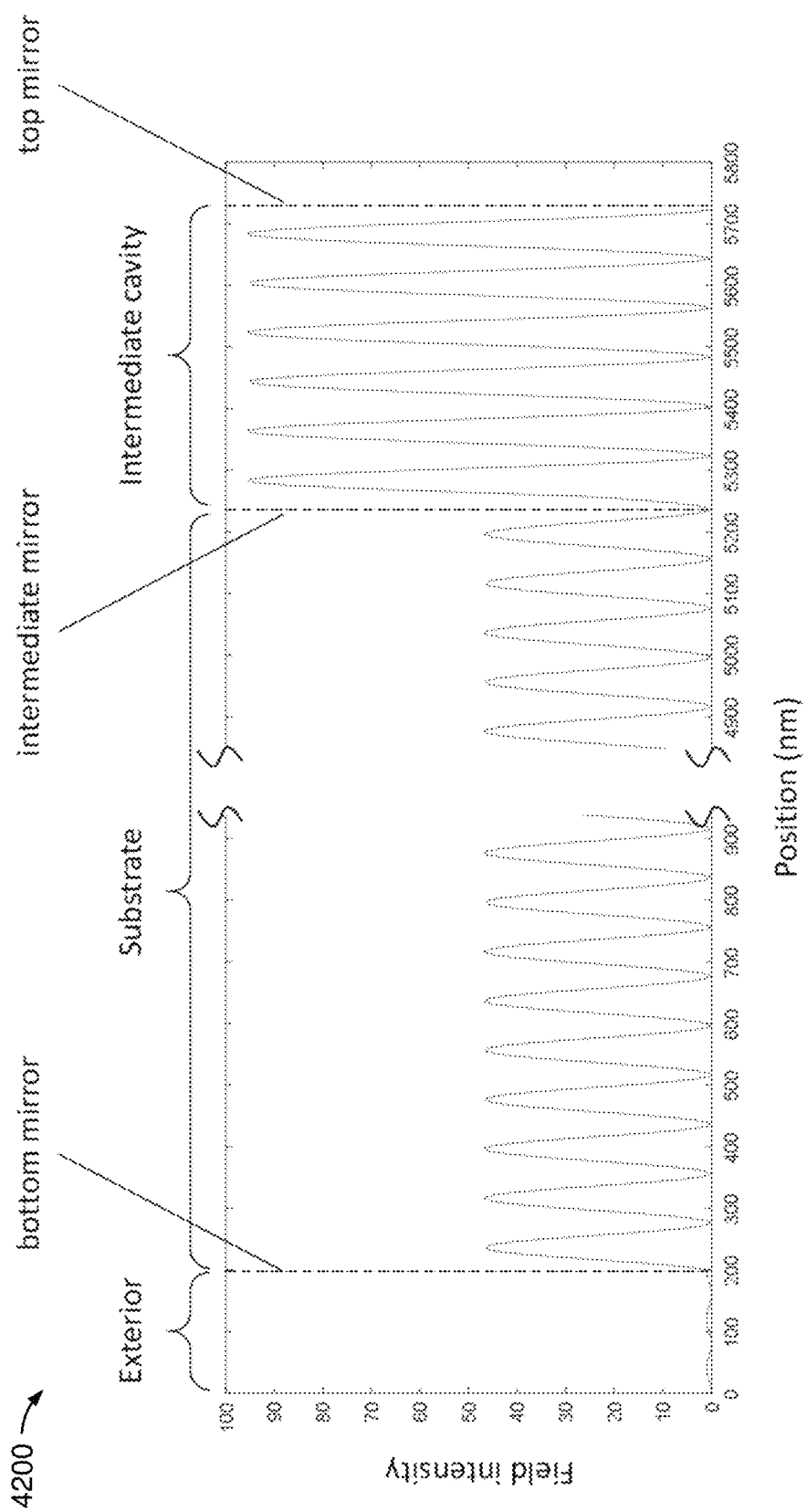

FIG. 42 is a graph to illustrate simulated field intensity (i.e. the square of the electric field) across the cavity for a simplified structure.

Figure 43:
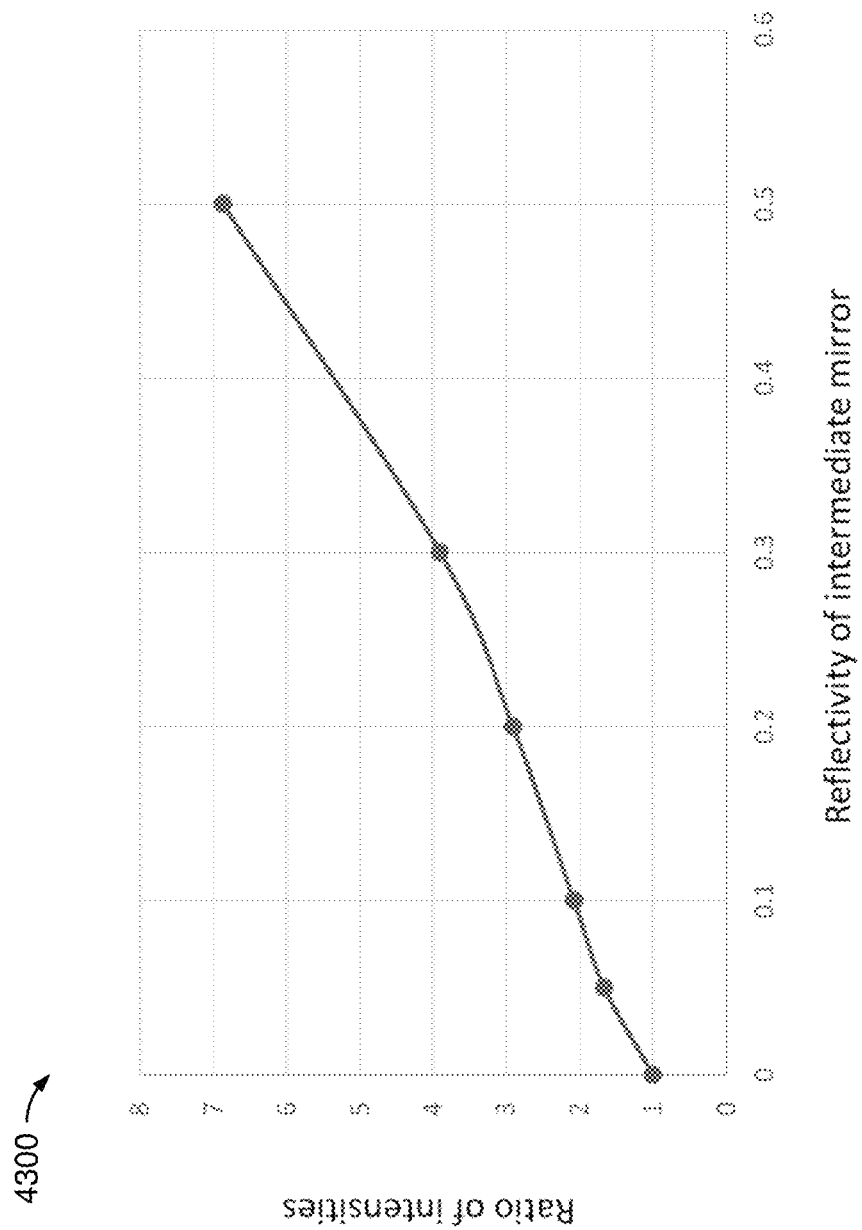

FIG. 43 is a graph to illustrate modeling results of the following ratio: r=(peak mode intensity in the intermediate cavity/peak mode intensity in the substrate), for various values of the intermediate mirror reflectivity.

FIG. 44-47 are graphs that show the modeled peak mode intensity in the cavity versus wavelength, for several values of the intermediate reflectivity R.

Figure 49:
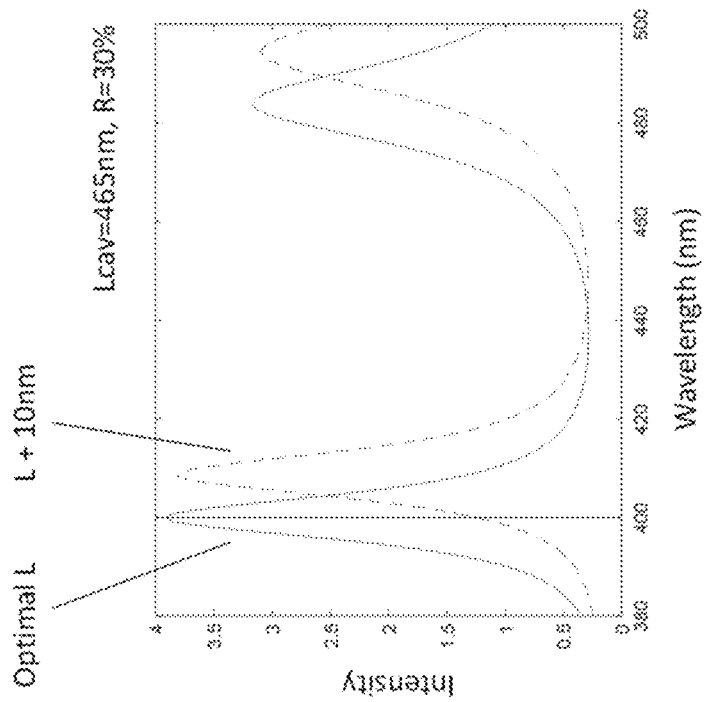
Figure 48:
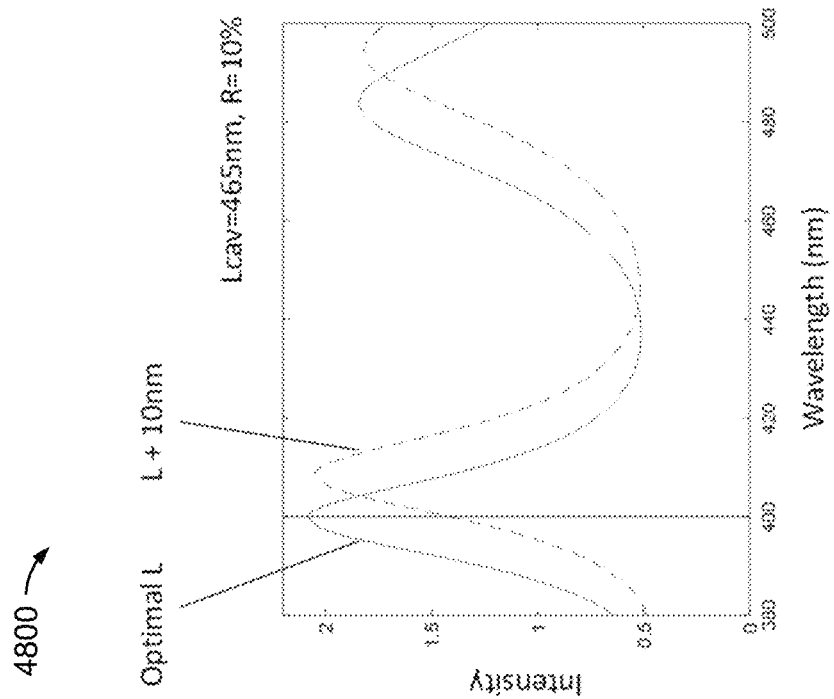

FIGS. 48 and 49 show optical responses of an intermediate cavity.

Figure 50:
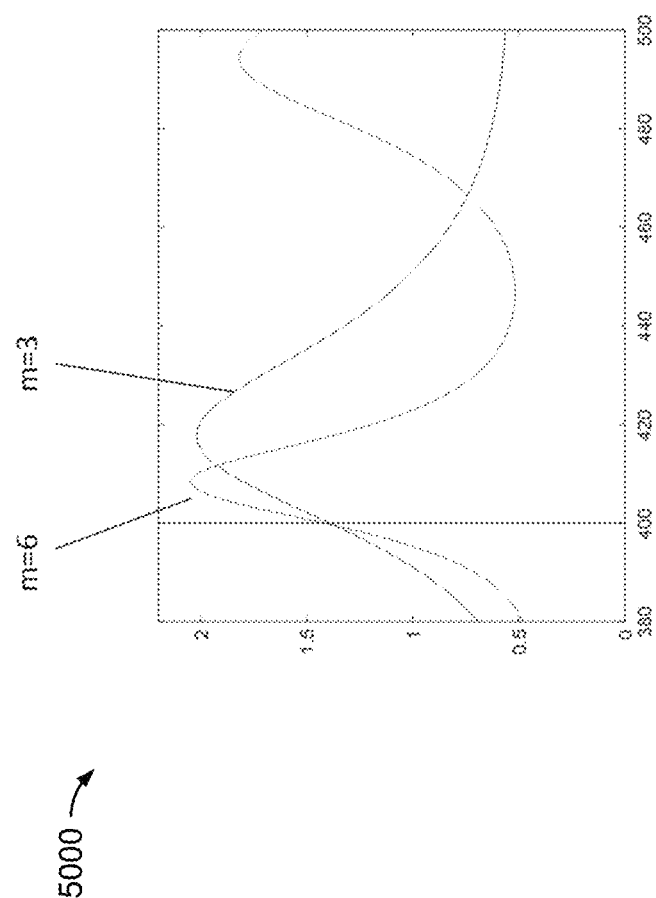

FIG. 50 shows a cavity response for two devices where the intermediate cavity is 10 nm thicker than optimal.

Figure 51:
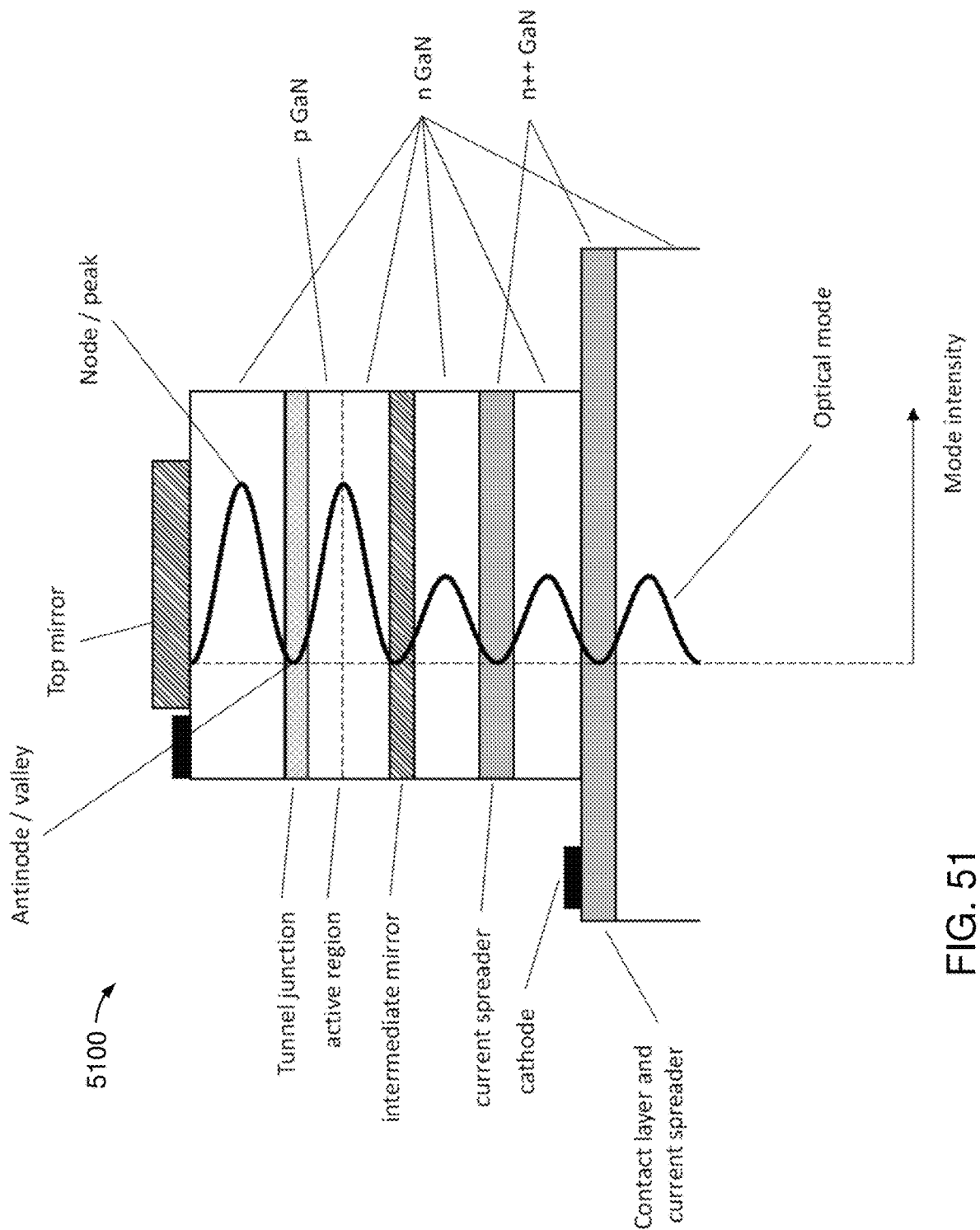

FIG. 51 illustrates an embodiment of a device for which doping is optimized for low optical loss.

Figure 52:
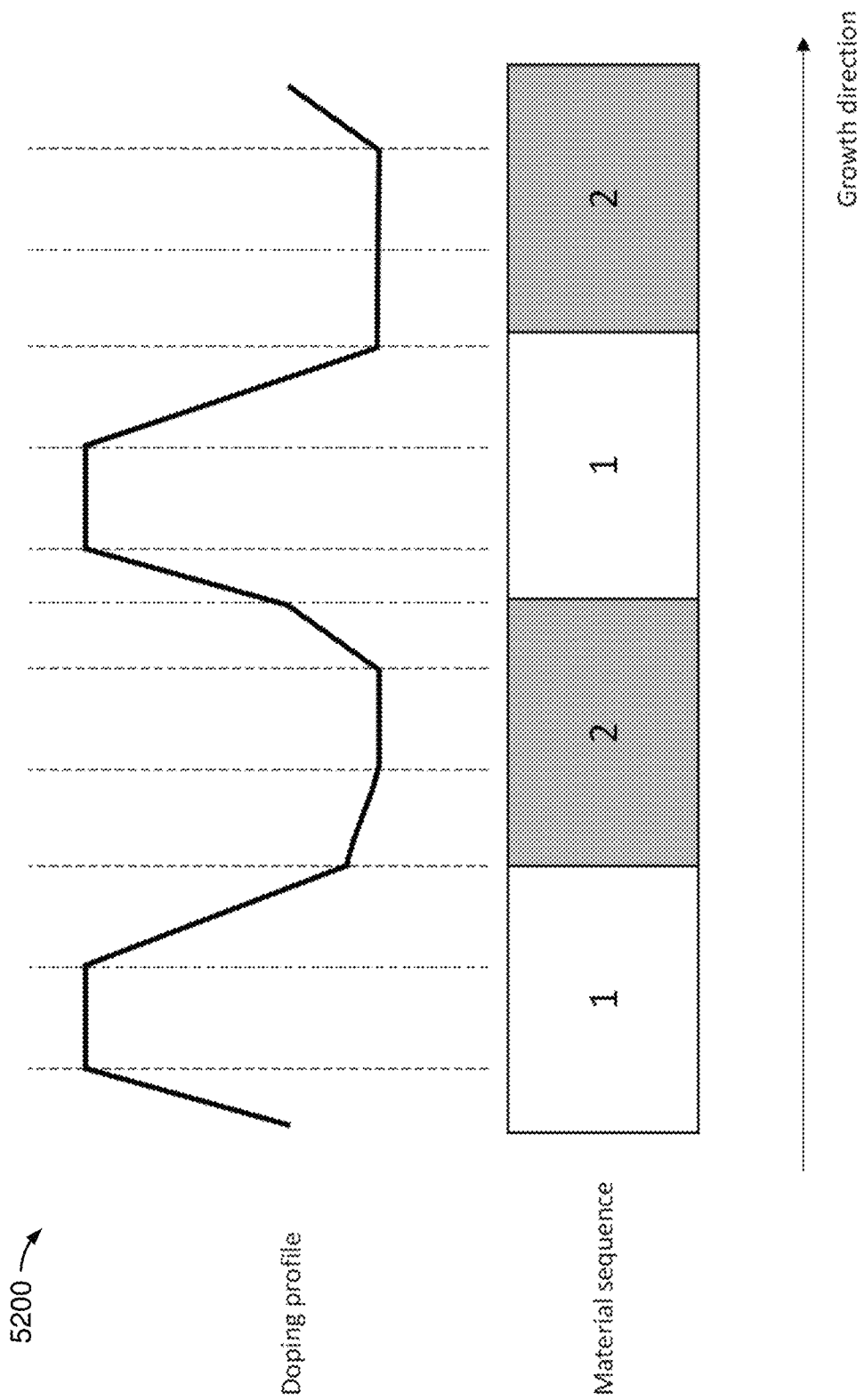

FIG. 52 illustrates doping profiles.

FIGS. 53-58 illustrate schemes for lateral optical confinement.

Figure 59:
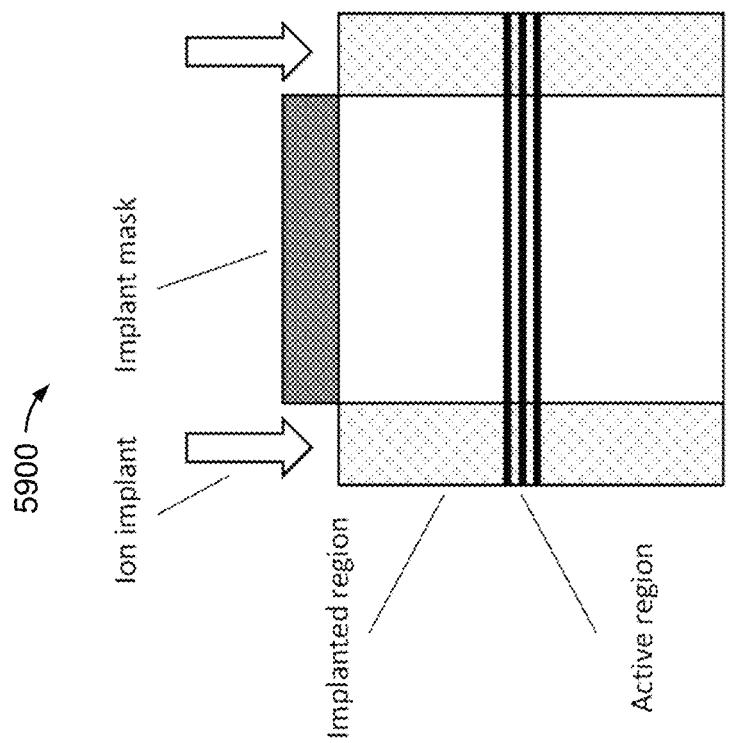

FIG. 59 shows a device that includes a semiconductor mesa where a lateral region receives an ion implant and becomes an implanted region, while another lateral region is protected by an implant mask and is not implanted.

Figure 60:
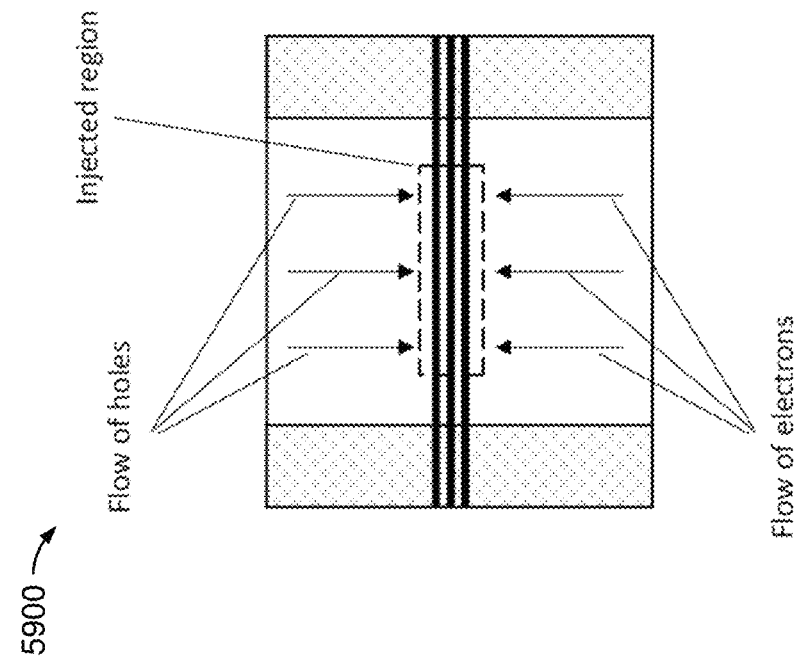

FIG. 60 shows current flow in the operating device of FIG. 59.

Figure 62:
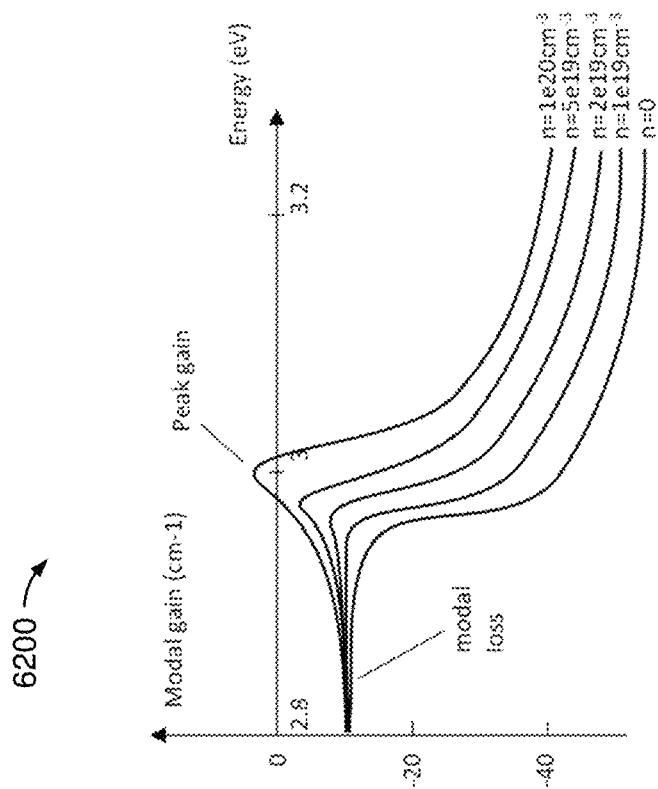
Figure 61:
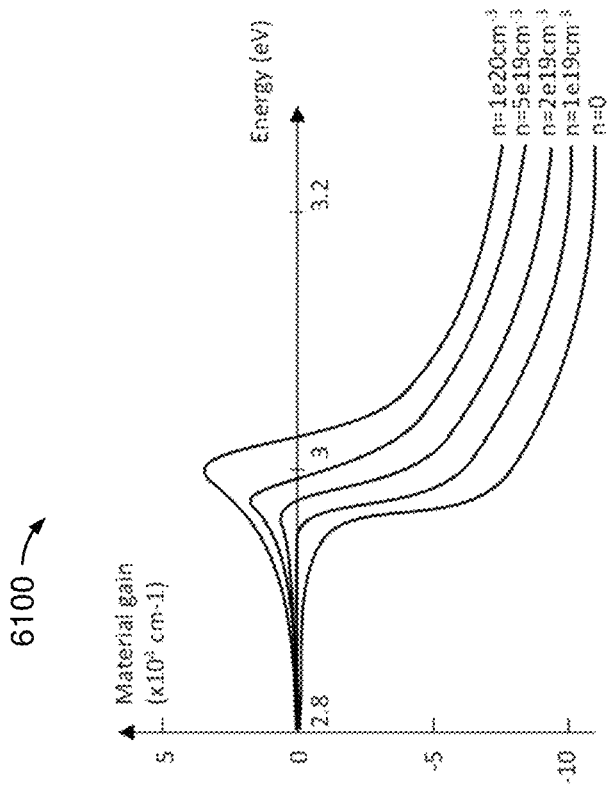

FIG. 61 is a graph that shows possible values of the material gain for the active region as a function of current density FIG. 62 is a graph that shows an example of peak modal gain for a given modal loss.

Figure 63:
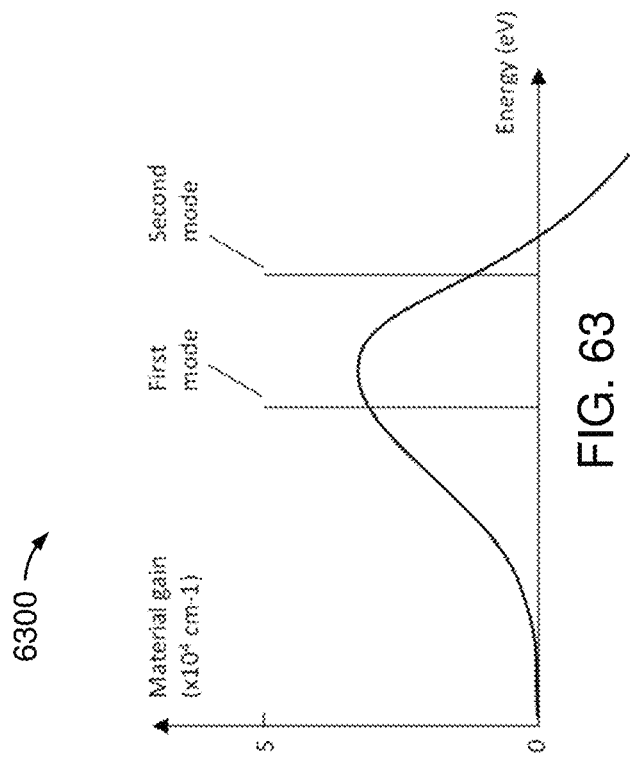

FIG. 63 is a graph that shows an embodiment having active region material gain, and only two optical modes aligned with the gain region.

Figure 64:
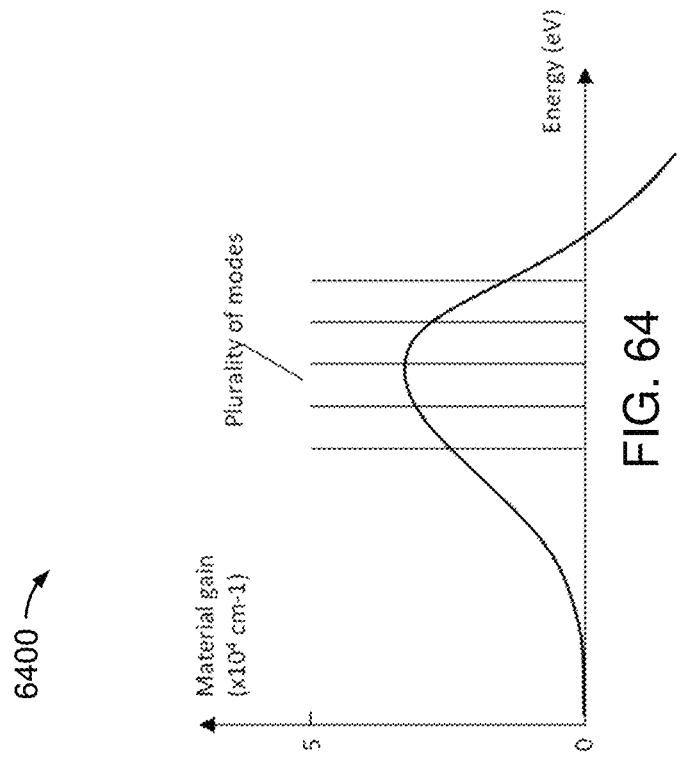

FIG. 64 is a graph that shows an embodiment having active region material gain, and a plurality of optical modes aligned with the gain region.

Figure 65:
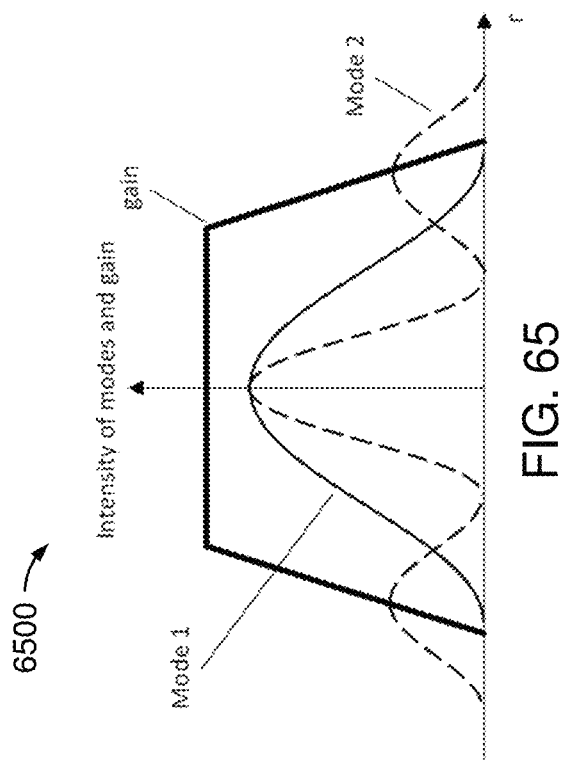

FIG. 65 is a graph that shows possible radial profiles of gain and of two transverse modes.

Figure 66:
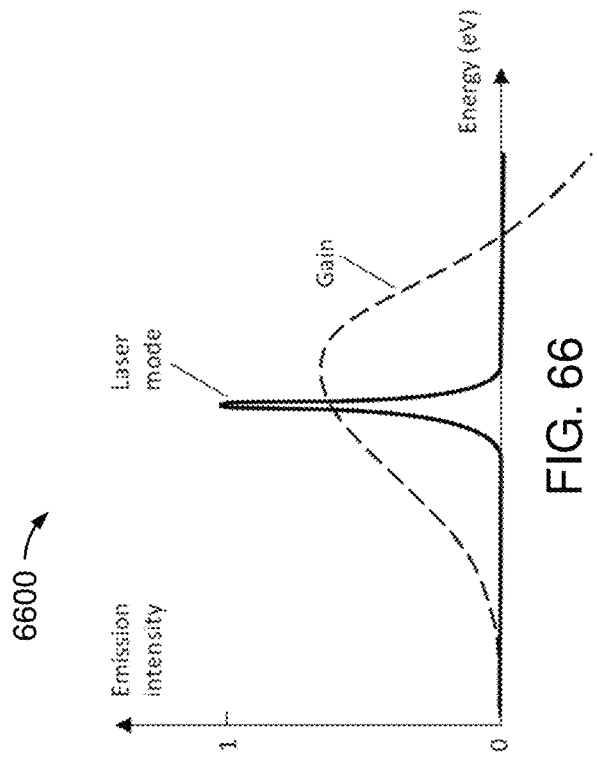

FIG. 66 is a graph of a laser mode.

Figure 67:
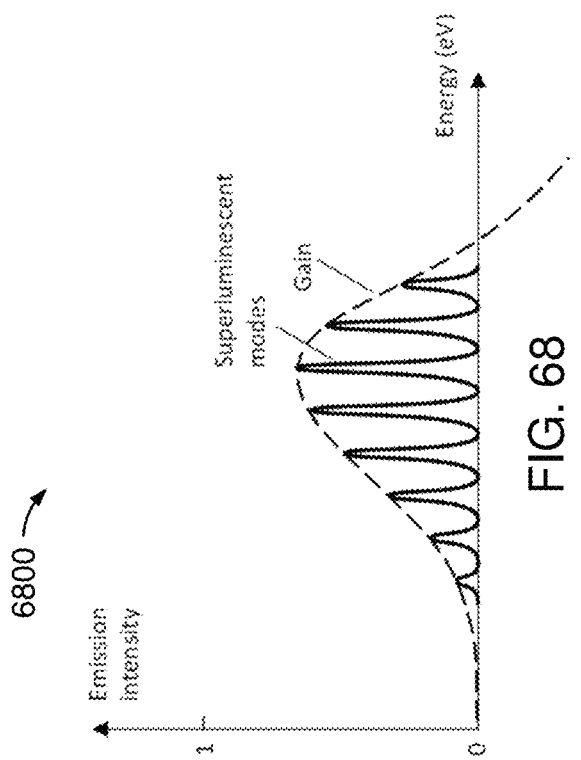

FIG. 67 is a graph of multiple laser modes.

Figure 68:
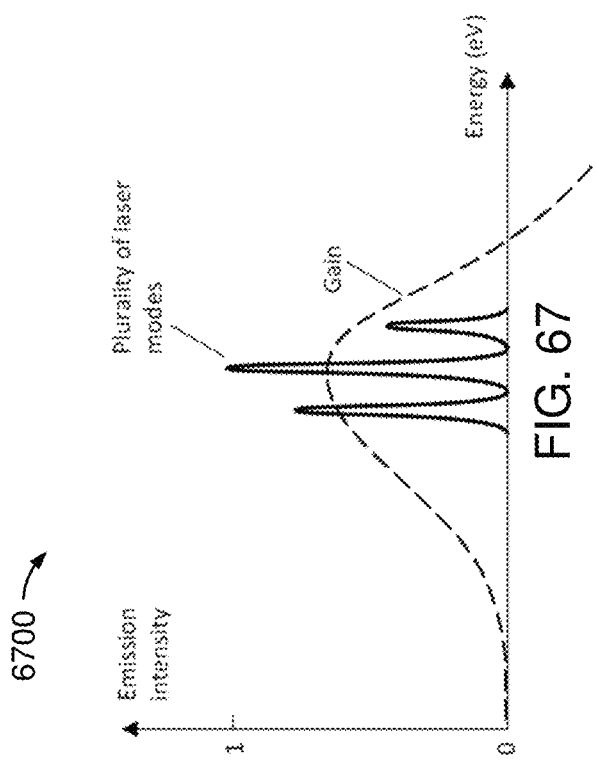

FIG. 68 is a graph in which an envelope coincides with the gain shape.

Figures 69, 70:
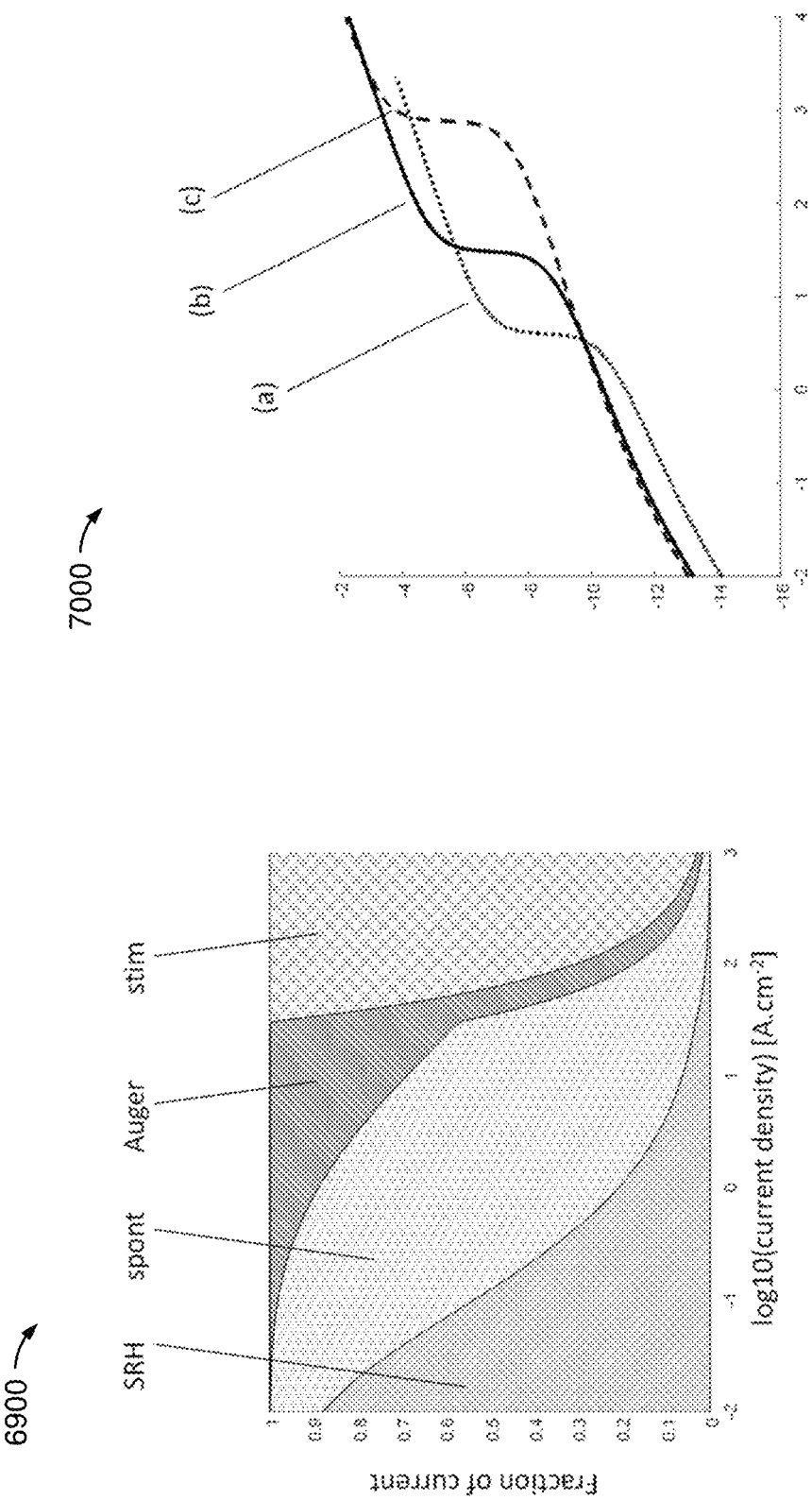

FIG. 69 a numerical simulation of relative currents for an embodiment having typical values for recombinations in a III-Nitride material (A=1e6s−1, B=1e−12 cm3s−1, C=5E−32 cm6s−1).

FIG. 70 is a graph that shows a numerical simulation of the stimulated output power against the current density, in log-log scale.

Figure 71:
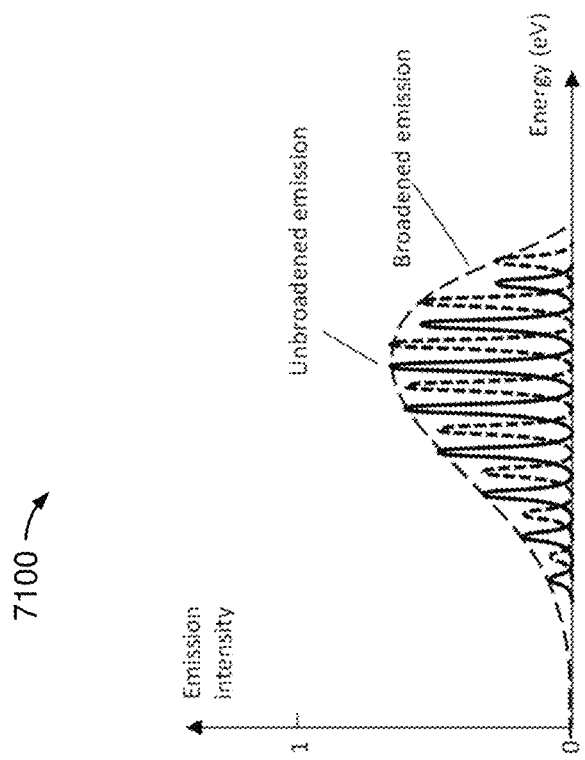

FIG. 71 is a graph that illustrates an input modulation causing a smoother spectrum.

Figure 72:
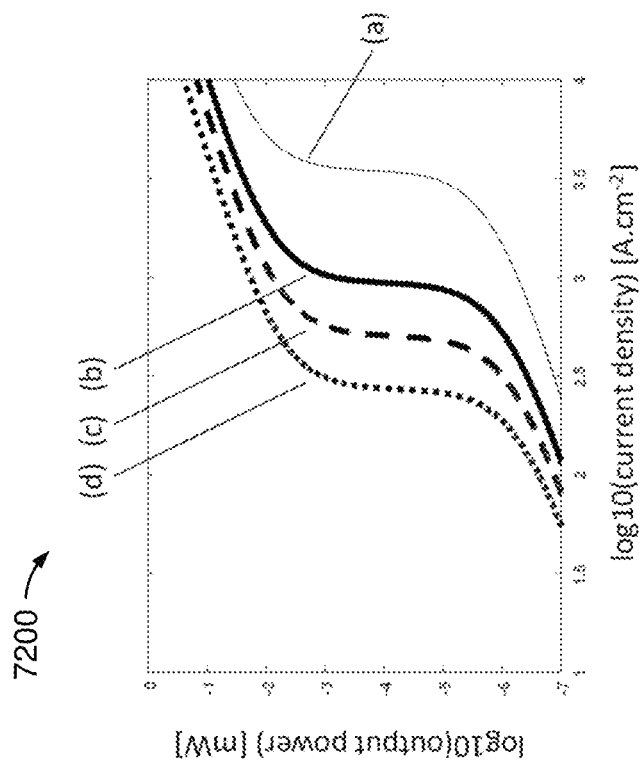

FIG. 72 is a graph that shows embodiments with improved efficiency.

Figure 73:
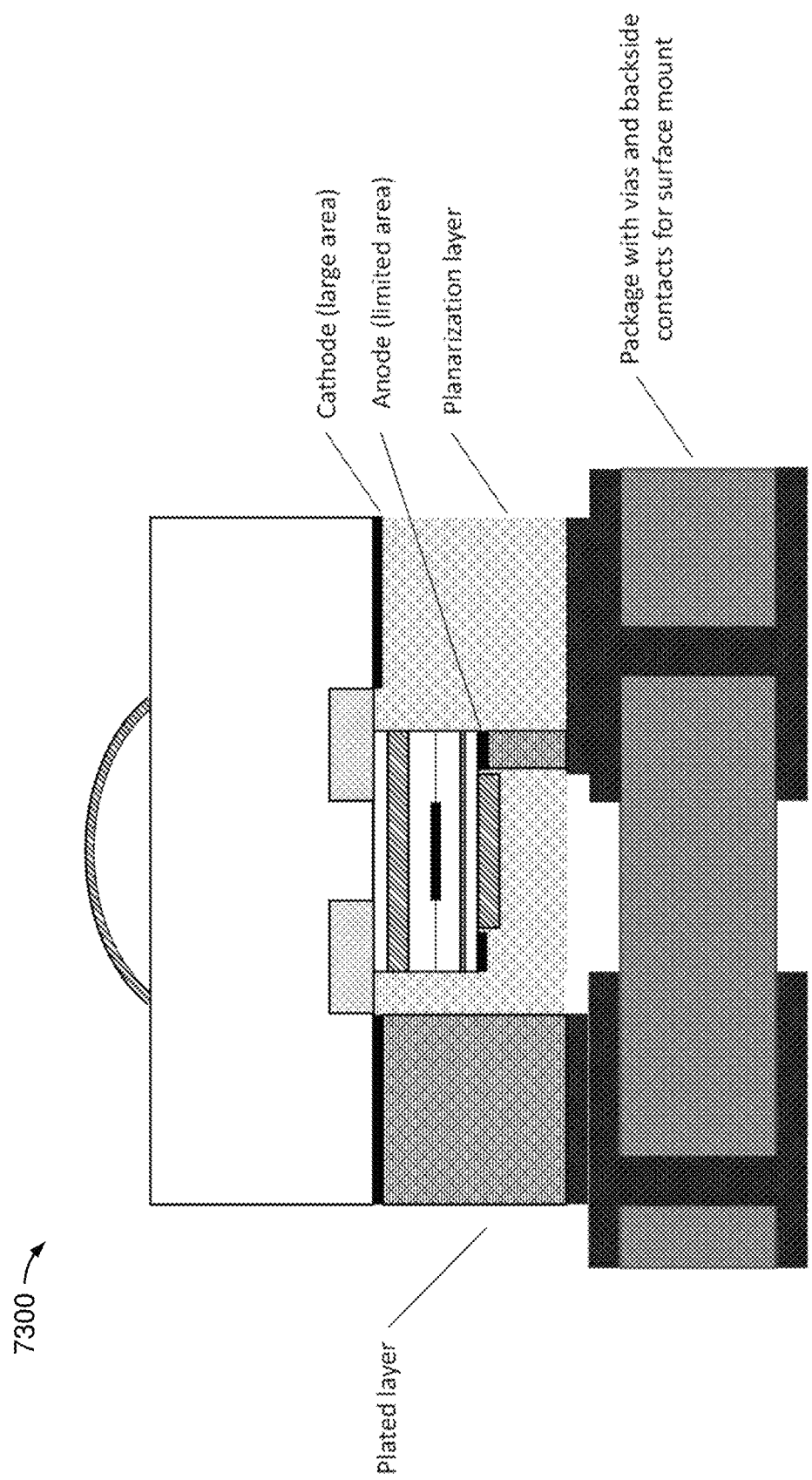

FIG. 73 is an illustration of a device with both anode and cathode on the active side of the device providing high heat extraction.

Figure 74:
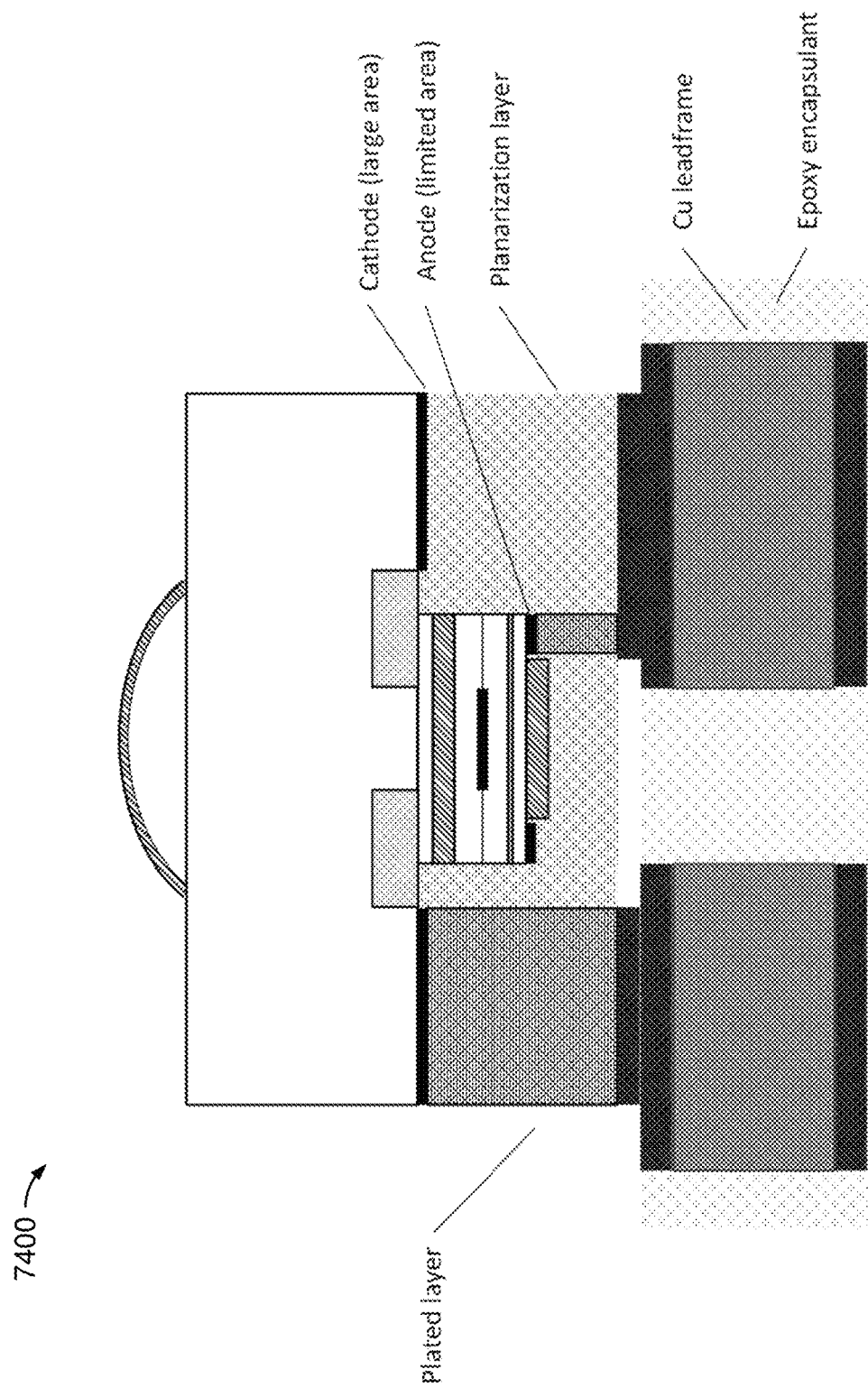

FIG. 74 is an illustration of a device that includes a lead-frame package (e.g. with Cu leads) for lower cost and efficient heat extraction.

Figure 75:
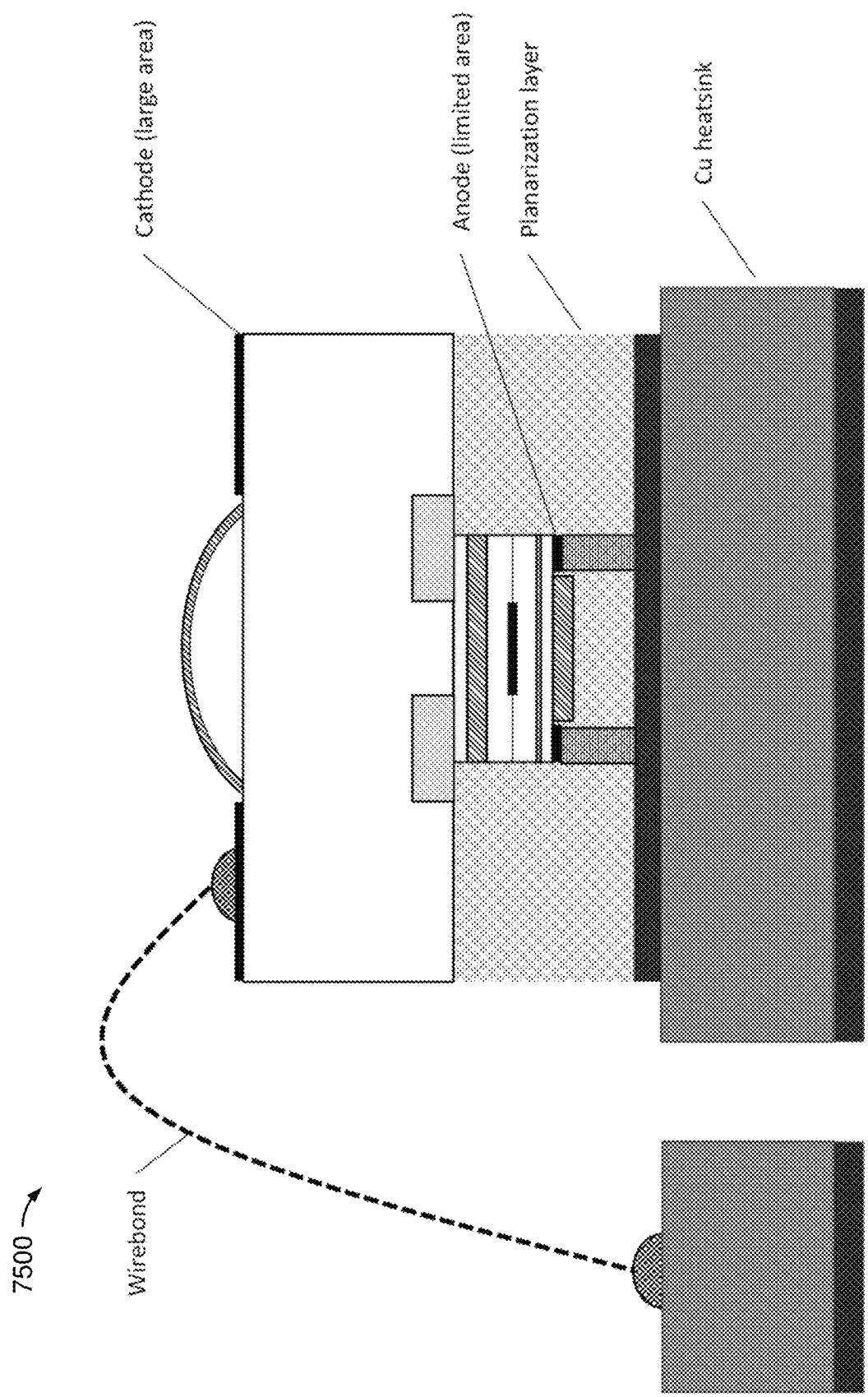

FIG. 75 is an illustration of a device with the cathode contact on the back of the substrate and wire-bonded to the package.

In the drawings, the leftmost digit(s) of a reference number identifies the drawing in which the reference number first appears.

DETAILED DESCRIPTION

Disclosed herein are optical devices, method of manufacturing optical devices, and methods of operating optical devices.

An optical device, as disclosed herein, may include or may be configured as a vertical-cavity surface-emitting laser (VCSEL). Methods and systems disclosed herein are not, however, limited to VCSELs.

In an embodiment, an optical device comprises epitaxial layers having a light-emitting active region and mirrors disposed around the active region to form an optical cavity. The devices may emit in or near a vertical direction relative to a plane or surface of the epitaxial layers.

In some embodiments, the device emits laser light under sufficient excitation (either electrical or optical), i.e. the gain from the active region is higher than the optical losses for a lasing mode. The laser light may be emitted in a vertical direction, as in a VCSEL. In other embodiments, the device operates in a superluminescent mode, i.e. the material gain is positive but less than the optical losses for any mode (thereby preventing lasing); amplified spontaneous emission (or superluminescence, or stimulated emission) is emitted into optical modes without lasing. Such a vertical device may be called a VCSLED.

Cavity with Three Mirrors

In some embodiments, an optical device comprises three mirrors: a top mirror, an intermediate mirror, and a bottom mirror. The top mirror may be formed above the active region; the bottom mirror may be formed under the substrate; the intermediate mirror may be formed in the epitaxial stack (above the substrate and below the active region).

Figure 1:
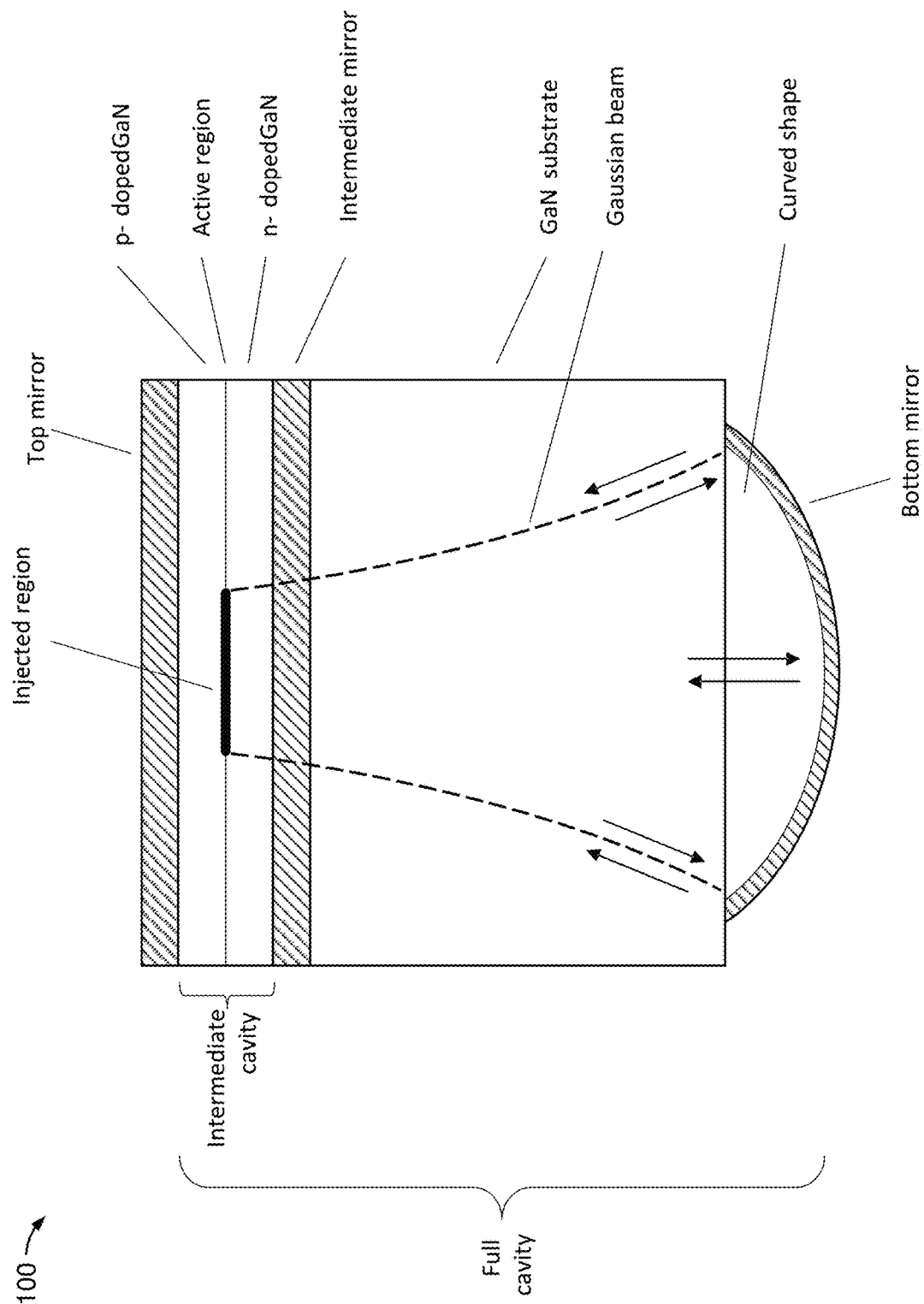
FIG. 1 is an illustration of an optical device.

FIG. 1 is an illustration of an optical device 100. Device 100 includes a GaN substrate, and the following stack on the substrate: an intermediate mirror, n-GaN, an active region, p-GaN, a top mirror. A curved shape is formed on the backside of the substrate, and a bottom mirror is formed on the curved shape. The region between the top and intermediate mirrors forms an intermediate optical cavity; the region between the top and bottom mirrors forms a full optical cavity. A lateral portion of the active region is injected with electrical current and emits light into a lasing optical mode, causing the device to lase. The optical mode is partially reflected by the intermediate mirror; the optical mode propagates in the substrate with e.g. a Gaussian beam profile. The Gaussian beam is reflected by the bottom mirror to provide optical feedback.

In some embodiments, the full cavity is a lasing cavity: the top and bottom mirrors have high reflectivity, ensuring optical feedback to the active region which provides optical gain. The intermediate mirror may affect the lasing properties and distribution of light in the device: the intensity of the optical mode may be higher in the intermediate cavity than in the substrate; the optical modes of the full cavity may be affected, providing higher gain for some modes than others. Other effects of the intermediate mirror will be discussed hereafter.

This dual-cavity design may provide one or more advantages. For instance, a long full cavity may be desirable (e.g. to provide a plurality of optical modes), but the optical loss in a thick substrate may be detrimental. The dual-cavity design enables the use of a long cavity while mitigating optical loss in the substrate, as will be detailed hereafter.

Embodiments are distinct from vertical external-cavity surface-emitting lasers (VECSELS). VECSELS are formed by having a distant mirror placed over a semiconductor cavity. The distant mirror is separated by millimeters or tens of millimeters, usually spaced from the semiconductor by air, and it requires fine mechanical alignment. In contrast, embodiments provide a monolithic (fully solid) structure where the bottom mirror is at a moderate distance (typically tens or hundreds of microns) and is formed during the device fabrication, rather than being a separate element. Further the reflectivity of the intermediate mirror may be much lower than that found in a VECSEL.

Figure 2:
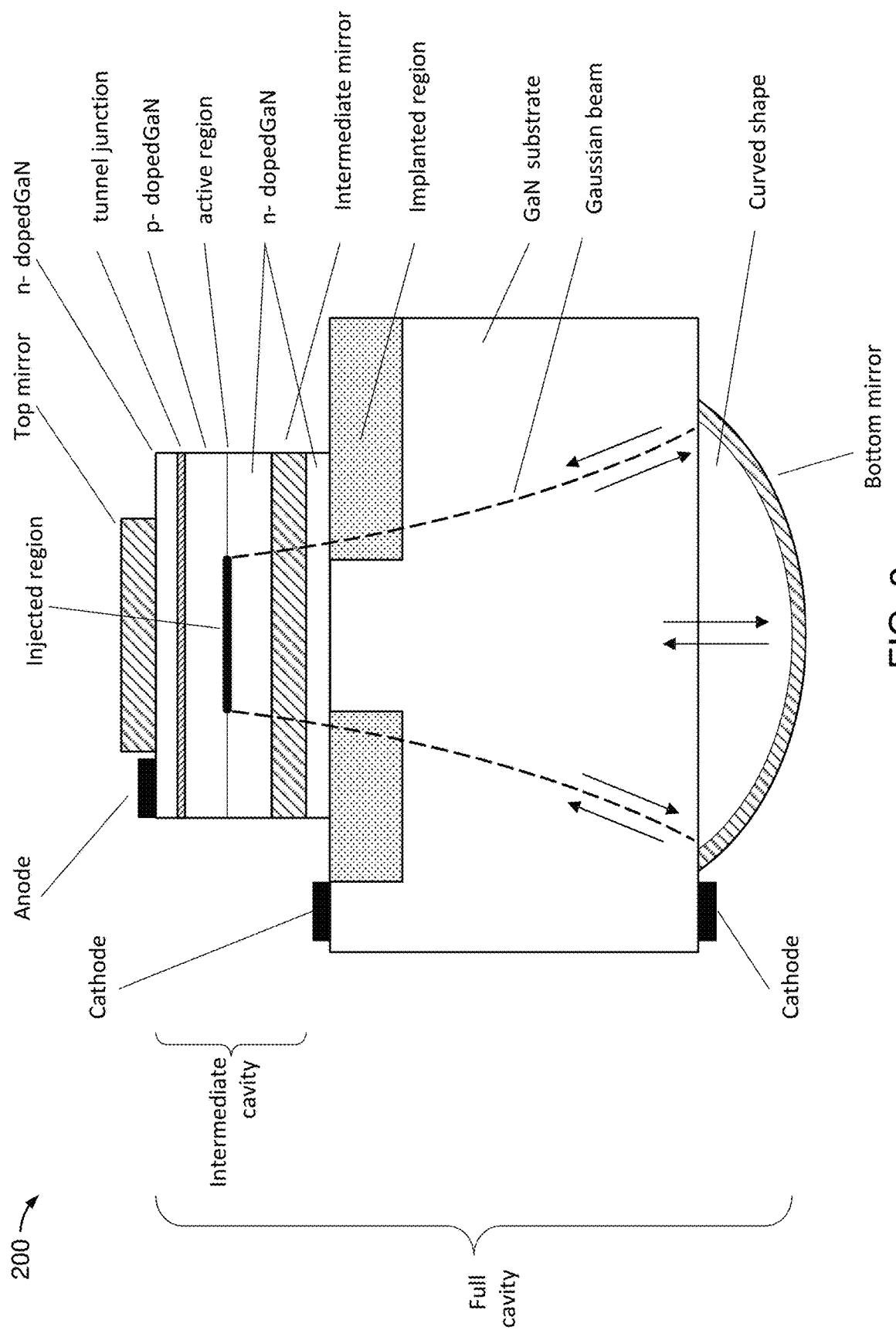
FIG. 2 is an illustration of another optical device.

FIG. 2 is an illustration of an optical device 200, which includes features similar to device 100 in FIG. 1, and further includes features related to electrical injection. An implanted region is obtained by ion implantation of the epi and/or substrate, which result in an insulating or semi-insulating or low-conductivity material, thus defining a current aperture (e.g. an aperture for carriers to flow). The aperture may restrict the flow of electrons through the epi layers and/or part of the substrate. A mesa is etched in part of the structure (either through part of the epi stack, or down to the substrate). A tunnel junction is formed over the p-GaN, and a top n-GaN layer is grown over the tunnel junction. An anode is formed to the top n-GaN layer, which acts as a current-spreading layer. Electrons injected from the anode tunnel through the tunnel junction and become holes in the p-GaN. A cathode is formed on a portion of the substrate or of the epitaxial n-GaN. Two example positions are shown in FIG. 2.

In some embodiments, a current aperture controls the flow of electrons coming from the cathode. The flow of carriers coming from the anode (i.e. holes, or electrons converted to holes if a TJ is present) may be controlled by the current aperture or by another means. In some embodiments, the flow of holes is facilitated by the low conductivity of holes in p-GaN. In some embodiments, a TJ is present and efficient hole injection only occurs at the TJ (or in a portion of the TJ), thus controlling where holes are created. An example is presented below with reference to FIG. 4.

Current apertures may be formed by implantation (including ion implantation) or other techniques, such as diffusion (including lateral diffusion if a mesa is formed), surface treatment (before or after epi growth). In general, such regions can be referred to as current-suppressed regions. Suppression may refer to a reduced conductivity for electrons and/or holes.

In some embodiments, a surface treatment is applied to a semiconductor surface to affect its Fermi level. For example, a treatment (plasma, etch, chemical treatment, trace deposition of a chemical species) pins the Fermi level at a specific value. This controlled Fermi level may be done in a selected lateral region. This controlled Fermi level may affect the electronic properties of the device, and may affect a regrowth subsequently performed on the surface. Treatment to locally pin the fermi level followed by regrowth may enable the formation of an aperture.

FIG. 3 is an illustration of an optical device 300 in which a current aperture is formed (e.g. by implantation) in epitaxial layers above the substrate, controlling the electron flow. Further, the implanted region comprises a lateral fraction of the active region, so that holes do not reach this lateral fraction. Accordingly, both electrons and holes reach a second fraction of the active region where recombinations may occur.

In some embodiments, the implant is present across the active region in the vertical direction.

FIG. 4 is an illustration of an optical device 400 in which a current aperture is formed in the substrate, controlling electron flow. Further, the TJ is only present in a fraction of the mesa, controlling hole flow. This laterally-restricted TJ may be formed by an etch-and-regrowth process or by a lateral process which suppresses the TJ conductivity near the mesa sidewalls (such as diffusion of a species, or deposition of a material, or lateral gating of the mesa).

Figure 5:
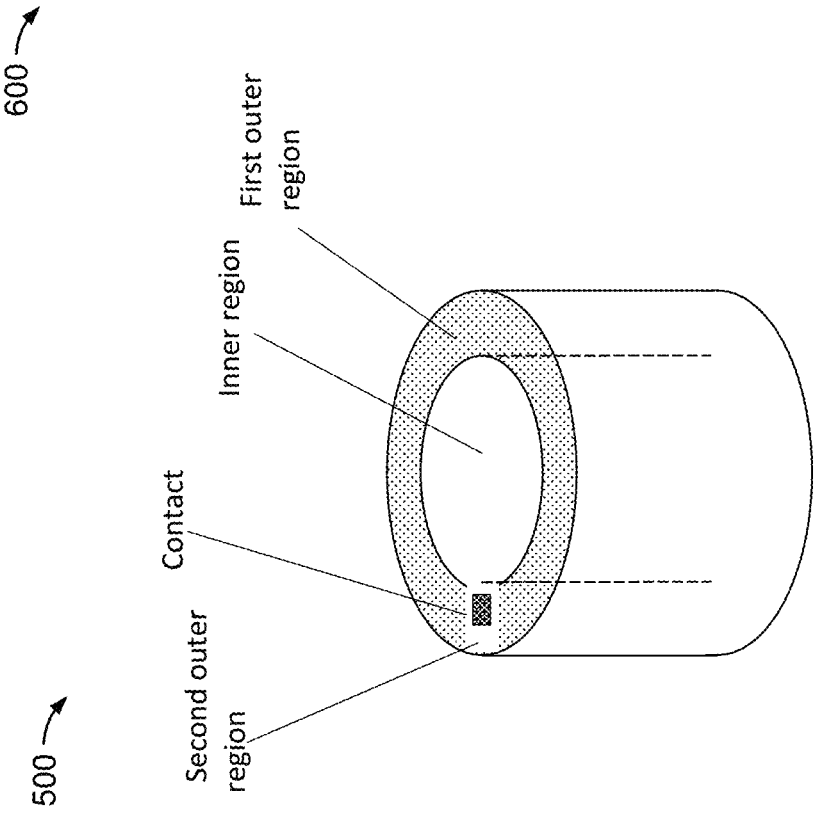
FIG. 5 is an illustration of a three-dimensional view of mesa.

FIG. 5 is an illustration of a three-dimensional view of mesa 500. It shows an embodiment where a first outer region of the mesa is current-suppressed. A second outer region of the mesa may not be current-suppressed. The first region may approximately have the shape of a partial ring, with the second region being the missing part of the ring. An inner region of the mesa is used as the optical cavity. In such embodiments, a contact may be formed in the second outer region, and carriers may flow from the epi below the second outer region towards the inner region. The current suppression may suppress conductivity in p-GaN; in this case, holes flow from under the contact to the inner region. The current suppression may suppress conductivity in n-GaN; in this case, electrons may flow to the inner region and to the region under the contact. In both cases, light recombination may occur below the contact, which may be unwanted. Therefore, the area of the second outer region may be small enough to limit this effect. The area of the second outer region may be less than 10% (or 50%, 100%, 200%) of the area of the inner region. Such embodiments may be obtained by the following process: grow the epi structure, implant, form a mesa, form a contact (the order of some of these steps may be selected as desired).

Figure 6:
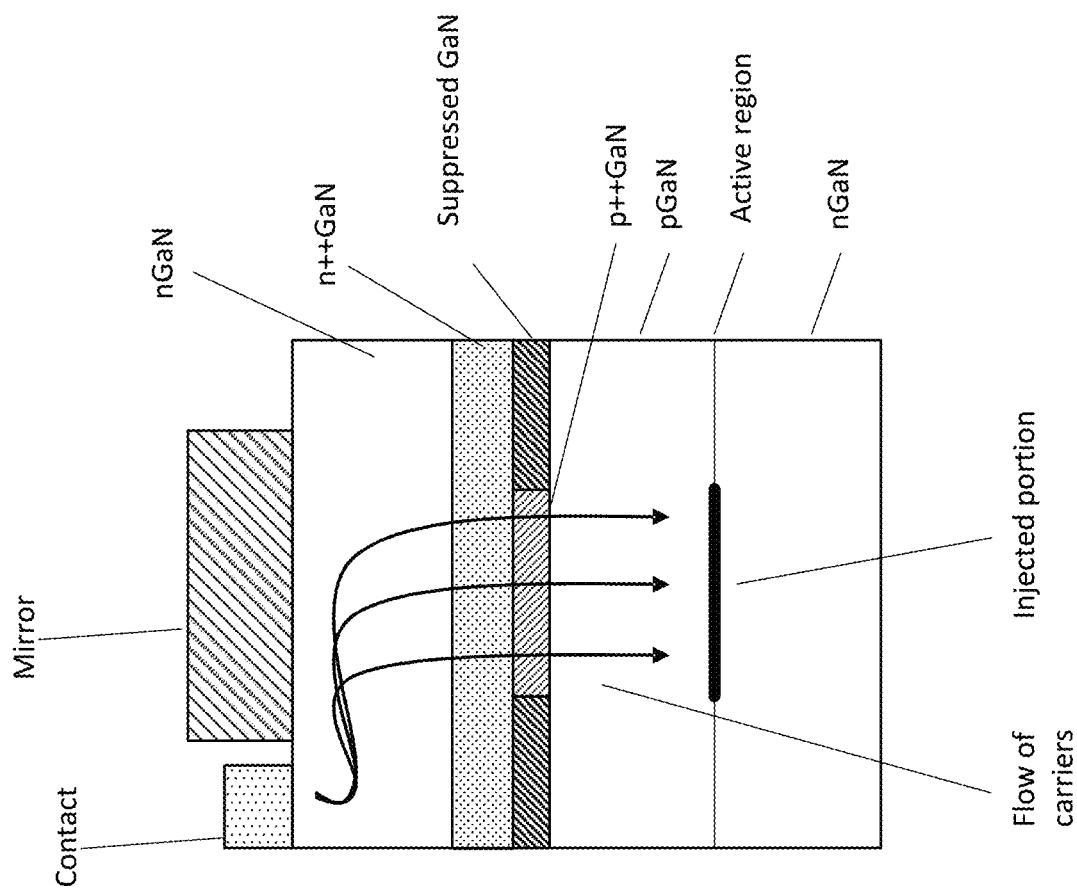
FIG. 6 is an illustration of an optical device in which a tunnel junction is present only in a desired part of a mesa.

FIG. 6 is an illustration of an optical device 500 in which a tunnel junction is present only in a desired part of the mesa. This may be achieved as follows. An epi layer is grown, which comprises p-GaN. The layer may end with pGaN, p++ GaN, or n-doped GaN overlying p/p++ GaN. The layer is then processed with a step which suppresses the p-conductivity locally (i.e. in some portions of the epi surface), forming regions where the p-GaN is more resistive (termed "suppressed GaN"). For instance, ion implant or ion etching or a plasma step or a chemical etch (wet or dry) may affect the p-GaN; in some cases, the p++ GaN conductivity is affected. In some embodiments, the conductivity is suppressed by at least 10× (or 100×, 1000×) in comparison to a process where the step would be absent, or in comparison to an adjacent portion where the suppression process does not take place. A mask (e.g. dielectric or resist or other masks) may be used to protect such adjacent regions of the p-GaN during this process, such that their conductivity is not affected in the protected region. The mask may subsequently be removed. The epi layer is regrown to complete the tunnel junction. In such embodiments, the regions with suppressed conductivity do not form a good TJ, whereas the regions without suppressed conductivity form a good TJ. A contact is formed above the regrown epi; this contact may be moved away from the region of good conductivity. Electrons may be injected from the contact to the top n-GaN, and only be injected in the p-GaN where conductivity has not been suppressed. This leads to preferential injection in an injected lateral portion of the active region. In such embodiments, the fraction of current flowing through the suppressed material may be less than 10% (or less than 1%, 0.1%) of the total current. In some embodiments, the TJ differential resistance is at least 10× (or 100×) higher in the suppressed GaN portion than in the good TJ portion, at a current density of 1 kA·cm−2 (or 100 A·cm−2). In some embodiments, the suppressed p-GaN is obtained by a step which reduces the p-GaN thickness; in other embodiments however, the thickness of the p-GaN is not affected, such that the suppressed p-GaN and the unaffected p-GaN are planar before regrowth of the subsequent epi layers.

Activation steps (e.g. p-activation) may be used at various steps of the process, including after epi growth, or after epi regrowth. Epi conditions forming as-grown activated material (such as H-poor conditions) may also be employed.

An example of process steps to form a material stack is as follows: grow epi, comprising nGaN, active region, pGaN, p++ GaN. After growth, form a protective mask on a portion of the epi surface. Subject the masked epi to a treatment which suppresses p++ GaN conductivity in unmasked portions. Remove mask. Grown additional material (including n++ GaN) above the epi layers to complete a tunnel junction.

In some embodiments, the tunnel junction comprises a regrowth step (as discussed above), but the regrowth does not comprise epitaxial III-nitride material (such as nGaN). Instead, the material may be sputtered (such as sputtered nGaN which is not epitaxial, but instance e.g. amorphous or semi-amorphous). Another material may also be formed over the epi—such as ZnO or GaOx or other conductive materials.

Such approaches to forming current apertures are also possible in structures having no mesa. In some embodiments, the current confinement and the optical confinement (provided for instance by the curved mirror) fully define the lateral extent of the device, without a need for forming a mesa. The specific ring layouts shown are merely examples. Such approaches to current apertures can be practiced alone or in combination with other features disclosed herein, including the dual-cavity geometry.

Figure 7:
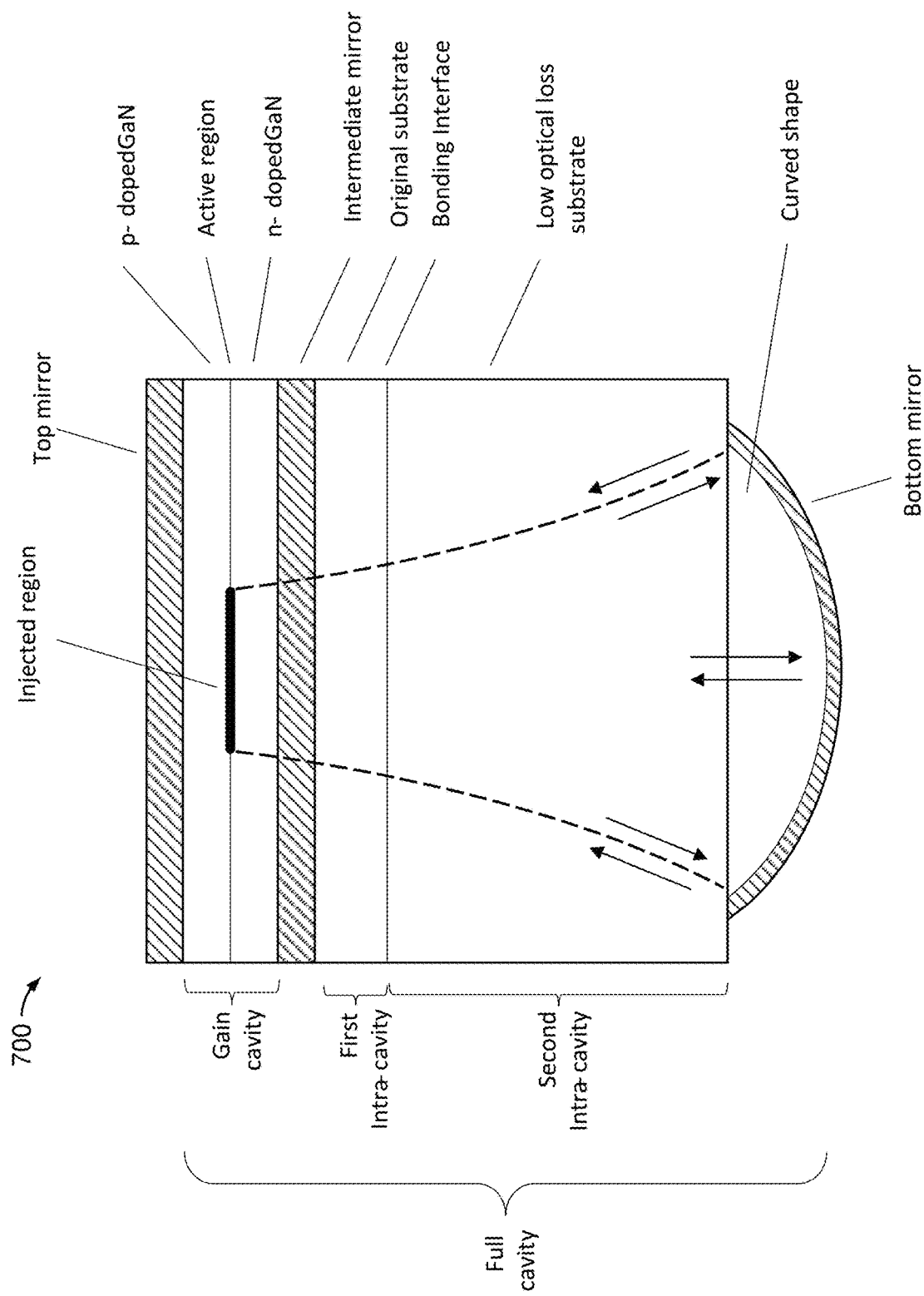
FIG. 7 illustrates an epitaxial example structure.

FIG. 7 illustrates an epitaxial example structure 700, which may be grown on a first growth substrate, and the epitaxial structure (with or without some of the original substrate) transplanted to a low-optical-loss handle substrate such as sapphire or glass. In this case, the bottom curved mirror may be fabricated on the handle substrate. In this construction, there are effectively 3 cavities: the top gain cavity between the Intermediate mirror and the top mirror, a first intra-cavity between the Intermediate mirror the bonding interface between the epitaxial structure and the low optical loss substrate, the second intra-cavity between the bottom mirror and the bonded interface between the epitaxial structure and the low optical loss substrate. The bonding interface may be configured to have a low reflectivity (e.g. less than 5% or 1% or 0.1%), such that the first- and second-intra-cavities combine to form one cavity. The bottom curved mirror may be formed before or after the epitaxial layers are transferred to the handle substrate. In such embodiments, the transferred layer (comprising the epi and part of the growth substrate) may be relatively thin (e.g. less than 10 um). To obtain the transferred layer starting from the full epitaxial structure (substrate and epi), various techniques are possible; the epitaxial structure may be thinned down from the substrate size; it may be split at an appropriate position (either at an epi layer or in the substrate) with a splitting technique (including laser lift-off, stealth laser cutting, spalling).

Figure 8:
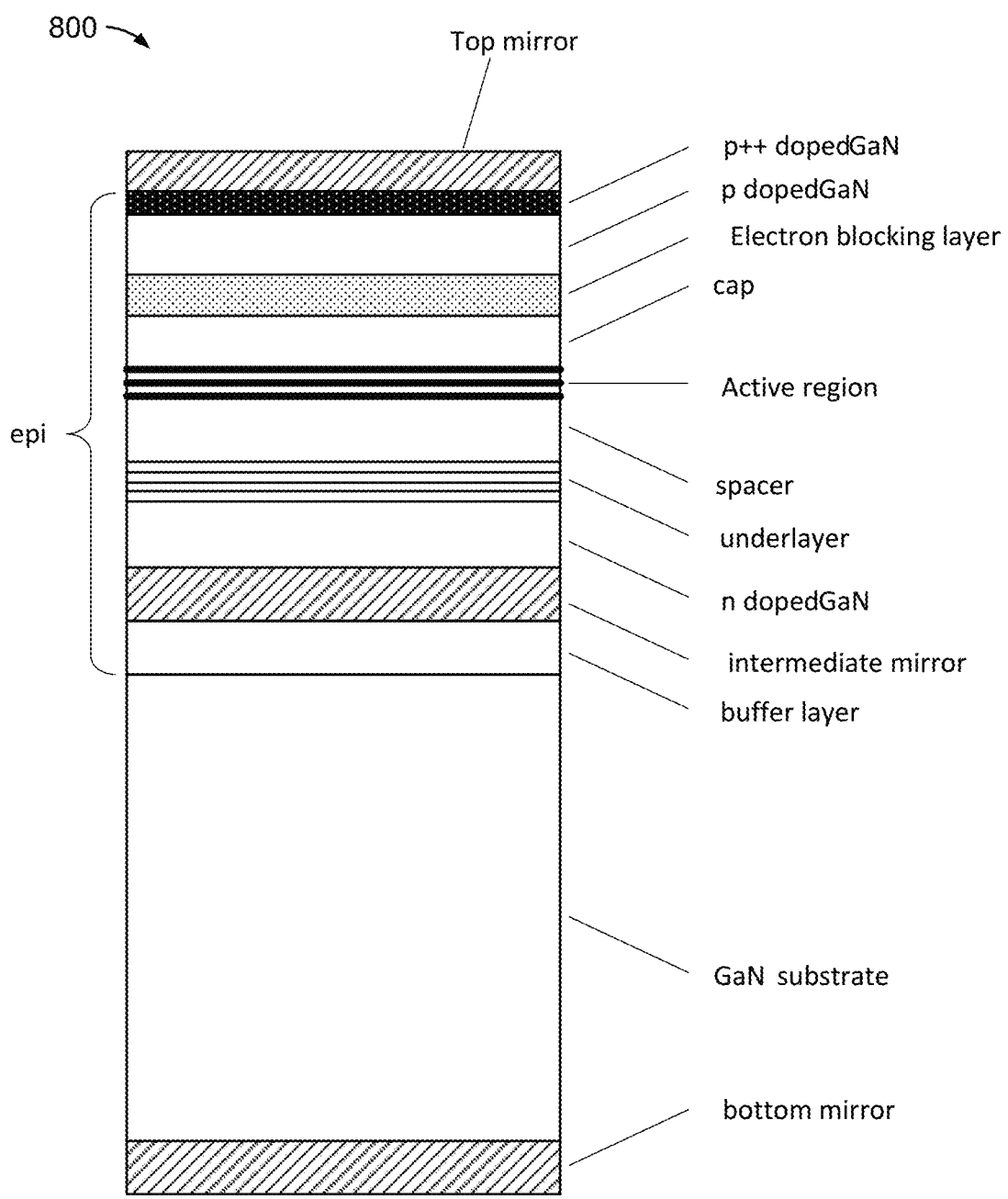
FIG. 8 is an illustration of an example stack layer.

FIG. 8 is an illustration of an example stack layer 800, which includes:
- an n-doped GaN substrate, with an absorption coefficient at a lasing wavelength below 1 cm−1;
- an epitaxial stack formed over the substrate, including:
  - a buffer of n-doped GaN;
  - a stack of n-doped III-Nitride layers (GaN/AlInGaN) forming a DBR acting as the intermediate mirror, with reflectivity 30%;
  - an n-doped GaN layer;
  - an n-doped underlayer configured to reduce point defects, such as an InGaN layer or an InGaN-based superlattice or an AlInN layer;
  - a GaN spacer layer, which may be n-doped or undoped;
  - an active region, for instance comprising an InGaN/GaN multiple-quantum-well stack;
  - a GaN cap layer, which may be p-doped or undoped;
  - a p-doped electron blocking layer comprising an AlGaN layer with [Al]>10%;
  - a p-doped GaN layer;
  - a p++-doped GaN layer;
- a dielectric stack of SiO2/Ta2O5 on top of the epi stack, forming a DBR acting as the top mirror, with reflectivity 99.99%; and
- a dielectric stack of SiO2/Ta2O5 formed on the backside of the substrate (where the backside is optically smooth), forming a DBR acting as the bottom mirror, with reflectivity 99.95%. Although the bottom mirror is shown as planar, it and other layers in the structure may have a non-planar shape, including a curved or convex shape.

Figure 9:
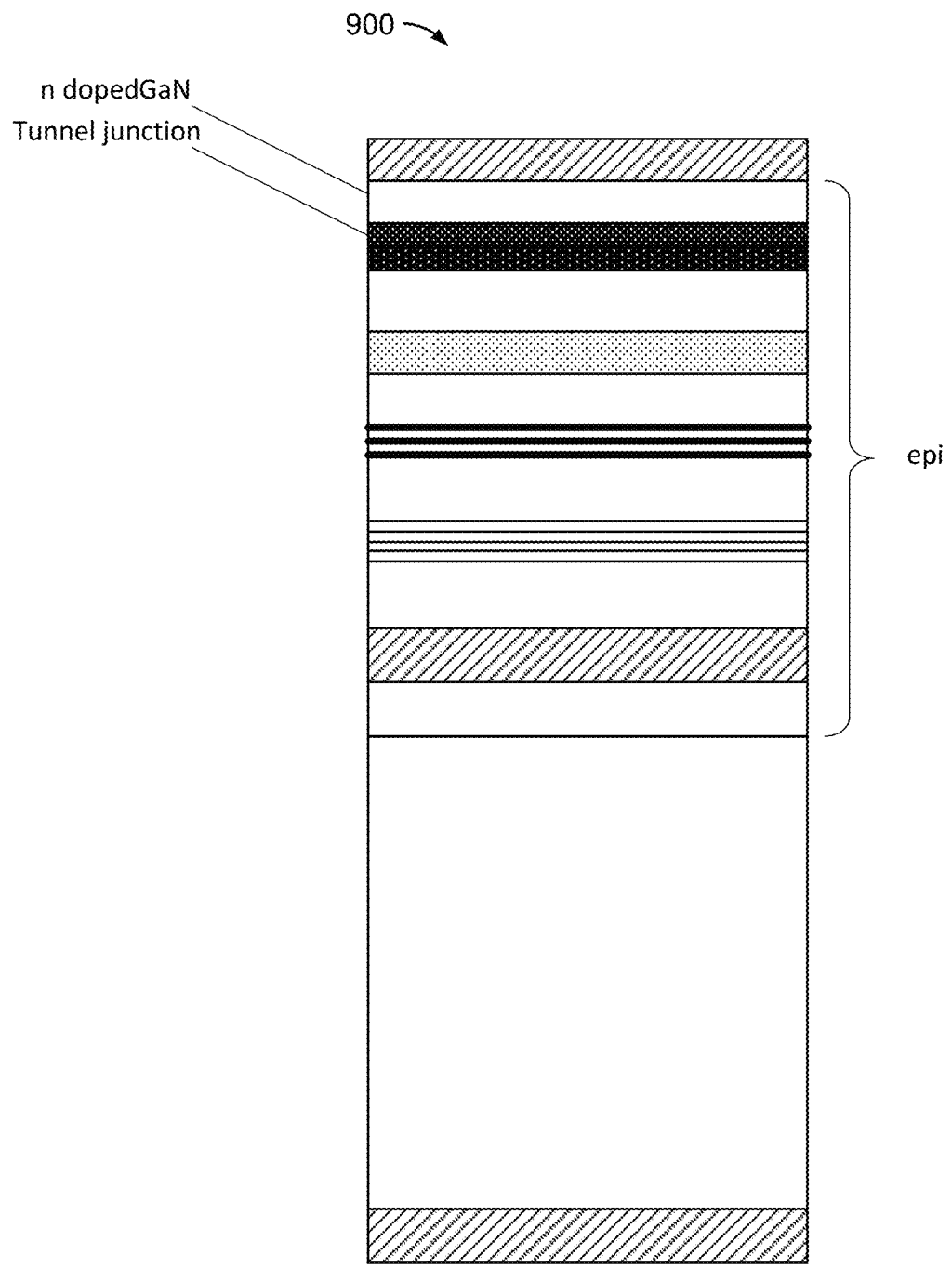
FIG. 9 is an illustration of another example stack layer.

FIG. 9 is an illustration of another stack 900. It is similar to that of FIG. Band further includes a tunnel junction over the p++ GaN and n-doped GaN over the tunnel junction. The tunnel junction may include a plurality of highly doped layers, examples of which are provided herein.

The substrate may be a bulk (i.e. freestanding) GaN substrate or a bulk III-Nitride-comprising substrate. It may be a bulk InGaN substrate, or comprise a relaxed InGaN layer with an in-plane lattice constant which is within 0.1% of its equilibrium value for said InGaN composition. The InGaN composition may be in the range 2-5% or 5-10% or 10-15% or 15-20% or 20-30% or 30-50%, or it may be about 5% or about 10% or about 13%. It may have an average threading dislocation density below 1E7 cm−2 (or 5E7 cm−2, 5E6 cm−2, 1E6 cm−2, 5E5 cm−2). The substrate may be substantially-free of extended defect (including misfit dislocations) over areas corresponding to devices or sufficient for forming devices in defect-free areas (e.g. 5×5 um or 10×10 um or 50×50 um or 100×100 um). It may be a gallium oxide containing substrate. It may be conductive (n-type or p-type). It may have an absorption coefficient at a lasing wavelength which is below 1 cm−1 (or 2 cm−1, 0.5 cm−1, 0.1 cm−1, 0.05 cm−1, 0.01 cm−1). The substrate may be formed by HYPE, by crystal pulling, by a flux method, by ammonothermal growth. The substrate may be a composite substrate comprising several layers assembled, e.g. through bonding. A composite substrate may comprise a III-nitride layer, as discussed above. The substrate be oriented along a nominal crystallographic direction and may have an offcut from this direction.

The epitaxial layers may be formed by a variety of techniques. They may be grown with a single epi reactor, such as MOCVD, MBE, sputtering, pulsed laser deposition, chemical vapor deposition (including RPCVD), or other epi techniques known in the art. The may also be grown by combining more than one technique. For instance, some layers may be grown by MOCVD and other layers by another technique. In some embodiments, the active layers are grown by MOCVD, ensuring a high internal quantum efficiency.

In the case of III-Nitride epitaxy, the growth direction may be polar (c plane or -c plane), or non-polar (m-plane or a-plane), or semi-polar (including 202-1, 20-2-1, 30-31, 30-3-1 and any other angle along the m and/or a directions).

The underlayer integrates defects which would otherwise be incorporated in the active region, thereby reducing the Shockley-Read-Hall (SRH) recombination rate and increasing the internal quantum efficiency (IQE). It is believed that In atoms generally act as a getter for such defects; therefore in some embodiments, the underlayer should comprises In. The underlayer may be a bulk InGaN or AlInN layer. The underlayer may be a superlattice wherein some of the layers comprise In, for instance: InGaN/GaN, InGaN/AlGaN, AlInN/GaN, AlInGaN/GaN, AlInGaN/AlInGaN (with different compositions). In some embodiments, the underlayer is configured to minimize strain. For instance, the underlayer is lattice-matched to the substrate (e.g. AlInGaN lattice-matched to a GaN substrate, or to an InGaN substrate). In some embodiments the lattice-matching is approximate (e.g two layers have an in-plane lattice constant with a relative variation of less than 0.5% or 0.1% or 0.05% or 0.01%). Since In is believed to be beneficial, in some embodiments, the underlayer has a sufficient average In content (averaged over its thickness) such as at least 2% (or 5%, or 10%, or 15%), or an In content in a range 1-3% (or 2-5%, or 5-10%, or 10-15%, or 10-20%). In some embodiments, the underlayer comprises a cumulative thickness of In-containing materials which is at least 10 nm (or 50 nm, 100 nm, 500 nm, 1000 nm). The underlayer may be doped; for instance, it may be n-doped with a doping level sufficient to facilitate low resistivity but low enough to minimize absorption; the doping level may be different in different layers; it may be in a range 1e18-1E19 cm−3 or 1E17-5E19 cm−3.

The active region may include one or more active layers, such as a quantum well (QW) or a double heterostructure. It may be a multiple quantum well (MQW) stack, comprising several quantum wells separated by barriers. For instance, the active region is an alternation of InGaN QWs and GaN barriers. In some embodiments, lower-bandgap materials are used for the barriers to reduce voltage. In some embodiments, high-bandgap materials (e.g. AlGaN, AlInN) are used in the barriers or in other layers to provide potential barriers and reduce leakage. The active region may comprise several layers of low-bandgap material with varying comparison; some of these layers may emit, while others may not. For instance, the active region comprises first InGaN layers with a first composition x2 and second InGaN layers with a second composition x2, separated by GaN barriers, with x2>x1 and (x1, x2) selected such that the second InGaN layers emit light but the first InGaN layers do not emit light; in such embodiments, the first InGaN layers may be beneficial, e.g., for carrier injection or for material quality or for optical mode confinement. Active layers may have a non-constant composition, e.g. they may have composition steps or be graded. Active layers may have a thickness of 1 nm, 1.5 nm, 2 nm, 2.5 nm, 3 nm, 3.5 nm, 4 nm, 4.5 nm, 5 nm, 7.5 nm, 10 nm, 15 nm, 20 nm, 30 nm, 40 nm, 50 nm, 100 nm. Active layers may provide optical gain under injection.

The active region may emit at a peak wavelength in the visible range, the ultra-violet range, or the infrared range.

Various materials, including III-nitride compounds, give access to such wavelengths. The wavelength may be in a range 200-300 nm or 300-380 nm or 380-400 nm or 400-430 nm or 380-430 nm or 400-500 nm or 430-500 nm or 480-550 nm or 500-600 nm or 580-650 nm or 650-2000 nm.

Figure 10:
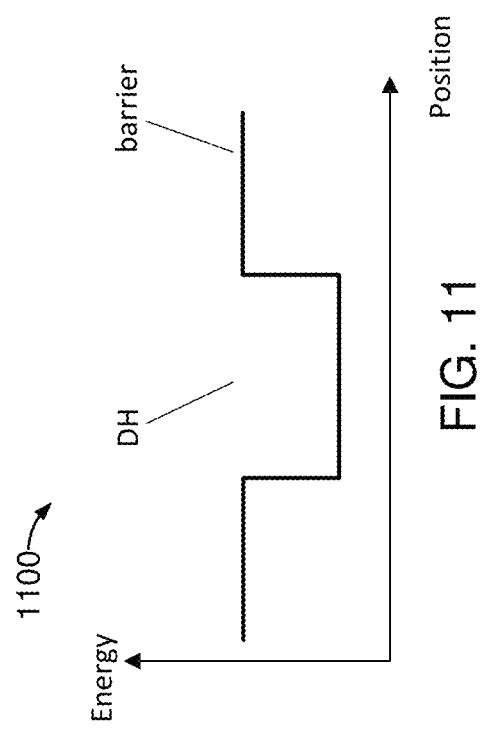
FIG. 10 shows multiple quantum wells and barriers.
Figure 11:
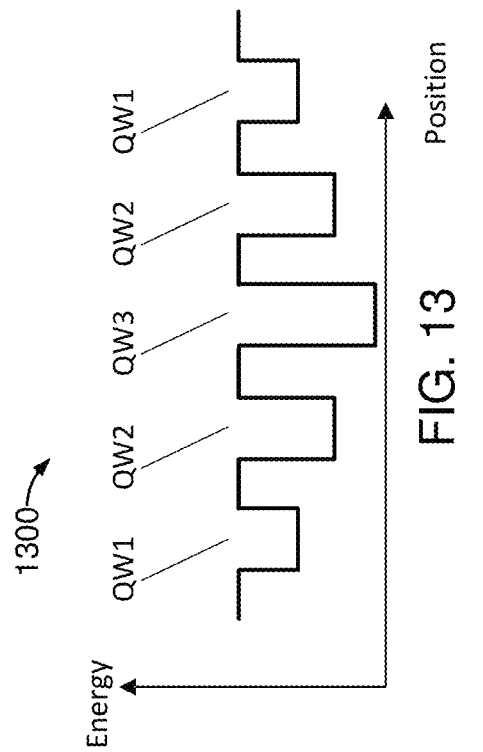
FIG. 11 shows a double-heterostructure.
Figure 12:
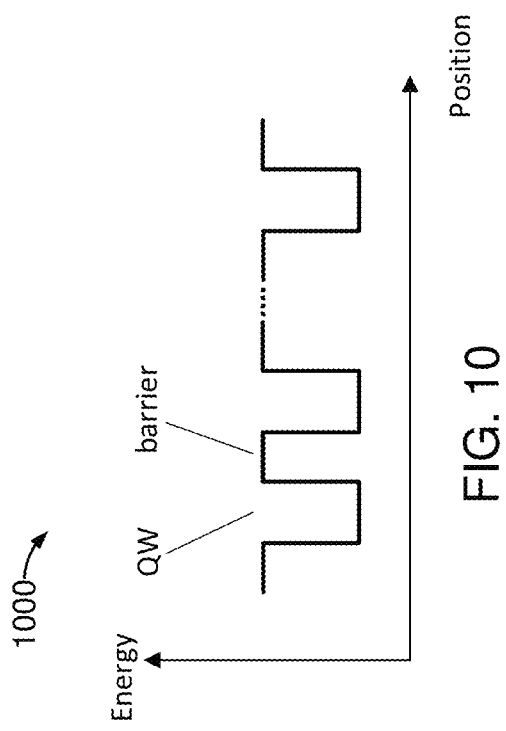
FIG. 12 shows a multiple quantum well stack where QW1 has a lower confinement than QW2 (for instance because it has a lower In content).
Figure 13:
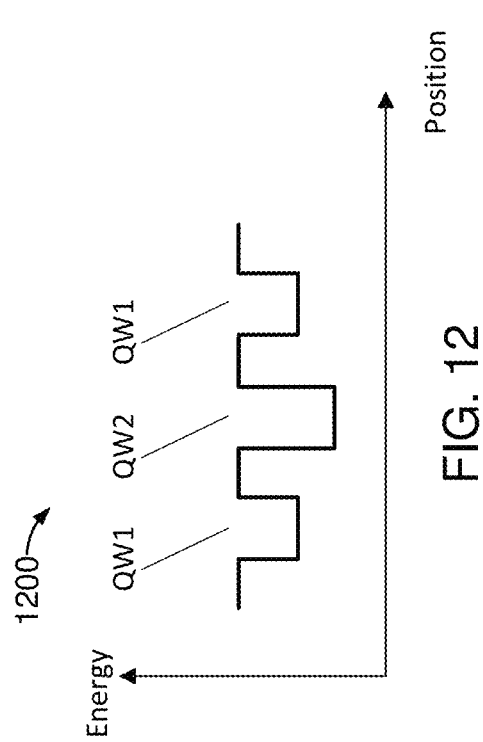
FIG. 13 shows another multiple quantum well stack of varying confinement: low/medium/high/medium/low.

FIGS. 10-15 illustrate various examples of active region configurations 1000, 1100, 1200, 1300, 1400, and 1500, respectively, and for each shows the energy potential caused by the heterostructure's composition, across the grown direction. FIG. 10 shows multiple quantum wells and barriers. FIG. 11 shows a double-heterostructure. FIG. 12 shows a multiple quantum well stack where QW1 has a lower confinement than QW2 (for instance because it has a lower In content). FIG. 13 shows another multiple quantum well stack of varying confinement: low/medium/high/medium/low (This can be achieved by corresponding In compositions). FIG. 14 shows multiple quantum wells where the composition is varied in steps. FIG. 15 shows multiple quantum wells where the composition is varied by grading. Further, the composition of barriers in-between the active layers may be varied. The thickness of the QW and/or barriers may be varied.

Polarization fields are not shown in FIGS. 10-15, but they may further be present and affect the potential.

In embodiments where several QWs have different emission wavelengths, the device may be designed such that some of the QWs are 'more active than others'. Here 'active' may mean that a QW emits light, or has a carrier population, or has a recombination current density. For instance, one QW emits a large fraction of the total emitted light. This may be desirable to enable high gain at low current density. In some embodiments, the QW(s) having the longest emission wavelength emits preferentially. This may be desirable if the other QWs facilitate carrier transport without contributing to light emission or absorption. In some embodiments, the device comprises at least one first QW emitting at a first wavelength and at least one second QW emitting at a second wavelength shorter that the first wavelength; and the at least one first QW emits at least 50% (or 60%, 70%, 80%, 90%, 95%) of the total radiometric power emitted by the device. In some embodiments, the device comprises N QWs, and one specific QW emits a fraction of the total emission which is significantly larger than 1/N, e.g at least 2/N or 3/N. This may also be expressed in terms of carrier density or current density, with some QWs having a larger fraction of the carrier population or of the recombination current density than others. In some embodiments the device comprises N QWs, and one specific QW has a fraction of the total carrier density (or electron density or hole density) which is significantly larger than 1/N, e.g at least 2/N or 3/N. In some embodiments the device comprises N QWs, and one specific QW has a fraction of the total recombination current which is significantly larger than 1/N, e.g at least 2/N or 3/N. These considerations can be generalized to devices having a first plurality of P QWs, a second plurality of Q QWs, and a given quantity (fraction of luminescence, fraction of carriers, fraction of recombination current) is significantly larger than P/(P+Q) (e.g. at least 2P/(P+Q), 3 P/(P+Q)); in some cases P=2 (or 1, 3, 4, 5) and Q=2 (or 1, 3, 4, 5, more than 5, more than 10). In some embodiments, at least one QW emits a small fraction of the total light output (such as less than 5% or 1%) when the device is under operation. In some embodiments, some of the QWs emit little or no light. For instance, a QW may emit less than 5% (or 2%, 1%) of the total emitted light. Such QWs may be called "dummy" QWs. Even though they emit little or no light, dummy QWs may facilitate carrier transport and hence improve device performance Some embodiments comprise a plurality of QWs having varying carrier confinement (achieved e.g. by varying their composition and design), wherein the QWs with the least confinement are dummy QWs. Some embodiments comprise a plurality of QWs having varying emission wavelengths (achieved e.g. by varying their composition and design), wherein the shortest-wavelength QWs are dummy QWs.

Some embodiments make use of unusually-thick light-emitting active layers. Such layers may have a very slow lifetime at low carrier density, caused by the separation of electrons and holes in the presence of polarization field; this can be useful in building up a high carrier population at a lower current density, and hence help lower-threshold lasing. Once a high carrier density is achieved, the polarization fields are partially screened, resulting in a higher electron-hole overlap.

The active region may comprise at least one layer having a thickness of at least 4 nm (or 5 nm, 6 nm), or in a range 4-8 nm (or 5-8 nm, or 5-20 nm, or 5-15 nm). This is an unusual thickness range, in-between a conventional quantum well (usually about 2-3.5 nm in III-nitrides) and a double heterostructure (usually more than 10 nm). This may be combined with a polarization field of at least 1 MV·cm−1 (or 2 MV·cm−1, 3 MV·cm−1) across the layer. This may be combined with a III-nitride composition having at least 10% In (or 12%, 15%, 20%, 25%, 30%). Such active regions may be characterized by a very low electron-hole overlap at low carrier density (before field screening occurs). For instance, the electron-hole overlap (defined as the integral of psi_e*psi_h) may be less than 5% (or 1%, 0.5%, 0.1%, 0.05%, 0.01%). This is in contrast to conventional quantum wells (where the thinner layers increase the overlap), and to conventional double-heterostructures (where doping—either intentional or by modulation—also increases the overlap). Such thick active regions may require an especially high material quality, such than SRH recombinations don't prevent the buildup of carrier population. In some embodiments, this is characterized by a ratio B/A (where A and B are the SRH and bimolecular radiation coefficients, taken at low current density) which is at least 1E-17 cm3 (or 1E-16 cm3, 1E-18 cm3). Such ratios can be achieved in high-quality epitaxy, as shown in A. David, et al., Quantum Efficiency of III-Nitride Emitters: Evidence for Defect-Assisted Nonradiative Recombination and its Effect on the Green Gap, Physics Review Applied 11, 031001 (2019), American Physical Society, which is incorporated herein by reference in its entirety.

Some embodiments comprise a light-emitting layer having a thickness in a range 5-10 nm, having an electron-hole overlap at low carrier density which is less than 5%.

Some embodiments enable lasing with a small number of QWs, e.g. 3 or 2 or 1—or equivalently by a moderate active region thickness such as less than 10 nm (or 5 nm). In lasers, additional QWs are sometimes required because of gain saturation: if the total detrimental loss in a structure is high, a high modal gain is needed to counter it; however, the gain in a QW saturates at high carrier density, so that several QWs are needed. In contrast, some embodiments enable a moderate unwanted loss such that moderate gain is sufficient. For instance, if the round-trip unwanted loss in an embodiment is below 1%, and the material gain is about 2500 cm−1, an active region of thickness t less than 10 nm can counter the loss (taking into account the enhancement factor of a mode resonant with the active layer: g_mod=4*t*g_mat). A reduced number of QWs can in turn reduce the threshold, and the operating current.

Figure 16:
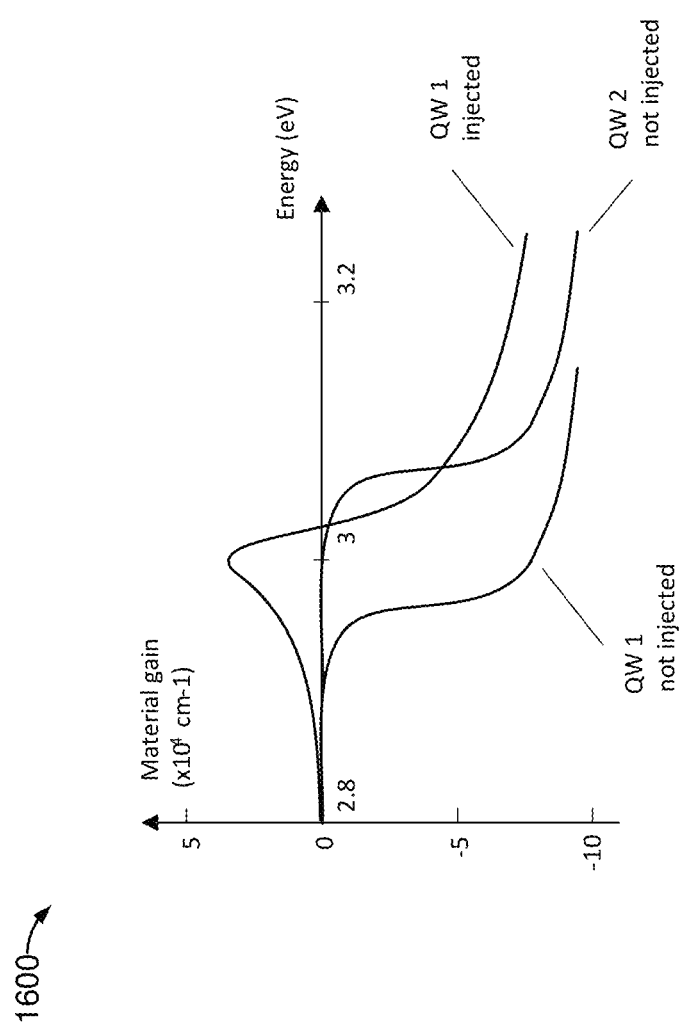
FIG. 16 is a graph that illustrates gain/absorption for an embodiment having at least two QWs.

FIG. 16 is a graph 1600 that illustrates gain/absorption for an embodiment having at least two QWs (the discussion also applies to two pluralities of QWs). In the example of FIG. 16, negative values of gain correspond to absorption. FIG. 16 shows the absorption of QW1 and QW2 without carrier injection: QW1 emits/absorbs at longer-wavelength (lower energy) than QW2 (for instance due to differences in composition and/or width). Upon device operation, QW1 has a large carrier density, leading to material gain ("QW1 injected"), whereas QW2 has a low carrier density. The device emits light at a wavelength (or a plurality of wavelengths) where QW1 shows gain. Because the absorption of QW2 is offset to higher energy, QW2 does not cause substantial optical absorption at this wavelength. In some embodiments, the absorption edge wavelength of QW2 is offset form the gain peak wavelength of QW1 by at least 5 nm (or 10 nm, 15 nm, 20 nm, 30 nm). In some embodiments, QW2 absorbs less than 1% (or 2%, 0.5%, 0.1%, 0.05%, 0.01%) of light emitted by QW1 in a single-pass.

Active region designs wherein active layers have varying wavelength and uneven emission intensity can be practiced alone or in combination with other features disclosed herein.

In some embodiments, not all the epi layers shown in FIG. CC are present, and the order of some layers may be modified. In some embodiments, the underlayer is grown before the intermediate mirror. In some embodiments, layers in the intermediate mirror also act as an underlayer for reducing the density of non-radiative defects—therefore the intermediate mirror acts as an underlayer. For instance, this may be the case if the intermediate layer is a DBR comprising layers of AlInN or AlInGaN with a high indium content (such as more than 10%).

Epitaxial designs wherein layers serve both for defect reduction and as reflective layers can be practiced alone or in combination with other features disclosed herein.

The tunnel junction (TJ) may comprise a plurality of layers of various composition and doping, configured to provide a low resistance. Generally, it comprises at least one highly-doped p++ layer and at least one highly-doped n++ layer, with doping levels which may be above 1E20 cm−3 (or 5E19 cm−3, 5E20 cm−3, 1E21 cm−3). It may further comprise at least one layer at or near the p-n interface which promotes tunneling, such as an InGaN or AlGaN layer (which may cause a field profile helping tunneling) or some other material (including oxygen or oxygen-containing compounds, or other species, which provide defect states for tunneling). Such materials may be introduced during epitaxial growth, or may be introduced with a different step including a processing step (e.g. clean) intervening in-between epitaxial steps.

The TJ may be placed at a node of the lasing mode. In some embodiments, the active region is located around an antinode and the TJ around a node. In some embodiments, the distance from the center of the active region to the TJ is about p*lambda/4 n, where p is an odd number, lambda may be the peak emission wavelength of the active region at a specified current and temperature, or the lasing wavelength, and n is an optical index characterizing the cavity (such as the average index in the cavity, or the index of the semiconductor matrix forming most of the cavity, e.g. GaN). In some embodiments, p=1 and this distance is about lambda/4 n: the active region and TJ are separated by half an oscillation of the mode. In some embodiments corresponding to violet-blue GaN VCSELs, this may correspond to about 45 nm or to the range 40-50 nm or in the range 35-55 nm. In some embodiments, p=3 and the distance is about 3*lambda/(4 n). In some embodiments corresponding to violet-blue GaN VCSELs, this may correspond to about 120 to 140 nm. Some embodiments are characterized by a distance about equal to p*lambda/4 n with a tolerance of +/−10 nm (or 3 nm, 5 nm, 15 nm, 20 nm).

In embodiments comprising a TJ, the activation of the p-GaN may be achieved by a variety of techniques and combinations thereof. Lateral openings (e.g. a mesa, or vertical trenches) may be formed in the structure to expose sidewalls, enabling lateral activation by an activation step known in the art (e.g. annealing in a high temperature furnace with a suitable gas composition and suitable temperature profiles and times). The p-material may be activated (partially or fully) as-grown—this may be achieved by a variety of techniques (including MBE, sputtering, plasma CVD, MOCVD with proper parameters).

Epitaxial design for minimized absorption, including TJ placement designs, can be practiced alone or in combination with other features disclosed herein.

Figure 17:
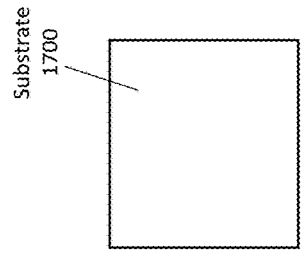
FIGS. 17-24 illustrate example fabrication flow for a device.
Figure 18:
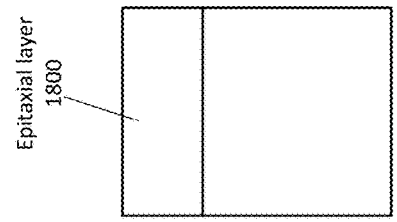
Figure 19:
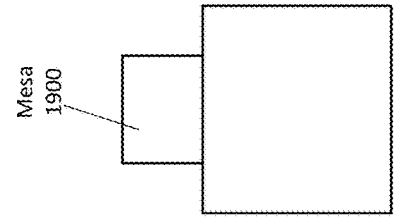
Figure 20:
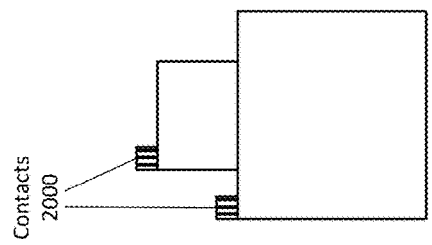
Figure 21:
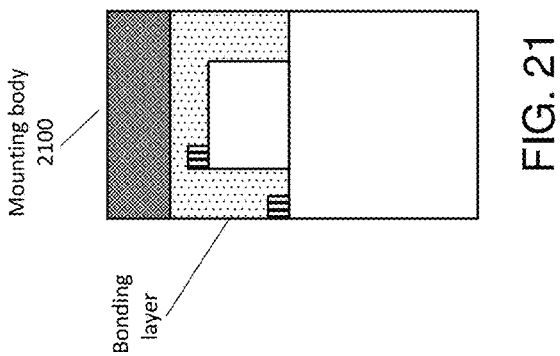
Figure 22:
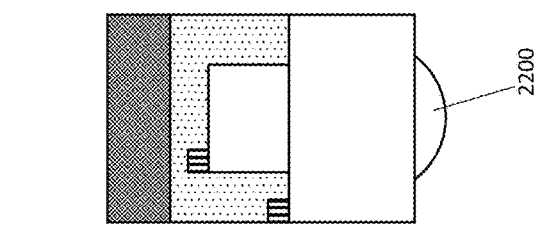
Figure 23:
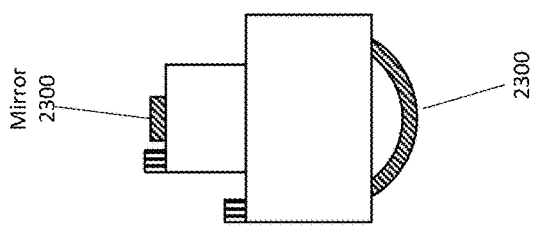
Figure 24:
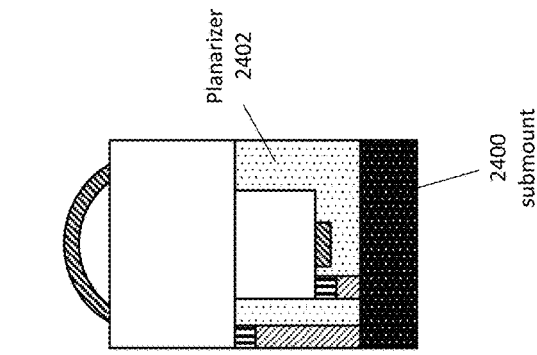

FIGS. 17-24 illustrate example fabrication flow for a device. The flow is simplified, with some stages or steps not shown. Some of the steps shown may be re-ordered, steps may be added or removed. The flow of FIGS. 17-24 is as follows. In FIG. 17 a substrate 1700 is provided. In FIG. 18, epitaxial layers 1800 are grown (including an active region and an intermediate mirror). In FIG. 19, a mesa 1900 is etched. In FIG. 20, contacts 2000 are formed. In FIG. 21, the wafer of FIG. 20 is attached to a mounting body 2100 by means of a bonding layer. In FIG. 22, the substrate 1700 is thinned, and a curved shape 2200 is formed. In FIG. 23, top and bottom mirrors 2300 are formed. In FIG. 24, the device is singulated, and contacted to a submount 2400, with a planarizer material 2402 to facilitate attachment to the submount.

Mirrors

The top and bottom mirrors 2300 may have high reflectivity. High reflectivity from two mirrors may enable lasing. Either of these mirrors may have a reflectivity which is above 99% (or 99.5%, 99.9%, 99.95%, 99.99%, 99.995%, 99.999%), and at or below 100%.

The reflectivity of an intermediate mirror may be selected as disclosed herein. In some embodiments, a moderate or low reflectivity is adequate, because the other two mirrors provide high reflectivity for lasing. In some embodiments, the reflectivity is below 90%. It may be in the range 5-90%, as will be discussed hereafter.

In some embodiments, reflectivity is specified at a given angle (such as normal incidence, or another off-normal angle), or in a given angular range (such as 0-1 deg, 0-2 deg, 0-5 deg, 0-10 deg, 0-20 deg, 0-45 deg, 0-90 deg); these angles refer to the direction of light propagating in the semiconductor (e.g. GaN in some cases). Unless otherwise specified, reflectivity values correspond to normal incidence. In some embodiments, reflectivity is specified at a given wavelength (such as 380 nm, 400 nm, 415 nm, 425 nm, 450 nm, 475 nm, 500 nm, 510 nm, 520 nm, 530 nm, 550 nm, 575 nm, 600 nm, 610 nm, 620 nm, 630m); or at a wavelength pertaining to the operation of the laser (such as a lasing wavelength, or a wavelength of an optical mode of the cavity, or a peak wavelength for emission by the active region, or peak wavelength for gain); or at a wavelength in a wavelength range (such as 380-420 nm, 400-430 nm, 430-470 nm, 470-500 nm, 500-540 nm, 540-600 nm, 600-640 nm); or across all wavelengths in such a wavelength range.

In some embodiments, mirrors are designed with two wavelength regions of interests for high reflectivity, to support lasing on a first wavelength, and low loss on a second wavelength region containing a mode fed by the lasing mode.

In some embodiments, mirrors are dichroic Bragg reflectors (DBRs), i.e. stacks of several optically-thin layers whose multiple Fresnel reflections interfere constructively to provide a desired reflectivity in a desired wavelength range. A common design of a DBR is a succession of low/high index layers with a thickness of about lambda/4n. Other designs are possible, such as stacks including more than two indices, or stacks wherein the individual thickness of each layer is optimized according to a figure of merit.

Epitaxial DBRs may comprise stacks of GaN/AlGaN or GaN/AlInN or AlGaN/AlInN or AlInGaN/AlInGaN.

Dichroic DBRs may comprise various dielectrics, including: $SiO_2$, $SiO_x$, SiN, $SiN_x$, $TiO_2$, $TiO_x$, $Ta_2O_5$, $Ta_xO_y$, $ZrO_2$, $ZrO_x$, and other materials known in the art. These layers may be formed by techniques known in the art, including sputtering, reactive/pulsed sputtering, electron beam deposition (reactive or non-reactive), pulsed laser deposition and others.

In some embodiments, a DBR is formed by forming porosity (e.g. of nanoscopic or mesoscopic scale) in some of the epitaxial layers. For instance, a stack having a succession of GaN layers with relatively low and high n-doping is grown by epitaxy. Subsequently, trenches or mesas are etched to give access to the sidewalls of the stack. An etch is employed to selectively make some layers porous, the selectivity being due to the doping level (for instance, GaN layers with sufficient doping are etched and become porous, while GaN layers with sufficiently low doping are not etched). The etch may be chemical, electro-chemical, photo-chemical, photo-electro-chemical. The porosity reduces the index of the porous layers, providing index contrast. The characteristic size of the pores may be smaller than an optical wavelength, such that the porous layers act as an optically-homogeneous layers and do not cause significant scattering. In some embodiments, the characteristic size is less than 10 nm (or less than 100 nm, less than 50 nm, less than 20 nm, less than 15 nm, less than 8 nm, less than 5 nm, less than 2 nm), or in a range 1-20 nm. This size may be controlled by varying the porosification parameters (including the doping level of the layer). Porous layers may be formed in other materials, including other III-nitride compounds. Masking layers (including dielectric layers) may be used during the porosification process to protect parts of the structure (for instance, the top surface of the mesa or a surface of the substrate or epi) while other parts (e.g. mesa sidewalls) are exposed.

In some embodiments, a doped III-nitride layer is grown with a desired doping level (e.g. n-type with at least 1E19 cm−3 concentration). A porosification process is used in the presence of a solution. The solution may be acidic (such as oxalic acid), basic/alkaline, or other chemically-active solution. A bias, or an optical excitation, may be applied to the structure to generate carriers. The doped layer may be oxidized by the carriers. The resulting oxide may be removed by an etch (including a liquid etch).

The average refractive index of a porous layer may be reduced from than of the original layer (before porosification) by at least 0.5 (or at least 0.1, 0.2, 0.75, 1, 1.5). In some cases, the porous layer is porous GaN and has an index below 2 (or 2.4, 2.3, 2.2, 2.1, 1.7), or in the range 1.7-2.3 (or 2-2.4).

The top mirror may be a DBR, a metal-based mirror, or a combination thereof. It may be formed by epitaxy, or be deposited after epi growth.

The intermediate mirror may be an epitaxial mirror (such as an epitaxial DBR). It may be a non-epitaxial mirror (such as a dielectric DBR), embedded in the epi by lateral overgrowth.

Figure 25:
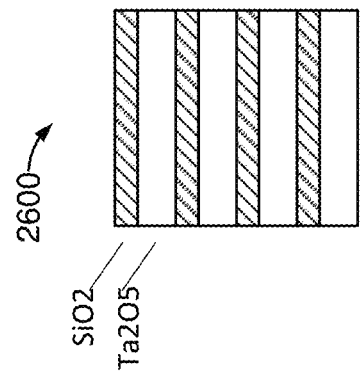
FIG. 25 shows an epitaxial DBR with layers of GaN and AlGaN.
Figure 27:
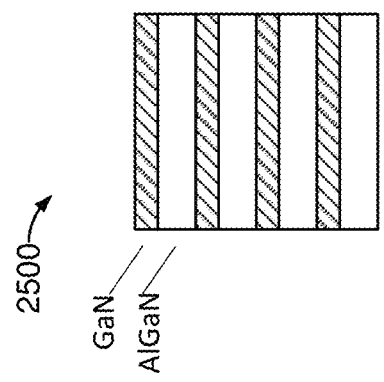
FIG. 27 shows a DBR with layers of GaN and of porous GaN.
Figure 26:
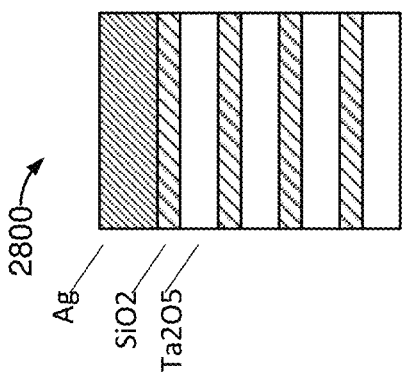
FIG. 26 shows a dielectric DBR with layers of SiO2 and Ta2O5.
Figure 28:
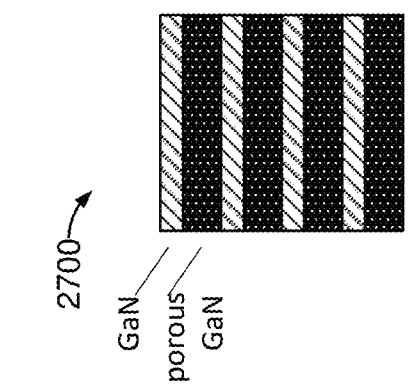
FIG. 28 shows a hybrid mirror having a dielectric DBR and a metal (Ag) layer.

FIGS. 25-28 illustrate example mirror stacks 2500, 2600, 2700, and 2800, respectively, such as described above. FIG. 25 shows an epitaxial DBR with layers of GaN and AlGaN. FIG. 26 shows a dielectric DBR with layers of $SiO_2$ and $Ta_2O_5$. FIG. 27 shows a DBR with layers of GaN and of porous GaN. FIG. 28 shows a hybrid mirror having a dielectric DBR and a metal (Ag) layer. Variations and combinations of such reflectors, and use of other materials, are possible.

Figure 31:
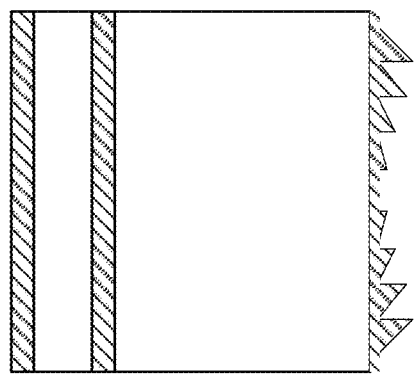
FIGS. 29-31 illustrate example devices with various bottom mirrors.
Figure 30:
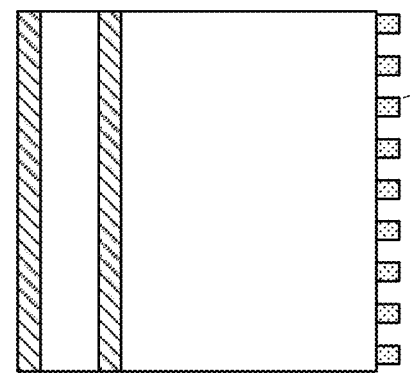
Figure 29:
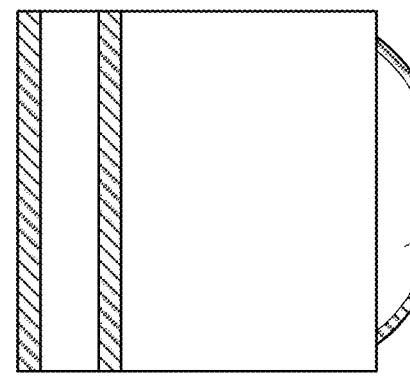

FIGS. 29-31 illustrate example devices 2900, 3000, and 3100, respectively with various bottom mirrors. In FIG. 29, the bottom mirror includes a curved (or non-planar) shape and reflective materials formed on the curved shape. In FIG. 30, the bottom mirror includes a photonic structure. In FIG. 31 the bottom mirror includes a Fresnel-like optical element with a mirror. Example details for these reflector designs are provided below.

In the case of a reflector on a curved shape, such as illustrated in FIG. 29, the curved shape may be formed by a variety of techniques, and combinations thereof:
- It may be formed directly on the substrate (for instance, it may be etched in the GaN substrate or deposited on the substrate back surface);
- Additional materials may be deposited on substrate and then shaped/patterned;
- Or it may be formed separately and subsequently attached/bonded to the substrate backside.

The curved shape may be etched in the substrate. For instance, the substrate may be thinned to an appropriate thickness, polished, patterned, and shaped (e.g. by dry and/or wet etch or by machining), resulting in a curved surface with appropriate shape/curvature. A mirror may further be formed on this curved surface. This can be achieved, for instance, by deposition of dielectric layers over the curved surface to form a DBR.

In some embodiments the curved shape isn't formed directly in the semiconductor; instead it is formed in another material/member, and bonded to the substrate back surface. Such a curved shape may be formed by lithography and etching, or by machining, or by molding, or other shape-forming techniques known in the art. The curved shape may also be obtained my molding (i.e. by injecting a material in a mold with an appropriate shape, and converting the material to a solid phase by e.g. curing or cooling). Suitable materials include plastics, silicones, glasses, dielectrics, materials having high transparency at the lasing wavelength, transparent conductive materials (such as $GaO_x$, $ZnO_x$). Bonding may be achieved as direct bonding (e.g. fusion bonding or covalent bonding) or using an intermediate bonding layer. In some embodiments, the bonding interface has a single-pass absorption of less than 0.1% (or 1%, 0.01%, 0.001%). In cases where the material is conductive, it may be used to form a contact for the device and/or to transport current.

Figure 32:
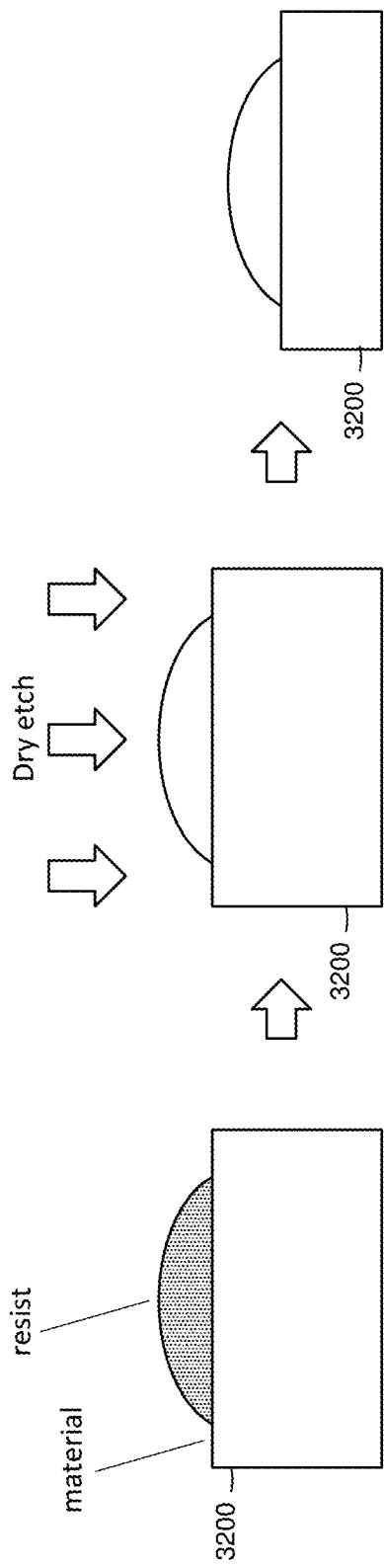
FIGS. 32 and 33 illustrate techniques to form a curved mirror.
Figure 33:
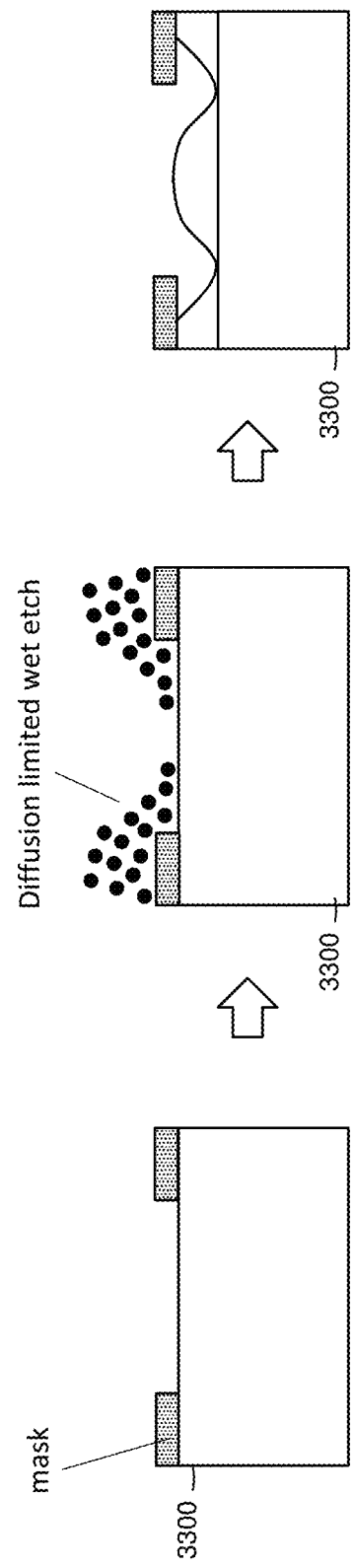

FIGS. 32 and 33 illustrate techniques to form a curved mirror. In FIG. 32, a member 3200 is provided and coated with a resist. The resist has a curved shape; this shape may be obtained by reflow, use of a resist with suitable surface tension, and other known techniques. A dry etch is used to transfer the shape of the resist into the member. The curved surface may then be covered with a reflector. The member may be the device substrate directly, or it may be a separate member (insulating of conductive) which is subsequently bonded to the substrate.

In FIG. 33, an etching mask is deposited and patterned on a substrate 3300. The substrate is exposed to a diffusion-limited wet etchant. Since the mask doesn't etch, etching particles are accumulated on top of the mask, while the etching particles are consumed in the open area. This creates a diffusion profile with higher etching particles on the outer region of the open area and less etching particles in the center. The result is an etched profile providing a curved surface. The surface may be covered with a reflector. The etch mask may be removed.

Figure 34:
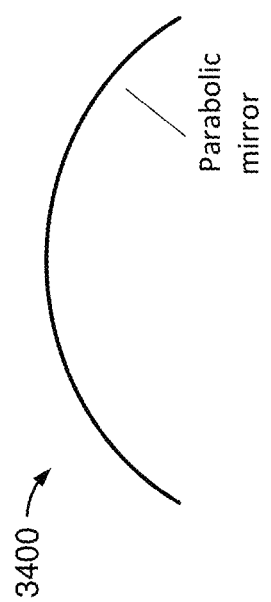
FIG. 34 illustrates a parabolic mirror shape.

The curved shape may be a parabolic shape, with a curvature radius selected to reflect the lasing optical mode. In some embodiments, the lasing beam has an approximately Gaussian beam shape as it propagates in the substrate/full cavity, and the mirror has a profile adapted to reflect this beam. FIG. 34 illustrates a parabolic mirror shape 3400.

Figure 35:
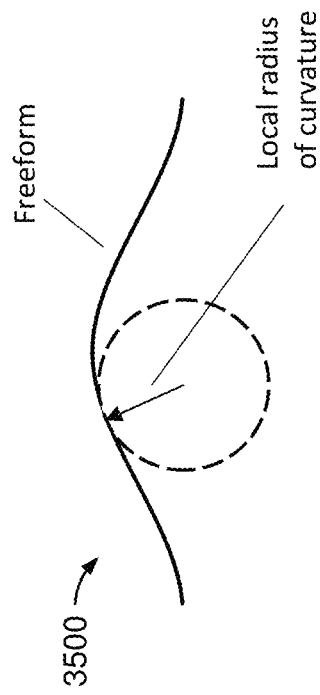
FIG. 35 illustrates a freeform mirror whose local radius of curvature is configured locally for high reflectivity.

In some embodiments, the mirror is a freeform shape whose design is selected to maximize reflectivity of the lasing mode, with optimization techniques known in the art. FIG. 35 illustrates a freeform mirror 3500, whose local radius of curvature is configured locally for high reflectivity. Freeform shapes may be optimized by known numerical techniques, given a figure of merit based for instance on the desired reflectivity and/or the diffraction loss.

In some embodiments, the bottom mirror isn't merely designed for overall high reflectivity, but instead for high modal reflectivity for the lasing mode (i.e. reflectivity from the lasing mode back into the lasing mode)—indeed this quantity may be most relevant for laser loss. In some embodiments, the modal reflectivity for the lasing mode is above 99% (or 99.5%, 99.9%, 99.95%, 99.99%, 99.995%, 99.999%), and at or below 100%. The shape of the lasing mode may be substantially Gaussian, or different from a Gaussian beam.

In some embodiments, the curved mirror has a lateral extent which is smaller than the lateral extent of the optical mode. This may be unavoidable: a true Gaussian mode has infinite lateral extent (albeit with a rapid decay away from the optical axis). In some embodiments, the lateral extent of the curved mirror is selected to minimize loss due to non-reflection of the lateral tails of the mode. In some embodiments, the mirror captures at least 4 $\sigma$ of the gaussian beam (or 3 $\sigma$, 5 $\sigma$, 6 $\sigma$, 8 $\sigma$ where $\sigma$ is the standard deviation of the Gaussian profile.

In some embodiments, the design of the bottom mirror is informed by a measurement of the optical properties of the device without the mirror. For instance, the device—without the bottom mirror present—is injected (electrically or optically) and the emission of the active region is measured (for instance, at/near the substrate back surface or in the far-field). From these measurements, emission properties of the device are inferred, and the design of the bottom mirror is refined (e.g. its curvature is determined, or its center point/axis is determined, or its shaped is altered to increase reflectivity or correct an optical aberration in the emission). Embodiments include methods of forming a device according to such measurements.

The bottom mirror may also comprise a photonic structure as shown in FIG. 30. The photonic structure may be a photonic crystal (i.e. a material having a periodic or quasi-periodic variation of refractive index on a scale commensurate with an optical wavelength) or a more advanced photonic structure (so-called metamaterials, or metasur-faces). The photonic structure may provide high reflectivity for the lasing mode, for instance due to the existence of a photonic bad gap in the photonic structure.

FIG. 36 illustrates a photonic structure 3600 whose features vary in shape/size across a lateral dimension. FIG. 36 shows square-like features, but more complex features acting as photonic antennas may be employed, with varying shape, size, orientation. It is possible to design a planar structure with locally-varying features to locally diffract light with a desired direction and phase, and to design this structure to operate at several wavelengths or in a wavelength range. Various numerical optimization techniques may be employed to design the photonic structure (or other elements of the device), including genetic algorithms, steepest descent, gradient methods, Newton's method, adjoint method, neural networks, deep learning, and combinations thereof. In some embodiments, an objective function is defined (such as a desired diffraction pattern or an overall device performance metric), constraints are set (such as the refractive indices that can be used, the shape/height/aspect ratio of features or other shape aspects, minimum/maximum critical dimensions) and an optimization technique is used to optimize the function under the constraints. In some embodiments, the photonic structure operates locally or globally in a desired diffraction order (including first, second, third, fourth, fifth, or even higher orders). High orders may require larger feature dimensions and facilitate fabrication.

Fabrication of photonic structures may be achieved by techniques known in the art, including e-beam lithography, nano-patterning, interference lithography, stepper lithography, dry etching, wet etching, and combinations thereof.

In some embodiments, the photonic structure is a planar, i.e. the optical features composing it are laid out on a plane rather than on a curved surface. This may provide ease of fabrication.

FIGS. 37, 38, and 39 illustrate example modes of operation for photonic structures similar to photonic structure 3600. In FIG. 37, a photonic structure 3700 is a mirror for various angles of incidence; it reflects light from the optical mode (even if this mode has components which are not along one single direction, e.g. Gaussian beam). In other words, the photonic structure is a planar structure acting as a curved mirror. In FIG. 38, a photonic structure 3800 steers the direction of light from the lasing mode, turning e.g. a Gaussian mode into a collimated mode. This may be achieved by having a photonic structure which is a diffraction grating, with a spatially-varying structure in the lateral direction, such that light incoming at various lateral positions (with different propagation directions) is diffracted in the normal direction. In other words, the photonic structure is a planar structure acting as a curved lens. This may be complemented with a planar mirror placed below the photonic structure which reflects the light back as shown in FIG. 38, or with a photonic-structure-based mirror as shown in FIG. 39.

In addition to affecting the direction of the light, the photonic structure may also affect the phase of the light. In some embodiments, it is designed such that the light has a constant phase front (or other desired phase front) after reflection. FIG. 40 illustrates this. FIG. 40 is an illustration of a photonic structure 4000. Light is emitted from an injected area of the active region in several directions—here directions 1 and 2 are shown (these may correspond to various directions in a Gaussian beam, e.g. the center of the mode and an off-center divergent ray of the mode). The light impinges on the photonic structure. Due to the different propagation distances, a different phase is accumulated. The photonic structure steers the light and imparts a phase shift to the light. The steering and the phase shift are varied locally. In the example of FIG. 40, the steering is such that the light is steered towards the vertical, then impinges on a reflector, is steered back by the photonic structure, and is re-directed towards the active region. The phase shifts 1 and 2 caused by the photonic structure along directions 1 and 2 are selected such that the reflected light arrives at the active region in phase for both directions, thus creating a mode antinode at the active region. In general, the phase shift can be controlled locally across the photonic structure to ensure that the mode is in phase and resonant at the active region.

The photonic structure may be designed to operate at a center wavelength λ0 and with a width dλ. In some embodiments, dλ is selected to accommodate wavelength drift of the device under operation (such as the drift of the laser mode due to temperature). In some embodiments, dλ is 5 nm (or 10 nm, 15 nm, 20 nm, 30 nm).

In some embodiments, a photonic structure is formed on a non-planar surface.

Embodiments including a photonic structure, such as a photonic crystal or metasurface, can be practiced alone or in combination with other features disclosed herein.

FIG. 41 illustrates a portion of a device 4100 in which a bottom mirror includes a Fresnel lens and a reflective material (such as a DBR) formed on the Fresnel lens. This may act as a curved mirror, with a lower profile.

In embodiments where the device operates as a VCSEL, the reflectivities of the top and bottom mirrors may be high to reduce loss and enable lasing. For instance, both reflectivities may be above 99.9%. In particular, if a low threshold is sought, the reflectivities may be increased (although this may come at the expense of the output power).

In embodiments where the device operates in superluminescent mode, at least one of the reflectivities may be reduced in order to prevent lasing. In particular, it may be desirable to increase loss through one mirror such that the device can be operated at a high carrier density without lasing: this may enable stimulated emission with a short lifetime, and may thereby reduce loss due to other recombination channels. In some embodiments, the device operates as a superluminescent emitter and at least 10% (or 20%, 30%, 40%, 50%, 60%, 70%, 80%) of the carriers injected in the active region are emitted in the superluminescent modes. In some embodiments, the differential lifetime for stimulated emission is at least 10 times (or 5 times, 2 times) faster than the differential lifetime for spontaneous emission and/or the differential lifetime for Auger recombination and/or the lifetime for carrier escape from the active region. In some embodiments, one of the reflectivities is in a range 98%-99% (or 95-99%, 99%-99.9%, or 99.9%-99.99%).

In some embodiments, the intermediate mirror has a moderate reflectivity—in contrast to the top and bottom mirror, which may have a reflectivity above 99%. The intermediate mirror may have a reflectivity of about 10% (or 8%, 12%, 15%, 20%, 25%, 40%, 50%, 60%, 70%, 80%, 90%), or in a range 8-12% (or 10-15%, 12-18%, 15-25%, 20-30%, 5-90%, 10-50%). The reflectivity may be above 5% and less than 50% (or 20%, 30%, 80%).

Such moderate reflectivities may be achieved in epitaxial DBR of GaN/AlGaN or GaN/AlInN Standard models enable the design of a DBR. For instance, assuming a standard DBR design with layers of thickness lambda/4n, optimized for normal incidence reflectivity:

a reflectivity of about 0.1 may be achieved with a DBR with n_high=2.5 and (n_low=2.12, 2 pairs) or (n_low=2.24, 3 pairs) or (n_low=2.3, 4 pairs) or (n_low=2.34, 5 pairs) or (n_low=2.37, 6 pairs) or (n_low=2.39, 7 pairs).

a reflectivity of about 0.5 may be achieved with a DBR with n_high=2.5 and (n_low=2.1, 5 pairs) or (n_low=2.2, 7 pairs) or (n_low=2.3, 11 pairs) or (n_low=2.35, 14 pairs).

Other desired reflectivities can be achieved accordingly, given a set of materials.

Such DBRs may be obtained, for instance, with AlGaN having an appropriate composition, and can be grown without generating excessive strain leading to cracking. They may also be achieved by near-lattice-matched materials such as AlInN In some embodiments the DBR comprises two materials whose in-plane lattice constants are within 0.1% of each other (or 0.5%, 0.05%, 0.01%, 0.005%, 0.001%)

FIG. 42 is a graph 4200 to illustrate simulated field intensity (i.e. the square of the electric field) across the cavity for a simplified structure. The intensity is normalized to 1 in the outside medium (left of the structure). For visual simplicity, the numerical model uses mirrors with zero thickness. The structure has a bottom mirror with reflectivity 90%, a GaN substrate of thickness 5057 nm, an intermediate mirror of reflectivity 10%, an intermediate cavity of thickness 466 nm, and a top mirror of reflectivity 100%. The thicknesses are optimized (starting from a substrate thickness of about 5um and a cavity thickness of about 450 nm) for a resonant mode at a wavelength λ=400 nm having maximum amplitude in the intermediate cavity. The peak intensity is about twice as high in the intermediate cavity as in the substrate. Hence, in this structure, for each round-trip in the full cavity, there are two round trips in the intermediate cavity. This enables lasing with fewer round trips through substrate. If the substrate or the bottom mirror is lossy, this is advantageous. In this case, the net substrate loss is half what it would be in the absence of the intermediate mirror.

FIG. 43 is a graph 4300 to illustrate modeling results of the following ratio: r=(peak mode intensity in the intermediate cavity/peak mode intensity in the substrate), for various values of the intermediate mirror reflectivity. In each case, the wavelength is 400 nm and the thicknesses are optimized for peak amplitude in the intermediate cavity. The general structure is the same as in FIG. 42. FIG. 43 shows that, as the reflectivity increases, the ratio increases. A higher ratio may be beneficial to obtain higher gain with fewer trips through the full cavity. Some embodiments are characterized by a ratio r larger than 2 (or 1.5, 3, 4, 5, 10, 15, 20, 50), or a ratio r in the range 2-5 (or 2-10, 10-100). A ratio r may reduce the substrate loss by r times, compared to an embodiment where the intermediate mirror is absent. Embodiments comprise methods of configuring an intermediate mirror to increase the relative intensity of the optical field by a factor r in the intermediate cavity and reduce the substrate loss by a factor r.

However, an excessive reflectivity may reduce the design tolerance of the device, as will now be discussed.

FIGS. 44-47 are graphs 4400, 4500, 4600, and 4700, respectively, that show the modeled peak mode intensity in the cavity versus wavelength, for several values of the intermediate reflectivity R. Here the substrate thickness is about 5 um and the intermediate cavity thickness about 460 nm. If R=0 (no intermediate mirror is present), the resonant modes are only dictated by the full cavity. Their spacing is determined by its total thickness. The substrate thickness may be selected for a desired mode spacing (a thicker substrate leads to a lower mode spacing). The thickness may be about 10 um (or 15 um, 20 um, 30 um, 40 um, 60 um) or in a range 10-50 um (or 10-30 um, or 10-150 um, 30-100 um, or 100-1000 um). Low mode spacing may be desirable such that there is always at least one (or two, three, five, ten) mode overlapping with the region of positive material gain. Optical absorption in the substrate may further be considered in selecting a thickness. In some embodiments, the substrate has an absorption coefficient a at a selected wavelength (such as the wavelength of an optical mode of the device), and the thickness is selected such that a single-pass trip through the substrate results in an absorption below 0.1% (or below 1%, below 0.01%, below 0.001%), or such that the product alpha*t (with alpha the absorption coefficient and t the thickness) is below 0.1% (or below 1%, below 0.01%, below 0.001%).

When R increases (10%, 20%, 30% as shown in FIGS. 44-47) the resonances are further modulated by the optical response of the intermediate cavity. As R increases, this response becomes sharper (i.e. the intermediate cavity acquires a higher finesse).

This is further illustrated in FIGS. 48 and 49, which show optical responses 4800 and 4900 of the intermediate cavity only (this is obtained in the model by setting the bottom mirror reflectivity to zero). The response is modeled for a cavity having an optimized thickness for operation at λ=400 nm, and for a cavity whose thickness has been increased by 10 nm (to illustrate variations in process control). The response is shifted when the thickness is not optimal. Therefore, if the active region has peak gain at 400 nm, the peak gain and the resonant wavelength of the cavity are misaligned, leading to higher lasing threshold. This effect is more pronounced when R increases: a cavity of higher-finesse is more sensitive to thickness variations.

Accordingly, embodiments may employ an intermediate mirror reflectivity which increases the peak intensity in the inner cavity while maintaining acceptable tolerance. Embodiments include methods of forming an intermediate cavity with a thickness control better than +/−10 nm (or +/−5 nm, 15 nm, 20 nm) across one device (or a plurality of devices, or across an area on-wafer of at least 3×3 mm or 10×10 mm). Such methods may be enabled by optical monitoring during epi growth, RHEED, or other thickness-monitoring techniques. Further, embodiments comprise methods of measuring a local variation in the epi thickness across a wafer, and locally adapting other elements of the cavity (such as the top and bottom mirrors, and possible optical spacer layers which provide a suitable optical path) such that the cavity remains resonant locally. As an example, a transparent layer (conductive or insulating) may be formed on the epi stack with a locally-varying thickness (which can be achieved, for instance, by successive patterning/deposition steps in various regions) and followed by the upper mirror formation, the transparent layer providing a locally-varying optical path such that the cavity is always resonant. Such a transparent layer may be varied locally with a local variation in thickness in increments of 10 nm (or 5 nm, 2 nm, 20 nm).

The thickness of the intermediate cavity may be characterized by a cavity order, defined as m=Lcav/(λ/2 n). m also corresponds to the number of mode peaks inside the intermediate cavity. In some embodiments, a small order may be desirable to reduce optical loss associated with propagation (due to e.g. absorption). In some embodiments however, a high-enough order may be desirable; for instance, because it brings more tolerance to device design.

FIG. 50 illustrates this. FIG. 50 shows the cavity response 5000 for two devices where the intermediate cavity is 10 nm thicker than optimal. The intermediate mirror reflectivity is R=10%. In one case m=3 (L=234 nm); in the other case m=6 (L=475 nm). In both cases, the intensity at the design wavelength (400 nm) is reduced by the same amount due to the extra cavity thickness. However, the cavity with m=6 has a resonant wavelength of 408 nm while the cavity with m=3 has a resonant wavelength of 418 nm. The former is closer to 400 nm, i.e. the mismatch between peak gain and resonance wavelength is less.

In some embodiments, the intermediate cavity is characterized by an order in a range 2-15 (or 3-10, or 4-8). In some embodiments, the intermediate cavity has a physical thickness (between the end of the intermediate mirror and the beginning of the top mirror) which is in a range 3-10 (in units of lambda/n). In some embodiments, the intermediate cavity has an effective thickness (including the penetration depth in the top and intermediate mirrors) which is in a range 3-10 (in units of lambda/n).

Some embodiments comprise methods to design a laser cavity having an intermediate cavity defined by a top mirror and an intermediate mirror. The method comprises: determining a typical thickness variation in the growth of the intermediate cavity, and selecting the intermediate mirror reflectivity and the intermediate cavity thickness to accommodate the thickness variation. The method may comprise selecting a fabrication yield, and selecting parameters of the device to meet this yield.

In some applications, stable lasing wavelength without mode-hopping is desirable, even when the current and temperature of the laser are varied. For instance, in display applications, the colors of the display are affected by wavelength shift. Referring again to FIGS. 44-47, in the absence of an intermediate mirror, a large number of modes are candidates for lasing. Lasing may hop from one mode to another, resulting in a wavelength jump of several nm. In contrast, the presence of an intermediate mirror preferentially selects some modes of the full cavity, reducing the likelihood of mode hopping. Accordingly, R may be selected to obtain stable mode operation.

Embodiments include lasers having a total cavity thickness larger than 10 um, but providing operation without mode hopping as a function of current and temperature in a given range. For instance, the laser may exhibit a stable mode from room temperature to a junction temperature of 80 C or 100 C or 120 C. The laser may exhibit a stable mode from the threshold current Jth to 2× Jth (or 1.5× Jth 3× Jth, 5× Jth, 10× Jth).

In some cases, the intermediate mirror is selected not only for its reflectivity at a design wavelength, but also for its phase shift versus wavelength. In such embodiments, the phase shift of the intermediate mirror may compensate for the index dispersion of other elements in the cavity, leading to a lower wavelength sensitivity. In some embodiments, the phase shift leads to a lower sensitivity to the thickness of the intermediate cavity.

Doping

In some embodiments, the substrate is doped (either n- or p). In some embodiments, the substrate is an n-doped III-Nitride material—including GaN, AlN, InN, or a compound such as AlGAN, AlInN, InGaN, AlInGaN.

In some embodiments, the substrate doping is selected to improve device performance This may require competing considerations. High doping may be beneficial for electrical properties (e.g. provide good current spreading, low contact resistance, low resistivity, low voltage). Low doping may be preferable for good optical properties (e.g. provide low free-carrier absorption). The doping may be selected with these considerations in mind.

Various species may be employed for substrate doping, such as n-doping by Si, O, Ge and p-doping by Mg. Co-doping is possible. Introduction of doping species may be achieved during epitaxial growth, by ion implant, by dry etching (or more generally a dry plasma treatment), by wet solution.

In some cases, the doping (either in the substrate or in an epitaxial layer) is in a range 1E17 cm−3 to 1E18 cm−3 (or 1E15 cm−3 to 1E16 cm−3, 1E16 cm−3 to 1E17 cm−3, 1E18 cm−3 to 1E19 cm−3).

Alternatively, the doping may be very low (such as less than 1E15 cm−3, 1E14 cm−3, 1E13 cm−3, 1E12 cm−3). The substrate may be semi-insulating or insulating.

In some cases, the single-pass absorption due to doping through the substrate is less than 0.1% (or less than 1%, less than 0.5%, less than 0.05%, less than 0.01%, less than 0.005%, less than 0.001%).

In some embodiments, the doping level in the epitaxial layers is also selected to improve device performance. Similar considerations apply as in the case of substrate doping. In some embodiments, the doping level is varied across the epitaxial layers. In some embodiments, the epitaxial layers comprise high-doping layers and low-doping layers. The high-doping layers may provide lateral carrier diffusion and/or low contact resistance. The low-doping layers may provide low optical absorption. The thickness of the high-doping layers may be limited to avoid deleterious absorption. In some embodiments, the single-pass absorption due to doping through the epitaxial layers, or a specific layer, or the TJ layers, is less than 0.1% (or less than 1%, less than 0.5%, less than 0.05%, less than 0.01%, less than 0.005%, less than 0.001%).

Various species may be employed for doping of the epitaxial layers and the substrate. Si, Ge, or O may be used for n-doping. Mg may be used for p-doping.

In some embodiments, one or several high-doping layers are thin and are positioned near a node of a lasing mode. This may for instance allow the use of a contact-spreading layer while minimizing the corresponding free-carrier absorption. In some embodiments, a doped layer has a thickness less than 20 nm (or 10 nm, 5 nm, 30 nm) and the center of the layer is located close to the position of a node, with a tolerance of +/−10 nm (or 5 nm, 15 nm). Such layers may be n-doped or p-doped, and may have a doping level above 1E19 cm−3 (or 1E18 cm−3, 5E18 cm−3, 5E19 cm−3, 1E20 cm−3). An n or p contact may be formed to such layers or portions thereof.

FIG. 51 illustrates an embodiment of a device 5100 for which doping is optimized for low optical loss. Device 5100 includes n-doped layers with various doping levels. A highly doped (n++) layer acts as a contact layer and current spreader: the high doping provides low n-contact resistance and current spreading. Another highly doped layer acts as a further current spreader in the device, to make the current more uniform laterally. These highly doped layers are separated by lower-doping layers. A TJ is present above the p-GaN; n-GaN is present above the TJ. The optical mode is shown. The structure is configured such that the contact layer is near a node, the current spreader is near a node, and the TJ is near a node. Thus, these highly-doped layers cause less absorption. Note that some of the layers in FIG. II may not be to scale. For instance, the dielectric mirrors may be thicker that one lobe of the optical mode (often, DBRs are several times as thick as the optical wavelength). In such cases, the doping across a dielectric mirror may be varied to minimize losses (e.g. by increasing the doping in portions of the mirror where the mode is less intense, and vice-versa).

In some embodiments, doping is further configured to affect barriers in the electrostatic potential of the epitaxial stack. Indeed, at heterointerfaces (e.g GaN/AlGaN or GaN/AlInN), barriers may be formed due to differences in band gap and polarization fields; these barriers may impede the flow of carriers and lead to excess resistance. Accordingly, some embodiments employ doping to reduce these barriers. In some embodiments, the doping is lower on one side of a heterointerface and higher on the other side, leading to a reduction in potential barrier. In some embodiments the doping is graded across layers, such that doping is relatively high on one end of a layer and relatively low on the other end of the layer. This may be applied in DBRs, to improve transport across the DBRs. In particular, in some embodiments, doping is varied across the layers of the intermediate mirror to improve n-conductivity and provide a conductivity across the DBR higher than 1 (or 0.1 or 2 or 5 or 10 or 20) Ohm−1·cm−1. Conductivity may be jointly improved with optical losses as discussed above. For instance, a doping profile may be selected to maximize conductivity (by providing adequately high doping at proper interfaces) while minimizing absorption (by reducing doping in regions where high doping isn't necessary and where the mode profile is intense).

In some embodiments, a DBR stack in a device has a resistance of less than 1 Ohm (or 0.00 Ohm, 0.01 Ohm, 0.05 Ohm, 0.1 Ohm, 0.5 Ohm, 2 Ohm, 5 Ohm, 10 Ohm). In some embodiments, a device has a total resistance or a dynamic resistance of less than 1 Ohm (or 0.001 Ohm, 0.01 Ohm, 0.05 Ohm, 0.1 Ohm, 0.5 Ohm, 2 Ohm, 5 Ohm, 10 Ohm). In some embodiments, a low resistance enables operation of a device with an electrical efficiency (defined as 1240/lambda/Vf, with lambda the peak emission wavelength and Vf the voltage in volts) of at least 50% (or 25%, 60%, 70%, 80%, 90%) at a desired input.

In some embodiments, doping is achieved or increased by grading the composition of the material. In particular, in crystal orientations where the polarization fields are non-zero, composition grading may give rise to an electric field which in turns gives rise to an effective charge—this is also known as polarization doping. This may be advantageous, because this polarization doping cause lower absorption than conventional doping. In some embodiments, conductivity is provided in an undoped layer solely by composition grading. In some embodiments, conductivity is provided in a doped layer by a combination of doping and composition grading. In some embodiments, at least 50% of the conductivity is caused by polarization doping. In some embodiments, polarization doping is employed in a layer whose position overlaps with an antinode (peak) of the lasing mode. Composition grading may be achieved, for instance, by a linear or quadratic variation of composition versus position. Composition variations may be achieved for instance by growing Al(x)Ga(1−x)N with varying x, or In(x)Ga(1−x)N with varying x, or In(x)Al(1−x)N with varying x. Polarization doping and conventional impurity-based doping may be combined in different portions of the device. For instance, the layers in and around a TJ comprise impurity-based doping with high doping density (which may be essential for low TJ resistance); while other layers comprise polarization doping.

FIG. 52 illustrates doping profiles 5200. In each layer of a multilayer structure, several regions (e.g. three) may be defined: a first transition region, a constant region, a second transition region. The doping may be ramped in transition regions. A delta-doping may also be used at appropriate interfaces.

Electrical Injection

Some embodiments comprise metallic contacts, including Ag, Al, Ti, Au, Cu, Ni, Sn, Pt and other known metals. Some embodiments comprise transparent conducting oxide layers such as ITO or ZnO.

In some embodiments, an n-contact is formed on the substrate. In some embodiments, an n-contact is formed on an epilayer. In some embodiments, an n-contact is made to highly doped GaN, or to GaN having a high composition of a species (such as Si or O or Ge) at its interface. Before formation of an n-contact, a surface may be prepared to reduce contact resistance. This may include a dry etch step or a chemical treatment.

In some embodiments a p-contact is formed to p GaN or p++ GaN, as discussed previously.

In some embodiments, a TJ is formed above the p-GaN and both device contacts are n-contacts. The anode injects electrons in n-GaN which tunnel as holes into the p-GaN, and the holes are injected in the active region.

In some embodiments, at least one p-doped layer is configured to control current spreading.

A device may include one or several highly-doped layers for carrier spreading.

In some embodiments, a portion of the device is ion-implanted to reduce or suppress conductivity and create a current aperture. In some embodiments, a portion of the substrate is ion-implanted prior to epi growth to reduce or suppress n-conductivity. In some embodiments, a lateral portion of the epi layers is ion-implanted after growth to suppress conductivity in n and/or p layers. Suitable ions for implant include B and H and Ar. The implant may be configured to preferentially suppress conductivity in the n layers, or in the p layers, or both. A conductivity may be reduced by a factor of 100 (or 10 or 1,000 or 10,000). An initial conductivity may be about 1 Ohm−1·cm−1, or in a range 0.1-10 Ohm−1 cm−1. Other techniques may be employed to suppress conductivity in a portion of the device, either alone or in conjunction with implantation.

In some embodiments, the current aperture is substantially matched with the lateral extent of the optical mode in the plane of the active region. The lateral extent of the optical mode may be defined as the lateral area where the mode is within 10% (or 50%, 1%) of its peak intensity. In some embodiments, at least 50% (or 80%) of the region where the mode extends is current-injected. In some embodiments, the mode extends in at least 50% (or 80%) of the region where current is injected.

In some embodiments, carrier injection is electrical. In other embodiments, carrier injection is optical (e.g. the active region is pumped by an exciting light). In such embodiments, doped layers for carrier injection may be unnecessary. P-doped and/or n-doped layers may still be present, however, to obtain a desired band structure and manipulate the recombination dynamics (e.g. to increase the ratio of radiative to non-radiative recombination rates).

Some embodiments having a tunnel junction (TJ) are characterized by a low TJ resistance under electrical injection. The TJ may have a differential contact resistance of less than 1E-4 Ohm·cm2 (or 1E-3, 5E-4, 5E-5, 1E-5), at a specific current density (such as 1 kA·cm−2 or 300 A·cm−2, or at the threshold current density Jth or a multiple thereof including 2×Jth or 5×Jth). The TJ may have a total contact resistance of less than 1E-4 Ohm·cm2 (or 1E-3, 5E-4, 5E-5, 1E-5), at a specific current density (such as 1 kA·cm−2 or 300 A·cm−2, or at the threshold current density Jth or a multiple thereof including 2×Jth or 5×Jth). The TJ may cause a total voltage drop of less than 1V (or 2V, 0.5V, 0.1V) at a specific current density (such as 1 kA·cm−2 or 300 A·cm−2, or at the threshold current density Jth or a multiple thereof including 2×Jth or 5×Jth). As a consequence, some embodiments are characterized by a high electrical efficiency of at least 50% (or 25%, 60%, 70%, 80%, 90%) at a specific current density (such as 1 kA·cm−2 or 300 A·cm−2, or at the threshold current density Jth or a multiple thereof including 2×Jth or 5×Jth). Some embodiments are characterized by a combination of properties, for instance a TJ having a differential contact resistance below 1E-4 Ohm·cm2 and a total contact resistance below 1E-3 Ohm·cm−2 at a current density of 1 kA·cm−2. may Such low-resistance performance may be combined with configurations which facilitate a low optical loss, as disclosed herein.

Lateral Optical Confinement and Scattering Losses

Some embodiments possess lateral features, positioned around the intermediate cavity, to provide lateral confinement of the optical mode. The presence of a lateral confinement feature may cause unwanted optical loss. Various embodiments reduce such loss, as discussed below.

Figure 54:
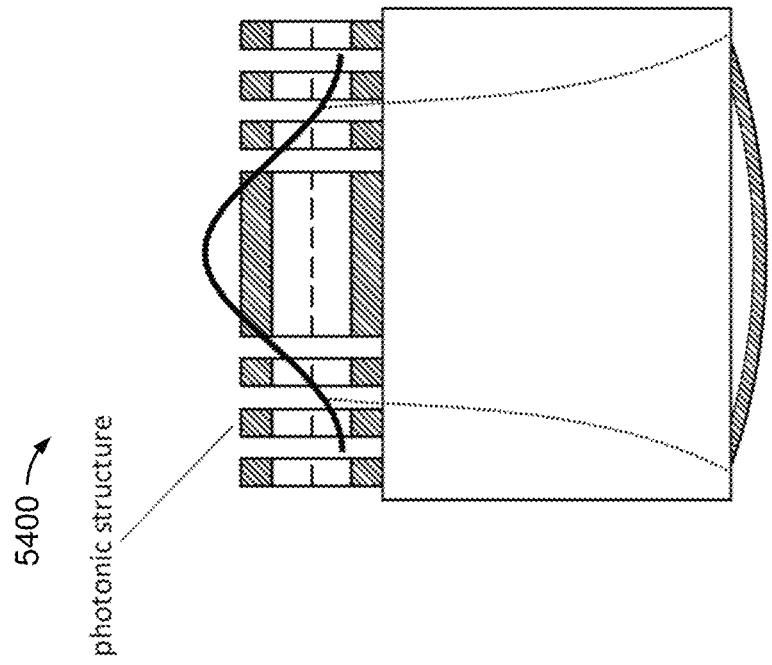
Figure 53:
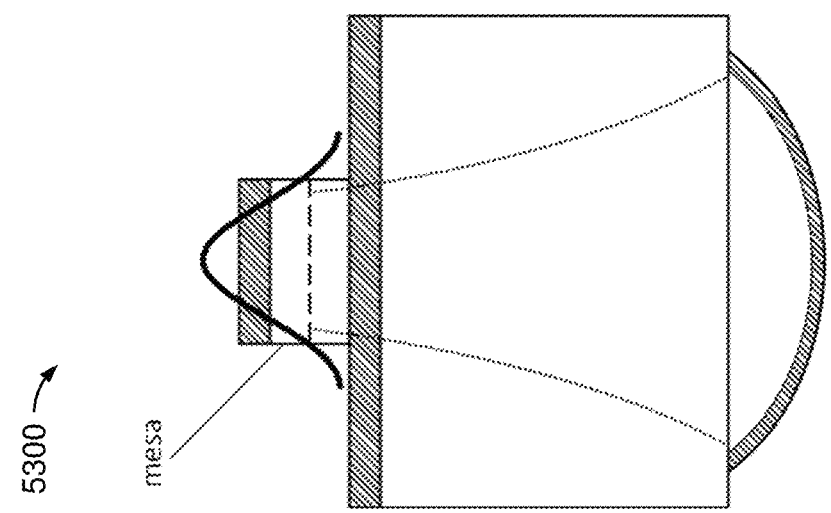
Figure 56:
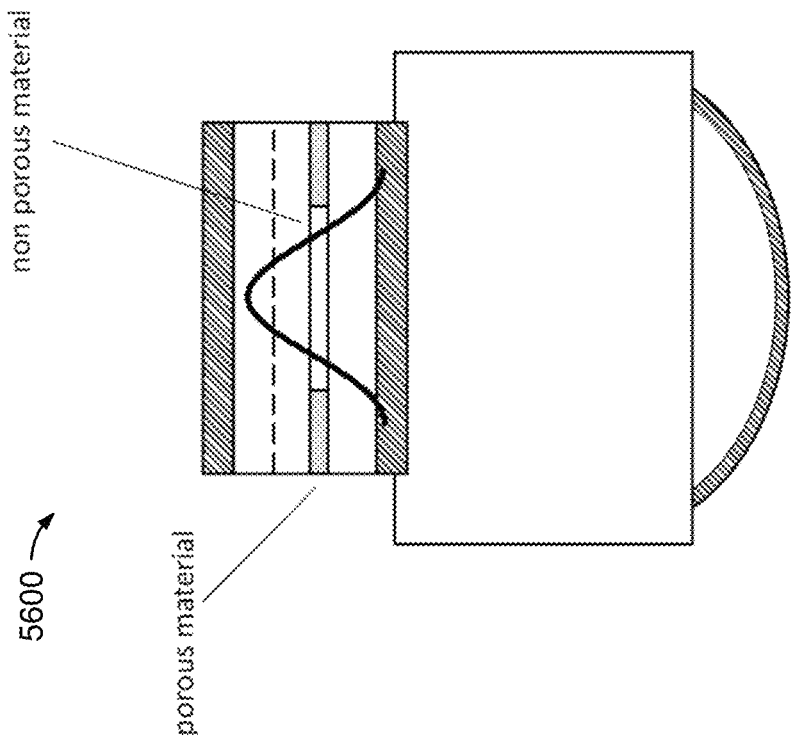
Figure 55:
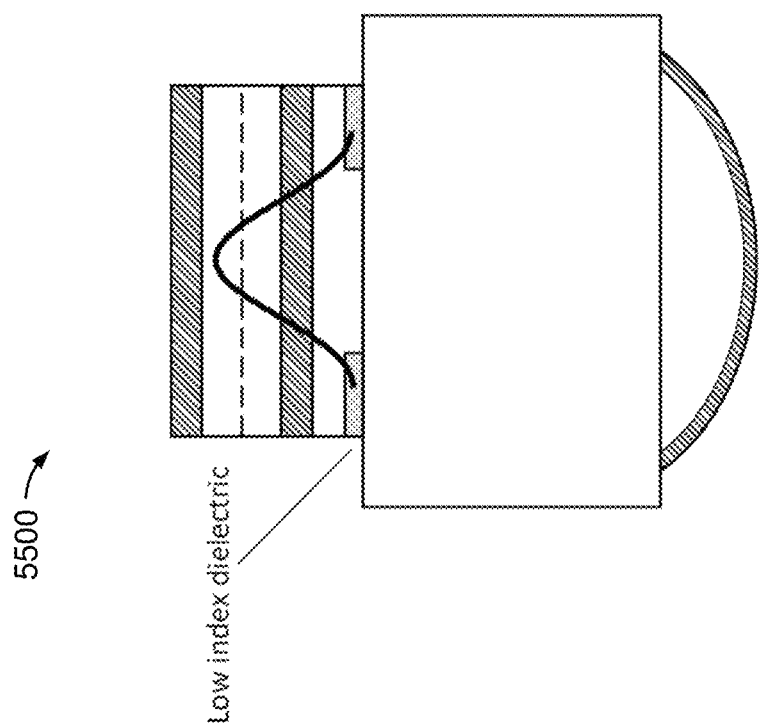

FIGS. 53-58 illustrate schemes for lateral optical confinement. FIG. 53 illustrates a device 5300 where a mesa offers lateral confinement. FIG. 54 illustrates a device 5400 where photonic structures are formed at the periphery of the cavity. FIG. 55 illustrates a device 5500 where a low-index dielectric layer is formed in the epi stack. FIG. 56 illustrates a device 5600 where an epi layer is made porous, providing low index.

Variations are possible. A low-index layer (whether dielectric or porous) may be placed above or below the intermediate mirror. A mesa may be etched at various depths, including above the intermediate mirror, below the intermediate mirror, into the substrate.

A simple and common means of lateral confinement is a mesa, etched through the intermediate cavity, as shown in FIG. 53. The mesa may be formed by an etching technique including dry etch (including RIE, ICP) or wet etch. Alternatively, the mesa may be obtained by growing on a substrate patterned with a dielectric mask, using a growth mode which favors vertical (or near-vertical) growth rather than rapid lateral growth.

The sidewalls of the mesa may be rough, which can cause scattering loss. Some embodiments reduce losses by achieving low roughness on sidewalls. Sidewalls may be characterized by an RMS roughness below 10 nm (or 5 nm, 2 nm, 1 nm, 0.5 nm, 25 nm, 50 nm, 100 nm). Such RMS roughness may be measured by atomic force microscopy.

This may be achieved by selecting the parameters of the mesa formation process (such as the pressure, chemical species, temperature, and DC and RF powers of an ICP etch).

In some embodiments, a chemical etch is performed to improve the smoothness of the mesa sidewalls. This may be an etch which reveals preferred crystallographic planes. The etch may be chemical, photo-chemical, electro-chemical, photo-electro-chemical. It may be performed at a suitable temperature (e.g. including heating or a temperature variation step). It may reveal non-polar facets (such as a-planes or m-plane), or semi-polar facets, or polar facets. Suitable chemicals for etching (and for other process steps disclosed herein) include: Phosphoric acid/H3PO4, Acetic acid/CH3COOC, hydrochloric acid/HCl, nitric acid/HNO3, sulphuric acid/H2SO4, Potassium hydroxide/KOH, sodium hydroxide/NaOH, hydrofluoric acid/HF. Such chemicals may be combined, and may be dissolved in various species (including water, solvents).

The mesa may be a cylinder (a common shape for a VCSEL), but it may also have slanted walls and/or a cross-section which isn't a circle (such as a hexagon, a square, a dodecagon, or other shapes). In one embodiment the mesa has a circular cross-section and the sidewalls are slanted (i.e. at an angle from vertical); in one embodiment the mesa has a hexagonal cross-section and the sidewalls are vertical (i.e. the mesa is a hexagonal prism); in one embodiment the mesa has a circular cross-section and the sidewalls are slanted (i.e. at an angle from vertical), forming a section of a cone. Such embodiments may form mesa sidewalls along preferred crystallographic planes, which may then be smoothened by a chemical etch as described above. In one embodiment, a mesa sidewall is formed along a given plane by dry etching, and a wet etch which preferentially reveals this plane is subsequently performed to reduce roughness, and reduce dangling bonds at the sidewalls (which may otherwise result in optical absorption). In one embodiment, a hexagonal mesa is dry etched with sidewalls along the m-planes, and a wet etch (e.g. H3PO4 or other) is performed to reduce surface roughness.

Scattering loss at an optical interface generally increases with the index contrast at the interface. Therefore, in some embodiments, to reduce scattering loss, one or a plurality of transparent layers of varying index (typically, from high to low index) are formed around the sidewalls of the mesa to form a mode-confining profile without large steps in refractive index—thus reducing scattering losses at each interface. In some embodiments the mesa is covered with one layer, with the following structure: semiconductor mesa (index n)/material 1 (index n1)/outer medium (index no). In some embodiments, there are at least two successive layers covering the sidewall of the mesa, with the following structure: semiconductor mesa (index n)/material 1 (index n1)/material 2 (index n2)/outer medium (index no). Typically the outer medium is air (no=1), although encapsulation in a high-index medium is possible. In one example, material 1 is SiN (n1=1.9), material 2 is SiO2 (n2=1.5) and the outer medium is air. The transparent layers may be dielectric layers and may be formed by deposition techniques known in the art (sputtering, reactive/pulsed sputtering, e-beam, pulsed laser deposition and others); techniques which yield conformal layers may be preferred to coat the sidewalls of the mesa.

Some embodiments are characterized by a low single-pass modal loss due to sidewall scattering for a desired optical mode. This loss may be below 0.5% (or 0.1%, 0.01%, 0.001%).

In some embodiments, lateral confinement is obtained by forming a photonic structure in a lateral region surrounding the cavity. This is shown in FIG. KK (B). The photonic structure may have a varied profile of refractive index in one or several dimensions. The photonic structure may modulate the lateral mode profile. It may lead to a larger lateral mode extent than in the case of a mesa. This may in turn lead to a lower divergence angle for the Gaussian profile of the mode in the substrate. In some embodiments, the photonic structure leads to a beam with a minimal waist at a large distance away from the active region, such that a planar mirror is suitable rather than a curved mirror.

In some embodiments, lateral confinement is obtained by embedding a low-index material in the epitaxial structure, as show in FIG. 55. For instance, a GaN substrate is patterned with a dielectric mask (such as SiO2, SiN, AlOx). Epi growth is performed to grow in the openings of the mask. The growth conditions may be selected for near-vertical growth, in which case a mesa is naturally formed above the aperture. The growth conditions may be selected for lateral growth, in which case the epi can grow over the mask and may coalesce, forming a continuous epi layer over the mask. In such embodiments, the low-index dielectric layer provides lateral mode confinement; in some embodiments, it provides a current aperture. The mask's footprint may be aligned with a specific crystallographic direction (such as the a- or m-directions), and be combined with a lateral growth which is preferential along the direction. In some embodiments, a first epi step favors vertical growth and a second epi step favors lateral growth. In some embodiments, this leads to the formation of air gaps in the epi above the dielectric mask. In some embodiments, the mask is not a physical dielectric layer, but rather a surface treatment which affects the substrate surface locally, preventing nucleation/growth where it is performed.

In some embodiments, lateral confinement is achieved by forming a porous layer of low refractive index, as shown in FIG. 56. The formation of porous layers was discussed above. In some embodiments, a layer with appropriate properties is grown (e.g. highly-doped GaN or AlInGaN). A mesa is formed whose sidewalls expose the layer. A process step is used to make the layer porous. The step is controlled (e.g. by time) to control the lateral extent of the porosity, thus creating a ring-like region of porous material at the mesa edge and leaving the layer non-porous at the mesa center. Alternatively, the lateral extent of the porosity may be controlled by another means (such as local illumination in a photo-assisted etching process, or local carrier injection in an electrical-assisted etching process).

This porous region creates an optical effect akin to the oxidation of AlAs into AlOx in AlGaAs-based materials: the low-index porous region confines the mode laterally.

FIG. 57 illustrates an embodiment where a transparent layer is formed around the mesa of a device 5700 and is overlaid with a top mirror. This may be formed as follows: a mesa is etched in the epitaxial material; a planarizing transparent layer (such as BCB) is formed around the mesa (and potentially etched-back to be flush with the mesa); a top mirror is deposited over the top of the mesa and the top of the planarizing layer FIG. 58 illustrates a device 5800 that includes a mesa surrounded by a lateral material (such as a dielectric). This may passivate the surface, resulting in reduced leakage, and less-active dangling bonds. This may also reduce scattering loss, as discussed above. Lateral materials may be formed by a conformal process such as sputtering.

Sometimes, the lateral extent of the optical mode may not align perfectly with the injected region. In particular, the mode may extend in a region where carriers are not injected in the active region. This may reduce performance, as the active region remains absorbing in the non-injected areas, causing optical loss.

Accordingly, in some embodiments, a part of the semiconductor is doped by ion implant. This may screen the electric fields (e.g. polarization fields) in layers of the active region (e.g. quantum wells), and therefore shift the absorption edge to a higher energy. This may be advantageous to help reduce the unwanted absorption in non-current-injected regions. In the current-injected region of the mesa, ion implant may be avoided (for instance by using a mask during the implant). Active-region-loss-reduction schemes can be practiced alone or in combination with other features disclosed herein.

Such ion implantation for optical purposes may be combined with ion implantation for transport purposes, as described previously. In some embodiments, the substrate is implanted before epi growth to define current apertures; the device is further implanted after growth to locally reduce absorption in the active region.

The doping may Si doping. It may be achieved at an implant energy of about 30 keV (or 5 keV, 10 keV, 20 keV, 50 keV 100 keV) or in the range 10-100 keV. The surface of the semiconductor may be coated with a SiN layer (of thickness in the range 1-100 nm or 10-50 nm) prior to doping. The semiconductor may be annealed after doping to activate the implanted ion species; it may be coated (e.g. with an SiN layer or other) during the annealing step to protect the surface from decomposition; the annealing temperature may be in the range 1000-1200 C (or 1000-1500 C, or 800-1000 C). The implanted ion concentration in a layer of the active region may be at least 1E20 cm−3 (or at least 1E19 cm−3, 5E19 cm−3, 5E20 cm−3, 1E21 cm−3, 5E21 cm−3).

FIGS. 59 and 60 illustrate ion-implanted devices. FIG. 59 shows a device 5900 that includes a semiconductor mesa where a lateral region receives an ion implant and becomes an implanted region, while another lateral region is protected by an implant mask and isn't implanted. FIG. 60 shows the current flow in the operating device 5900. The current flow may be determined by other elements not shown, such that only a part of the active region is an injected region. The non-injected region may correspond (in part or in totality) with the implanted region. Alternatively, the injected region may have a smaller lateral extend than the ion-implanted region.

Some embodiments are characterized by a low single-pass modal loss due to active region absorption, under operation, for a desired optical mode. This loss may be below 0.5% (or 0.1%, 0.01%, 0.001%). This loss may be associated with a portion of the active region which is not electrically injected. For the sake of clarity, in some embodiments, the rest absorption of the active region is substantially higher (because the active region is not pumped and is fully absorbing); under injection, a portion of the active region is injected which reduces losses (or may provide gain), and another portion is not injected. Embodiments are characterized by a low loss for this latter absorption.

Device Operation

In some embodiments, a device is injected with carriers (through electrical or optical injection) and operates in a regime where at least one light-emitting layer has optical gain. The device may operate as a laser or as a superluminescent emitter. The methods of operation discussed hereafter can be practiced alone or in combination with other features disclosed herein.

FIGS. 61-72 show figures related to the optical properties of embodiments.

FIG. 61 is a graph 6100 that shows possible values of the material gain for the active region as a function of current density. In the absence of carriers, the active region only absorbs light (the gain is negative at all energies). At a carrier density n=1E19, the gain is at the threshold of acquiring a positive value (transparency is nearly reached). At increasing densities n=2E19 cm−3, 5E19 cm−3, and 1E20 cm−3, the gain acquires increasing positive value in an increasing range of energies. In this example transparency occurs at an energy of about 3 eV (corresponding to violet wavelengths), but other values are possible depending on the active region. This may correspond to gain at visible wavelengths (including violet, blue, cyan, green, yellow, orange, red), infra-red (including near-infrared, far infra-red), ultraviolet (including UVA, UVB, UVC) and other wavelengths. In this embodiment the peak material gain values are on the order of 1-5E4 cm−1, but other ranges of operation are possible, for instance devices operated to have a peak material gain in a range 1E3-1E4 cm−1, 1E4-1E5 cm−1, 1E5-1E6 cm−1. Here and throughout this application, volumic carrier densities in an active layer may be converted to surface carrier densities by multiplying the volumic density by the thickness of the active layer. A active layer may have a typical thickness of about 3 nm; therefore, a carrier density of 1E19 cm−3 would correspond to a surface density of about 3E12 cm−2, and likewise for other values.

This material gain leads to a corresponding modal gain for each optical mode in the device. The modal gain is determined by the mode's confinement factor G (i.e. its overlap with the active region) and by the mode's optical loss. FIG. 62 is a graph 6200 that shows an example of peak modal gain for a given modal loss (the gain is shown as a continuous curve—it should be understood that this is the peak modal gain value, which is further filtered by the density of optical modes, as shown in subsequent figures). Here the mode has a G of about 5E-4 and a modal loss of about 10 cm−1 (the modal loss is taken as wavelength-independent for simplicity, although some wavelength dependence is possible). Other values of confinement factor are possible, such as at least 1E-3 cm−1 (or 5E-3 cm−1, 1E-2 cm−1, 5E-2 cm−1, or in a range 1E-3-1E-2 cm−1 or 5E-3-5E-2 cm−1), depending on the optical design. Other values of modal loss are possible, such as less than 5 cm−1 (or 20 cm−1, 2 cm−1, 1 cm−1, 0.5 cm−1, 0.1 cm−1). As the carrier density increases the modal gain increases. At n=5E19 cm−3, the modal gain is still negative, corresponding to amplified spontaneous emission or super luminescence. At n=1E20 cm−3, the modal gain is positive, enabling lasing (in practice, lasing may occur as soon as the modal gain crosses a zero value).

FIG. 63 is a graph 6300 that shows an embodiment having active region material gain, and only two optical modes aligned with the gain region. A first mode is close to the peak gain, and a second mode is at a higher energy. This may correspond to a situation where a device has only one longitudinal mode and two transverse modes: in this case the first mode corresponds to the fundamental transverse mode and the second mode to the next transverse mode. Depending on the current density, gain and lasing may occur preferentially in the first mode or in the second mode as well. This may lead to a situation where the device is a monomode laser at low-enough carrier density, but becomes multimode at higher carrier density.

Some embodiments may avoid such behavior, as a laser with extended lateral monomode operation may be desirable. In some embodiments, the modal loss of higher-order transverse modes (i.e. modes above the fundamental transverse mode) is increased to prevent them from lasing. This may be achieved by inserting a lossy element at an appropriate position in the device; or it may be achieved by having a gain region whose lateral extent overlaps well with the fundamental transverse mode but less well with higher-order modes. A gain overlap metric of the gain g(r) with a transverse mode can be calculated as $int(g(r) \cdot E^2(r) \cdot dr)$. In some embodiments, a first transverse mode is characterized by a first gain integral I1. At least one higher-order transverse mode is characterized by a second gain integral I2 (possibly, other modes with successive indices 3-n have gain overlaps I3 . . . In). In some embodiments, I1 is larger than I2 (or I3, or all overlaps I2-In) by at least 20%

(or 10%, 30%, 50%, 80%). This may be facilitated by the fact that higher-order transverse modes have wider lateral extent, so that lower gain away from the center of the cavity suppresses their gain overlap.

In some embodiments, the lateral extent of the region having high gain is smaller than the lateral extent of the device mesa; for instance, a typical lateral dimension (e.g. diameter) of the gain region is less than 80% of a typical lateral dimension (e.g. diameter) of the mesa. In some embodiments, the lateral/transverse profile of a mode is determined by the mirrors (including a curved bottom mirror), so that a mesa extending farther doesn't significantly affect the mode profile. Further, in some embodiments, the lateral extent of the gain region and the lateral extend of the mode are selected to maximize device efficiency. The lateral extent of the gain region can be controlled e.g. by current apertures as disclosed herein; the lateral extent of the mode can be controlled e.g. by optical design including mirror design as disclosed herein. Some modes may long tails (e.g. gaussian modes) but low intensity in the tails. Therefore, some embodiments ensure that there is gain in the region where the mode intensity is high, but avoid carrier injection in regions where the mode intensity is low. This can be quantified by the following metric: $J=sum(g*E^2)/[sqrt(sum(g))*sqrnsum(E^2))]$, where the sums are 2-dimensional integrals along the transverse direction in the plane of the device, $g(r)$ is the gain and $E(r)$ is the electric field. If the shape of the gain and of the mode intensity are exactly matched, $J=1$. On the other hand, if there is significant mismatch (either because the gain region is narrower or wider than the mode profile), J may have a low value such as less than 5%, which is undesirable. Some embodiments enable good matching between gain and field, with values of J above 50% (or 10%, 20%, 70%, 80%, 90%). In some embodiments, there exists a lateral region containing 90% (or 80%, 95%) of the mode intensity $E^2$; the gain has a maximum value gm, the gain is at least 50% (or 80%, 90%) of gm everywhere in the lateral region, and the integral of the gain inside the lateral region is at least 2 times (or 3 times, 10 times) the integral of the gain outside the lateral region (i.e. everywhere but in the lateral region) [the preceding discussion pertains to 2-dimensional integrals in the plane of the active region]

FIG. 65 is a graph 6500 that shows possible radial profiles of gain and of two transverse modes. The first transverse mode has one lobe; the second transverse mode has three lobes (other modal configurations are possible). The gain has a profile which is relatively constant in a first radial region, and decreases to zero in a second radial region. In this example, the gain profile favors the first mode over the second. In general, embodiments may have radial gain profiles configured to preferentially increase the modal gain for some modes.

FIG. 64 is a graph 6400 that shows an embodiment having active region material gain, and a plurality of optical modes aligned with the gain region. In this case the free spectral range (FSR, i.e. the wavelength difference between modes) is small compared with the width of the gain region. In some embodiments, at least 5 (or 3, 8, 10, 15, 20, 30, 50 100, 200, 500, 1000) modes have gain; in some embodiments, the number of modes having gain is in a range 10-100 (or 5-50, or 100-1000). In some embodiments, a plurality of modes have a modal gain of at least 1 cm−1 (or 5 cm−1, 10 cm−1, 50 cm−1, 100 cm−1, 0.5 cm−1, 0.1 cm−1). In some embodiments, a plurality of modes are in a wavelength region where the material gain of the active region is at least 1E4 cm−1 (or 3E5, 3E4, 1E5, 1E6 cm−1). The FSR may be less than 1 nm (or 2 nm, 5 nm, 10 nm, 0.5 nm, 0.2 nm, 0.1 nm, 0.05 nm, 0.01 nm). In some embodiments, some or all of the modes with gain correspond to the same transverse mode but to different longitudinal modes. A desired FSR may then be achieved by selecting a cavity of suitable thickness. In embodiments having a distant mirror (such as that show on FIG. AA), the full cavity thickness may be selected for a desired FSR. In embodiments having an intermediate mirror, the design of the intermediate cavity (including its thickness and the intermediate mirror reflectivity) may further be selected to impart a high modal gain to only a fraction of these modes.

In such a gain configuration, various device operations are possible. In one embodiment, the device is a laser and it lases over a plurality of modes. In contrast to prior art devices where longitudinal multimode operation may be considered an undesirable effect occurring at high power density (wherein additional modes start lasing), some embodiments seek multimode operation, possibly with a desired number of modes and mode spacing. A device may be designed for such a specified multimode operation in a given input power range—including close to threshold (e.g. at a current density less than 1.1× or 1.5× or 2× or 3× threshold). Embodiments comprise methods of designing and configuring such emitters. One embodiment is a method comprising selecting a multimode operation in a given power range with a specified minimum number of modes and maximum mode spacing is specified, and configuring (or designing, or fabricating) a device to fulfill these requirements; this is facilitated by selecting the thickness of the epi layers and of the substrate to accommodate the desired number of modes. For instance, if a longitudinal mode spacing less than 1 nm is sought in a GaN device at an emission wavelength of about 450 nm, a substrate thickness of at least 50 um (or in a range 50-70 um) may be selected.

In some embodiments, the device operates as a vertical cavity superluminescent emitter (VCSLED). In such embodiments, the mirror reflectivities may be selected such that modal gain is achieved but optical modes do not lase, because the total modal loss for each mode is higher than the corresponding modal gain. VCSLED operation may be desirable in some applications. In some embodiments, this is achieved by having a top mirror with a higher reflectivity than the bottom mirror, facilitating emission through the bottom mirror (or vice-versa). For instance, the top mirror may have a reflectivity above 99.9% (or 99.99%) whereas the bottom mirror has a reflectivity in a range 98-99% (or 99-99.9%, 99-99.5%, 98-99.9%, 98-99.5%, 97-99%, 95-99%).

In some VCSLED embodiments, stimulated emission occurs in a plurality of modes whose wavelengths coincide with the gain region, as shown on FIG. EE (D).

For a given device, the operation regime may switch depending on the current density (or on the input electrical power): it may operate as a vertical-cavity LED first at low power (spontaneous emission with small or negligible stimulated emission), then operate as a VCSLED (when stimulated emission becomes significant), then operate as a laser (when the lasing condition is reached for one or several modes). It may be desirable to design the device such that it operates preferentially in one regime at a selected electrical input power, to emit a selected output optical power. Embodiments include methods of designing a device, the methods comprising: selecting an electrical operation condition—such as electrical power and/or current density in the active region and/or threshold current, or ranges thereof—and selecting desired optical output conditions— such as a desired optical power, desired WPE, operation mode [e.g. superluminescent or lasing], number of emitting modes, divergence angle, M2 value, spatial coherence length, temporal coherence length—and configuring a device to meet the output conditions under the input conditions. In some embodiments, an input range of electric power is selected (e.g. 1-3 mW or 3-10 mW or 10-50 mW) and a device is configured to operate as a VCSLED in the range, while emitting with at least a desired WPE (e.g. at least 1% or 2% or 5% or 10% or 15% or 20% or 30%). Embodiments include the method of configuring such a device, and the resulting device.

In the case of a laser, a threshold (e.g. threshold current or current density or power or power density) may be defined conventionally as the operation point when lasing occurs. In the case of a superluminescent emitter, threshold may need a different definition, since the onset of stimulated emission may occur somewhat smoothly against operation conditions. Some possible definitions are as follows: at least 1% (or 0.1%, 5%, 10%) of the total light emission goes into a mode (or a plurality of modes) having gain; the active region modal gain (i.e. the gain ignoring other optical losses) for at least one optical mode is above a specific value (such as above 1 cm−1 or 5 cm−1 or 10 cm−1 or 50 cm−1 or 100 cm−1).

In a specific case, threshold is defined as the operation point where at least 10% of the total light emission goes into stimulated emission. Some embodiments are characterized by a low threshold current density, below 1 kA·cm−2 (or 500 A·cm−2, 300 A·cm−2, 200 A·cm−2, 100 A·cm−2, 50 A·cm−2). Some embodiments are further characterized by a small injected active area (e.g. less than $(10)^2$ um2 or $(5)^2$ um2 or $(3)^2$ um2 or $(1)^2$ um2 or $(0.5)^2$ um2). Accordingly, some embodiments are characterized by a low threshold current, below 0.1 uA (or 1 uA, 10 uA, 100 uA, 1 mA depending on the dimensions and threshold current). Embodiments are further characterized by a voltage on the order of 5V (or in a range 3-10V) and are driven at a current of less than 2 times (or 10 times) threshold. Embodiments are characterized by a total input electrical power below 1 uW (or 10 uW, 100 uW, 1 mW, 10 mW).

Some embodiments are characterized by operation at a low current with a high WPE (as discussed above), leading to efficient emission of stimulated emission with a low-to-moderate output power. The output power may be in a range 0.001-0.01 uW (or 0.001-0.01 uW or 0.1-1 uW or 1-10 uW or 10-100 uW or 100-1000 uW). In some embodiments, under device operation, the total current in the active region is of the form:

$G = G\_SRH + G\_spont + G\_Auger + G\_stim + G\_leak$. Where G_SRH is a Shockley-Read-Hall non-radiative current, G_spont is a spontaneous emission current, G_Auger is an Auger current, G_stim is a stimulated emission current, and G_leak is a carrier leakage current. Embodiments may be characterized by the fact that G_stim is large enough compared to other currents.

FIG. 69 a numerical simulation of relative currents for an embodiment having typical values for recombinations in a III-Nitride material (A=1e6s−1, B=1e−12 cm3s−1, C=5E-32 cm6s−1). No carrier leakage is assumed, for simplicity. The following values are used: mode overlap Gamma=0.5%, spontaneous emission factor beta=1e−4, material gain at threshold g=2.2e3 cm−1, mirror loss 10 cm−1, other losses 10 cm−1.

In FIG. 69, the quantities plotted are the relative values of each component divided by the total rate G (e.g. G_SRH/G, etc.), against the current density in the device. At low current, the SRH rate dominates; at moderate current, the radiative rate dominates; at higher current, the Auger rate dominates; at even higher current, the stimulated rate dominates. Some embodiments are characterized by operation with a value of G_stim/G which is at least 50% (or 1%, 10%, 20%, 80%, 90%). Since Auger scattering can be detrimental, some embodiments are characterized by having a relatively low contribution of Auger scattering at threshold—for instance, at threshold or at the operation point, G_Auger/G is less than 10% (or 5%, 20%, 50%).

Further, embodiments may be characterized by a low carrier leakage, with G_leak/G less than 10% (or 20%, 5%).

FIG. 70 is a graph 7000 that shows a numerical simulation of the stimulated output power against the current density, in log-log scale. The parameters are the same as in FIG. 69, but the mirror loss is varied. Curves (a, b, c) respectively correspond to alpha_m=1 cm−1, 10 cm−1, 100 cm−1 (when assuming a cavity length of 10 um, these values correspond to a mirror reflectivity of 99.9%, 99%, 90%). In each case, the power increases sharply at threshold. A higher mirror loss increases the threshold density. A higher mirror loss may further enable a higher total output power. Accordingly, the mirror loss may be configured to achieve a desired threshold current and output power. The device size may also be configured for a desired power. Some embodiments are configured for efficient emission with an output power in the range 1-10 mW (or 100 uW-1 mW, 10-100 uW, 1-10 uW, 10-100 mW, 100 mW-1 W). A plurality of devices may also be combined to reach a desired total power, each device having a lower output power.

Devices may be configured to be operated across a power range, for instance to modulate the intensity of the emission. The dynamic range (ratio of brightest to dimmest output) may be at least 2:1 or 5:1 or 10:1 or 100:1 or 1000:1 or 2000:1 or 10000:1 or 100000:1. The power range may be used in a display and modulated with a time pattern to vary the local brightness of a display (for instance, the local "pixel" brightness).

Due to the lower temporal coherence compared to conventional lasing action, some non-lasing embodiments (e.g. VCSLED or VCSEL having enough emission peaks) may exhibit reduced speckle. In some embodiments, such an emitter is employed in an imaging or display application.

In some embodiments, emission is characterized by emission with a temporal coherence length which is less than 10 um (or less than 20 um, 50 um, 5 um, 2 um, 1 um). In some embodiments the temporal coherence length is in a range 1-20 um.

The gain width and the emission width may be configured for reduced speckle. In some embodiments, the reduced speckle is related to a sufficiently wide emission. For smooth spectra, the width of the emission is often characterized by its full-width at half maximum. For an emitter whose spectrum consists of a series of sharp peaks, an effective FWHM may be defined as the FWHM of the smooth envelope formed by joining the peaks. This is illustrated in FIG. 68—in this figure, the envelope coincides with the gain shape, although this is not necessarily the case. In some embodiments, the effective FWHM is at least 1 nm (or 2 nm, 5 nm, 10 nm, 20 nm). The width of emission can alternatively be characterized by a standard deviation. For an emission spectrum $S(\lambda)$ (normalized to sum($Sd\lambda$)=1), a central wavelength $\lambda_0$ can be defined as $\lambda_0$=sum($S\lambda d\lambda$) and a standard deviation can be defined as $\Delta\lambda$=sqrnsum(($S\lambda-\lambda_0)^2 d\lambda$)). In some embodiments, the emission spectrum comprises a plurality of peaks, and the standard deviation of the spectrum is at least 1 nm (or 2 nm, 5 nm, 10 nm, 20 nm).

In some embodiments, such spectral width is achieved with a spectrum having at least 5 peaks (or 3, 10, 20, 50, 100 peaks). The peaks may be sharply-separated, as shown in FIG. EE (G-H); the peaks may be characterized by a peak-to-valley ratio of at least 10 (or 3, 100, 1000, 10,000).

In some embodiments, the device emits light in a plurality of optical modes (e.g longitudinal modes), and at least two (or three, five, ten) modes receive a substantial optical output. For instance, at least two modes emit and each has at least 10% of the total output power, or at least three (or five or ten) modes emit and each receives at least 2% (or 1%, 5%) of the total output power.

The temporal coherence length may be defined as Lc=sqrt [2.1 n(2)/π]$\lambda^2$/Δ$\lambda$. Here Δ$\lambda$ is the width of the emission (either the FWHM or the standard deviation may be used; the FWHM may be more convenient to use for a smoother spectrum and the standard deviation may be more convenient to use for a spectrum with separate sharp peaks).

In some embodiments, the emitter is further characterized by a spatial coherence. The spatial coherence may be high-enough to enable proper imaging, for instance in display applications. In some embodiments, this is achieved by restricting the size of the light-emitting surface. In some embodiments, the characteristic length of the emitting surface (i.e. the square root of its area) is less than 10 um (or 20 um, 50 um, 100 um, 5 um, 2 um, 1 um) or is in a range 1 um-50 um.

Some embodiments combine a sufficiently high spatial coherence length and a sufficiently low temporal coherence length, with desired values described above. This facilitates sharp imaging, e.g. with a holographic display or a display using interference to form images, while limiting speckle.

Embodiments are further characterized by their emission far-field pattern. The far-field pattern may be characterized by its emission beam angle. For an emitter having a direction of main emission (i.e. an angle at which the emission has a global maximum), the beam angle may be calculated as the standard deviation of the far-field pattern around the maximum in a polar plot (or in a spherical plot, if the far-field pattern lacks rotational symmetry in the azimuthal direction). Some embodiments are characterized by a narrow beam angle, such as less than 1 deg (or less than 5 deg, less than 10 deg, less than 0.1 deg, less than 0.01 deg).

Some embodiments are vertical emitters, with an emission angle less than 10 deg, emitting stimulated emission, wherein the stimulated emission current is at least 10% of the excitation current (which may be electrical or optical). In some embodiments, the stimulated emission occurs in at least two modes.

Embodiments include methods of operating a device in a desired regime. Methods comprise driving the device as a vertical cavity surface emitting laser (VCSEL), or as a vertical cavity superluminescent light emitting diode (VCSLED). The operation may be continuous, quasi-continuous, or pulses. Pulses may have a length of below 1 us (or 10 us, 100 ns, 10 ns, 1 ns), and a duty factor of below 1% (or 50%, 10%, 5%, 0.5%, 0.1%, 0.05%, 0.01%). In the case of pulsed operation, the device may be maintained at a first standby operation between pulses, and pulsed. This may prevent the long rise times which may otherwise occur when pulsing a device starting from zero bias due to high capacitance at low bias. For instance, the device is maintained at a voltage V0 at which light emission is low, and then pulsed to a higher voltage (or voltage waveshape) V1 which enables emission (superluminescent or lasing) with a fast-enough rise time. In some embodiments, the rise time is less than 1 us (or 100 ns, 10 ns, 1 ns). A device may also be modulated with pulse-width modulation at an appropriate frequency (e.g. at least 1 kHz or 10 kHz or 100 kHz or 1 MHz) to control its time-average intensity and provide dimming In the case of a superluminescent emitter, operation may be controlled to avoid lasing: for instance, the operation of the device is monitored (including monitoring of current, voltage, light emission, temperature); if the operation comes near a mode where laser emission is expected, the device drive is reduced (e.g. reduced current) to avoid lasing. In other cases, loss in the device may be controlled to avoid lasing, e.g. by having a region of controllable loss (such as an absorbing layer—QW or other—having contacts with an applied bias, wherein the bias controls absorption): the loss can be increased if the device comes close to a lasing behavior, and reduced otherwise.

In some embodiments, the device is driven with a modulated (i.e. non-constant) input (such as current, voltage or power, or other input parameters influencing the device output). This may result in a modulated light output. The input may be a superposition of a continuous signal and a time-varying AC signal (sinusoidal, triangular, square, and other waveforms). In some embodiments the AC signal is characterized by at least one amplitude and one frequency (these may be the amplitude and frequency of the input's Fourier harmonic with the largest weight). In some embodiments, the amplitude is at least 10% (or 5%, 20%, 50%) of the DC amplitude. In some embodiments, the frequency is fast enough that the modulation of the output is not perceptually visible by a user. In some embodiments the frequency is at least 1 kHz (or 100 Hz, 500 Hz, 10 kHz, 100 kHz, 1 MHz, 10 MHz, 100 MHz, 1 GHz). In some embodiments the frequency is in a range 1 kHz-1 GHz. The modulation may cause the shape of the emitted spectrum to be modulated (for instance, by varying the gain or the carrier density or the band structure around the active region). This may correspond to the wavelength of modes shifting, to a variation in emission width, or other variations in spectrum. The time-averaged light output may therefore be spectrally wider or smoother than it would if it were operated in CW mode. In some embodiments, the output spectrum has at least one peak and the modulation causes the peak to shift by +/−1 nm (or 0.01 nm, 0.05 nm, 0.1 nm, 0.5 nm, 2 nm, 5 nm, 10 nm) during modulation. In some embodiments, the shift is at least 50% (or 20%, 10%, 100%) of the free spectral range between modes. In some embodiments, the modulation reduces a speckle of the device, or of a display comprising the device. In some embodiments, upon unmodulated input, the device emits a spectrum having well-separated peaks; upon modulated input, the device emits a smoother spectrum, such as a spectrum having no well-separated peaks, or having peaks whose contrast (i.e. peak-to-valley ratio near the maximum emission) is reduced by at least a factor of 2.

FIG. 71 is a graph 7100 that illustrates an input modulation causing a smoother spectrum. The unbroadened spectrum has sharp peaks. Modulation displaces the unbroadened spectrum (dashed curve). The resulting broadened spectrum is smooth.

Although reduction of speckle by broadening the emission linewidth is a known technique, some embodiments significantly improve upon this by applying a speckle reduction scheme in a device having a plurality of modes with appropriate spacing, which may reduce the need for broadening each mode. For instance each mode only needs to be displaced by 1 nm (or a fraction of 1 nm, or the free spectral range), and the presence of several closely-spaced modes results in a smooth and wide spectrum.

In some embodiments, the device is capable of operating with a modulation frequency (measured as the −3 dB rollover frequency in the small-signal AC response of the device) which is at least 1 MHz (or 10 MHz, 100 MHz, 1 GHz, 10 GHz). Modulation speed may be limited by two effects: the transport time of carriers to the active region, and the recombination time of carriers in the active region. To enable high frequency modulation, the device may be configured to have a sufficiently-fast active region differential recombination time (such as less than 1 us, less than 100 ns, less than 10 ns, less than 1 ns, less than 0.1 ns). This lifetime may be controlled by configuring the active region [including using thin quantum wells (e.g. less than 3 nm or 2.5 nm or 2 nm or 1.5 nm] to increase electron-hole overlap]; by operating it at a high-enough carrier density [e.g. light emission from a layer having a carrier density of at least 1 e19 cm−3 or 2 e19 cm−3 or 5 e19 cm−3 or 1 E20 cm−3]; by operating with enough gain/stimulated emission to decrease the stimulated emission lifetime [e.g. to less than 10 ns or 1 ns or 0.5 ns or 0.1 ns or 0.05 ns or 0.01 ns]. To enable high frequency modulation, the device may be configured to have a sufficiently-fast transport time. This lifetime may be controlled by configuring the various layers of the device, including the barriers and the width of the depletion region; the transport time may be characterized by the product of the differential capacitance and resistance of the device's pn region; this time may be less than 10 ns or 1 ns or 0.1 ns or 0.01 ns or 0.001 ns.

In some embodiments, the temperature of the device (or of a system comprising the device) may vary over time, due to internal heating or to variations in ambient conditions. Some embodiments measure this temperature variation (for instance with a temperature sensor, or with an indirect probe such as a device voltage, which may be calibrated), and the device operation is modified based on a variation in temperature. For instance, a power (or voltage or current) driving the device may be varied in response to temperature. Power may be reduced in response to increased temperature. A cooling system (including conductive, convective, TEC) may be activated. Some embodiments have a peak wavelength which varies by less than a desired amount (10 nm or 5 nm or 2 nm or 1 nm) as temperature varies.

Some devices are included in a display system having a color gamut, wherein each apex of the color gamut polygon is stable, having a chromaticity movement du'v' of less than 0.01 (or 0.005, 0.003, 0.001, 0.0005) during device operation. A stable gamut may be desirable to provide stable color rendition to a user. Such color stability may pertain to the individual emission of a device used in a display. For clarity, the chromaticity movement refers to the maximum relative distance across points in the locus of the (u'v') chromaticity of an emitter during device operation. Accordingly, a chromaticity movement less than 0.001 means that across time during operation, the chromaticity locus remains within a circle of diameter 0.001.

Some embodiments emit an emission having a chromaticity which is stable over time, having a chromaticity movement du'v' of less than 0.01 (or 0.005, 0.003, 0.001, 0.0005) during device operation. Some embodiments comprise a plurality of emitters, wherein all emitters in the plurality have a similar peak emission wavelength within 3 nm (or 5 nm, 2 nm, 1 nm, 0.5 nm) of each other; or have a similar chromaticity within a (u' v') distance less than 0.01 (or 0.001, 0.001, 0.0005, 0.0001) of each other. Some embodiments comprise several pluralities of such emitters (e.g. a set of blue emitters, a set of green emitters, a set of red emitters) each having a consistent peak wavelength or chromaticity as disclosed.

Embodiments may emit a polarized emission. The geometry of the cavity may be configured to favor certain polarizations, for instance by breaking an in-plane symmetry (e.g. by making the cavity elliptical instead of circular, or more generally applying a deformation to the cavity). In some cases the cavity plane is perpendicular to the c-axis of a wurtzite epi structure, and has an in-plane shape which is not symmetrical with respect to the a- and m-directions of the wurtzite structure. In a case where degeneracy is lifted between two polarizations, the device may be configured to control the magnitude of the wavelength split between the two modes. For instance, a wavelength split may be about 1 nm (or 0.1 nm or 0.5 nm or 2 nm or 3 nm or 5 nm) or in a range 0.1-3 nm. This may enable stimulated emission into two modes having a slightly different wavelength.

Overall Loss and Efficiency

Some existing VCSELs suffer from limited wall-plug efficiency (WPE), limited external quantum efficiency (EQE), and high threshold current density due to excessive losses. For instance, T. Hamaguchi, et al., GaN-based Vertical-Cavity Surface-Emitting Lasers Incorporating Dielectric Distributed Bragg Reflectors, Applied Sciences, 2019, 9, 733, which is incorporated herein by reference in its entirety, reports on a VCSEL with a distant mirror having a threshold current of Jth=3.5 kA/cm2 and an EQE of about 2%, even at a high current density where stimulated emission has taken over other processes (e.g. J ten times Jth). This is indicative of high loss in the structure—namely, the unwanted loss may be about fifty times the useful mirror loss from the output mirror. The useful mirror loss is the loss resulting in a laser output or an output of stimulated emission (it doesn't include unwanted scattering mirror losses). The unwanted loss comprises all other losses and may be attributed to various channels, including loss in absorbing doped semiconductor layers, in contact and metal layers, in the substrate, scattering loss (e.g. due to roughness from the mesa), and residual scattering loss from the mirror.

With the teachings provided herein, such loss can be reduced, e.g., by a factor of two or three or five or even more. Embodiments may be characterized by a ratio of useful mirror loss to unwanted loss which is at least 3% or 5% or 10% or 20%.

FIG. 72 is a graph 7200 that shows embodiments with improved efficiency. It shows the relationship between current density (A·cm−2) and output power (mW) for a 3 um^2 VCSEL. The prior art result (a) suffers from high threshold, limiting the EQE to 2% (this result is similar to [Hamaguchi2019]). Reduction in the unwanted loss by a factor of two (b) or three (c) or five (d) result in much-reduced current density: respectively 1.6 kA/cm2 or 560A·cm2 or 280A/cm2, with corresponding peak EQEs of about 3% or 6% or 10%.

In some embodiments, the round-trip amplification for desired optical modes by the active region/gain region is about 1% (or 0.5%, 0.1%, 2%). This may be provided, for instance, by a material gain of about 1000 cm−1 through a 10 nm-thick gain region. Accordingly, embodiments provide total loss which is on the same order as this amplification, to enable stimulated emission or lasing.

More details on the implementation of loss reduction is provided hereafter. For clarity, a round-trip in the discussion hereafter refers to light starting at the top mirror in the downward direction (towards the substrate), and coming back to the top mirror after reflection at the intermediate mirror or at the bottom mirror.

P-Injection Loss

Conventional VCSELS often use a transparent conducting contact (TCO, such as e.g. ITO) for hole injection. TCOs, however, can be absorbing. The use of a tunnel junction (TJ) instead of a TCO has been proposed. However, TJs can also be absorbing. For instance, a TJ with an In layer for improved injection may provide interband absorption; and highly-doped layers may provide free-carrier absorption. It is anticipated that the single-pass absorption loss (e.g. the sum of the absorption from highly-doped layers and any interlayers, for a normal-incidence plane wave at the emission wavelength) through such a TJ may be at least 1%. Embodiments improve upon this, as described elsewhere, by placing the center of the TJ at a node of a desired longitudinal mode. Since the TJ has a spatial extent, the center of the TJ is defined as the position of the region where doping varies sharply from highly n-doped to highly p-doped (this center may be an n++/p++ interface, or it may be at a thin interlayer between n++ and p++ layers). In some embodiments, a round-trip absorption loss in the TJ is less than 0.1% (or 0.5%, 0.2%, 0.05%, 0.01%, 0.005%, 0.001%).

Diffraction Loss

Conventional VCSELs have rather thick optical cavities (several microns); when the lateral extent of the cavity is small, the lateral divergence of the optical modes causes a loss often called diffraction loss (because a mode of limited lateral extent diverges laterally). This can make it challenging to achieve efficient small-aperture devices. By using curved mirrors, the diffraction loss can be maintained at a sufficiently low value, e.g. a round-trip loss less than 0.1% (or 0.5%, 0.2%, 0.05%, 0.01%, 0.005%, 0.001%).

Substrate Absorption Loss

Some embodiments are characterized by having a single-pass substrate absorption $a\_0$, and a net substrate absorption $a\_n$, and a ratio $a\_n/a\_0$ which is unusually low. Single-pass substrate absorption is defined as the single-pass normal-incidence (i.e. along the vertical direction of the epi and device) absorption, for a plane wave at a wavelength characterizing the device (i.e. the peak emission wavelength of the active region). Net absorption is the net fraction of emitted light which is absorbed due to substrate absorption, during device operation.

In conventional vertical devices, if light "bounces" N times inside the device before escaping (with N being large, due to the high reflectivity required for some devices), then approximately $a\_n=N*2*a\_0$ (with a factor 2 accounting for a single round-trip). For definiteness, N is calculated as $4/T$ where T is the transmission of the output mirror (assuming the other mirror has much higher reflectivity) and the factor 4 comes from the mode resonance in the cavity. $a\_0$ can be measured, or can be calculated as $t*\text{alpha}$, where t is the thickness of the absorbing region of the substrate (e.g. 10 um or more) and alpha its absorption coefficient (e.g. 0.1 cm−1 or 1 cm−1 or more). A typical value for N may be 500 (or 1,000 or 10,000). Possible values for $a\_0$ may be 1E-4 (or 1E-3 or more).

Therefore, for a conventional device, $a\_n$ may be at least 10% (or several tens of %), which is very detrimental to device performance. In contrast, by configuring the intermediate mirror to decrease the field intensity in the substrate, embodiments reduce this value substantially. In some embodiments, $a\_n$ is less than 5% or less than 2% or less than 1%. Embodiments are characterized by a ratio $a\_n/a\_0$ which is less than N/2 (or N/5, N/10).

Embodiments are further characterized by a round-trip absorption through the device which is small compared to the single-pass absorption. In a conventional structure, the round-trip absorption is about twice the single-pass absorption. In the presence of an intermediate mirror however, the round-trip absorption can be reduced because only a fraction of the light travels in the substrate. For instance, the round-trip absorption is less than 1 time (or 0.5, 0.2, 0.1) the single-pass absorption, or its value is less than 0.1% (or 0.5%, 0.2%, 0.05%, 0.01%, 0.005%, 0.001%).

Doping Loss

The reduction of doping loss can be achieved similarly to that of the TJ loss: highly-doped layers can be placed near nodes of desired optical modes. In some embodiments, highly-doped layers are restricted to a thickness small compared to a period of the node (e.g. in the case of a III-nitride, the thickness may be less than 20 nm or 10 nm or 5 nm). The highly-doped layers may have a doping level above 1E19 cm−3 (or 2E19, 5E19, 1E20, 2E20). A plurality of highly-doped layers may be grown, separated by a distance equal to the distance between two nodes of an optical mode (lambda/2 n) or a multiple thereof, each highly-doped layer being placed near a node of a mode. For instance, a portion of the n-GaN epitaxial layer may comprise a periodic structure having pairs of highly-doped layers and layers of moderate doping (less than 1E19 cm−3 or 5E18 cm−3 or 1E18 cm−3), with a period about lambda/2 n (or lambda/n or other multiple), where each highly-doped layer is near a node of a mode.

In some embodiments, this results in a total round-trip loss due to doping layers less than 0.1% (or 0.5%, 0.2%, 0.05%, 0.01%, 0.005%, 0.001%).

Active Region Loss

The reduction of active region loss may be enabled by the use of a moderate number of quantum wells, and of "dummy" quantum wells facilitating carrier injection without absorbing light at the emission wavelength, as taught herein.

In some embodiments, this results in a total round-trip loss due to active region absorption less than 0.1% (or 0.5%, 0.2%, 0.05%, 0.01%, 0.005%, 0.001%).

Roughness-Induced Scattering Loss

Roughness scattering may be reduced as taught herein, including by reducing the roughness of mesas and/or by covering mesas with materials of intermediate index.

In some embodiments, this results in a total round-trip loss due to roughness scattering less than 0.1% (or 0.5%, 0.2%, 0.05%, 0.01%, 0.005%, 0.001%).

Loss at Non-Output Mirror

The loss at the non-output mirror can be reduced by forming a mirror with sufficient reflectivity, e.g. 99.9% or higher.

In some embodiments, a possible breakdown of round-trip loss though the full cavity is as follows:
Loss from TJ <0.1%
Loss from diffraction <0.1%
Loss from substrate <0.1%
Loss from doping <0.1%
Loss from active region <0.1%
Loss from scattering <0.1%
Loss from non-output mirror <0.1%
Total unwanted loss <1%.

Embodiments may combine some of all of the aforementioned low-losses, and have a total round-trip unwanted loss less than 1% (Or 0.5%, 0.2%, 0.1%).

Heatsinking/Thermal Management

Proper dissipation of generated heat at the active region can facilitate good performance, for instance by minimizing gain droop or excessive wavelength shift of a resonant mode or peak gain shift with increasing input current.

Some embodiments utilize the thermal conductivity of the epitaxial layers and nitride-containing substrate (or other substrate with high thermal conductivity) to spread the heat laterally first and increase the area for heat extraction out of the device. The anode and cathode contact then act as heat extractors from the device.

In some embodiments, the anode has limited area on top of the mesa to contact the device, limiting the heat extraction capabilities. However, a metallic redistribution layer can enlarge the anode contact over the top DBR to provide a low heat resistance path to the package.

The cathode may in general have a very large contact area to the device, and with the help of the substrate to help spread the heat laterally, may provide great heat extraction capabilities.

In some embodiments, the cathode is in contact with device layers (epi or substrate) with a surface area of at least 100×100 um (or 10×10 um, 500×500 um, 1000×1000 um).

The cathode and anode may be electrochemically or chemically plated to thick layers (e.g. more than 1 um or 10 um or 100 um), then planarized and finished by forming large contacts, to provide a convenient interface for bonding to a receiving package. The plated layer may be e.g. Cu, followed by e.g. a Au finishing layer for attaching to a package.

FIG. 73 is an illustration of a device 7300 with both anode and cathode on the active side of the device providing high heat extraction. This embodiment requires careful management of both contacts on the same side, requiring pattered package and redistribution layers. The package can be a material which is highly conducting thermally but insulating electrically (to allow vias) such as MN or a ceramic. It may also be a lead-frame package (e.g. with Cu leads) for lower cost and efficient heat extraction, as shown in a device 7400 in FIG. 74.

FIG. 75 is an illustration of a device 7500 with the cathode contact on the back of the substrate and wire-bonded to the package. This embodiment provides a single die attach contact, eliminating alignment needs. This may be suited for applications with moderate power.

System

Embodiments comprise display systems including emitters as-described herein.

In some embodiments, several devices are employed. The devices may be configured as an array (such as a line of devices, or a 2-dimensional array which may have a square, rectangular, triangular or other grid). The devices may have variable wavelengths or have substantially the same wavelength (e.g. the peak wavelength may be the same +/−1 nm or 2 nm or 5 nm or 10 nm or 20 nm). The devices may be operated at the same time or sequentially.

In some embodiments, a plurality of singulated devices is provided in a system. Alternatively, a plurality of devices may be formed during the semiconductor fabrication process and be provided without singulation of two or more devices. A plurality of non-singulated devices may be provided as an array (including a 1D or 2D array corresponding to a portion of a processed wafer). The spacing (or pitch) of a plurality of devices on-wafer may be governed by the desired size of a curved mirror. In some embodiments the curved mirror associated with each device is large enough to have a desired reflectivity. The system may comprise a red, a green and a blue emitter. A plurality of devices may comprise a first plurality of blue-emitting devices, a second plurality of green-emitting devices, a third plurality of red-emitting devices. Within each color range, several devices may be present with an identical wavelength or desired wavelength variations.

In some embodiments, the emitter facilitates a low speckle. The speckle at the system level may be characterized by selecting a nominally-uniform illuminated surface on output plane of the display (this plane may be a physical or virtual plane, including the focal plane which may be at the level of a user's retina), and computing the relative standard deviation of the intensity fluctuations across the surface. In some embodiments, speckle is evaluated by having the display produce a nominally uniform emission (e.g. a uniform white 'screen', or a uniform red/green/blue 'screen') and computing the relative standard deviation across the emission. In some embodiments, variance is computed across an area covering at least 10% (or 1%) of the total emission of the display; this area may be centered around the nominal center of the display.

The relative standard deviation (or contrast factor) is defined as $C=sqrt(<I2>-<I>2)/<I>$ where $<.>$ denotes averaging over the area of interest (e.g. full display or section of the display) and I is the local intensity of the display. In some embodiments, C is less than 0.1 (or less than 0.2, 0.05, 0.04, 0.01).

Embodiments may comprise an optical element to reduce optical feedback into the device cavity. For instance, a prism, a wedge, a mirror with a non-normal angle, or an optical element steering light in a non-normal direction, may be placed in an optical path of radiation. In this context, 'normal' refers to the vertical axis of the cavity.

A device may be used to optically excite a luminescent species (including a second semiconductor device, a quantum dot, a phosphor in powder or crystalline or ceramic or sintered or glass form) to produce a second luminescence.

Definitions Throughout the Application

Optical properties (including loss, gain, absorption, refractive index) may be considered at various wavelengths. In particular, they may pertain to the lasing wavelength, or to the peak emission wavelength of the active region, or to a wavelength selected for optical design.

While the discussion above is directed at III-Nitride materials, it should be understood that embodiments may pertain to other materials, such as other compound semiconductors (including AlGaInAsP and other III-V and II-VI compounds), organic emitters, hybrid emitters comprising semiconductor quantum dots (such as organic injection stacks with quantum dots active regions or "QLEDs"), etc.

Photonic structures may comprise a medium whose dielectric profile varies in one, two or three dimensions. This may be achieved in transparent medium (dielectric materials, semiconductor), for instance by etching holes and other shapes in the medium. The structure may be periodic—such as a photonic crystal having e.g. a square or triangular lattice. It may be pseudo- or quasi-periodic. It may have features whose shape varies along one or more directions (e.g. holes of varying size). It may comprise a photonic band gap at the lasing wavelength. It may provide high reflectivity for the optical lasing mode. It may provide efficient scattering of the optical mode, e.g. with a scattering efficiency higher than 99% (or 90%, 95%, 99.5%, 99.9%, 99.99%, 99.999%). It may have variations in dielectric profile with a characteristic length of 100 nm (or 200 nm, 300 nm, 400 nm) or in a range 100-1000 nm (or 200-600 nm), or in a range 0.5-5 (in units of lambda/n).

A vertical emitter is an emitter which emits in a direction substantially orthogonal to the epi growth direction. In such an emitter, a longitudinal mode is a mode along the epi growth direction and a lateral (or transverse) mode is a mode in the plane of the epi. Transverse mode may further be characterized by their polarization. A transverse mode may be polarization-degenerate or have a desired energy/wavelength splitting between the two polarization states.

"Monolithic" refers to a device wherein all elements are physically connected together (e.g. a solid-state device) rather than being spaced by a medium such as vacuum, air, a fluid, a gas.

Some embodiments comprise a holographic display. In some embodiments, a device is used to record a hologram and a same device is subsequently used to display images with the hologram.

While many embodiments shown here use vertical devices as examples, features disclosed herein may also beneficially be applied to other geometries, including lateral devices.

Methods and systems are disclosed herein with the aid of functional building blocks illustrating functions, features, and relationships thereof. At least some of the boundaries of these functional building blocks have been arbitrarily defined herein for the convenience of the description. Alternate boundaries may be defined so long as the specified functions and relationships thereof are appropriately performed. While various embodiments are disclosed herein, it should be understood that they are presented as examples. The scope of the claims should not be limited by any of the example embodiments disclosed herein.

What is claimed is:

1. A vertical-cavity laser device, comprising:
   a III-nitride-containing substrate having a thickness of at least 10 urn;
   an epitaxial stack grown on a top surface of the substrate that includes:
      an intermediate multilayer mirror having at least two pairs of low-index and high-index layers, characterized by an intermediate reflectivity in a range 10-50%, and
      an active region providing optical gain at a peak wavelength;
   a top mirror formed on at least a portion of the epitaxial stack, characterized by a top reflectivity higher than 99%; and
   a bottom mirror formed on a bottom surface of the substrate, characterized by a curved shape and by a bottom reflectivity higher than 99% and lower than the top reflectivity;
   wherein, when a current is injected into the active region, at least 10% of the current is converted into an emitted light having wavelengths near the peak wavelength due to stimulated emission from the active region.

2. The device of claim 1, having a single-pass substrate absorption above 1E-5, wherein the single-pass absorption is defined as single-pass normal-incidence absorption through the substrate for light at the peak wavelength.

3. The device of claim 1, wherein the stimulated emission is carried by one or several optical modes, each mode having a first peak intensity in the epitaxial stack and a second peak intensity in the substrate, wherein the second peak intensity is less than 50% of the first peak intensity.

4. The device of claim 1, wherein:
   the first and intermediate mirrors define a first optically resonant cavity having a thickness within a range of 2-15 lambda/n, where,
   lambda is the peak wavelength, and
   n is an optical index characteristic of the first optically resonant cavity.

5. The device of claim 1, wherein:
   a first layer of the epitaxial stack has a first level of doping to improve lateral carrier diffusion in the device;
   a second layer of the epitaxial stack has a second level of doping to reduce optical absorption in the device; and
   the first level of doping is higher than the second level of doping.

6. The device of claim 5, wherein a total absorption for stimulated emission through all the first and second doped layers of the device is below 0.5%.

7. The device of claim 1, wherein the stimulated emission is carried by one or several optical modes, each optical mode having a useful round-trip loss through the output mirror and a detrimental round-trip loss through other loss channels, wherein the detrimental round-trip loss is less than 1%, and wherein the other loss channels include doped semiconductor layers, contact and metal layers, the substrate, scattering loss, and/or residual scattering loss from one or more of the mirrors.

8. The device of claim 1, wherein the intermediate mirror includes AlInN layers lattice-matched to the substrate.

9. A vertical-cavity laser device, comprising:
   a III-nitride-containing substrate, having a thickness of at least 10 urn;
   an epitaxial stack grown on a top surface of the substrate that includes:
      an intermediate multilayer mirror having at least two pairs of low-index and high-index layers,
      an active region providing optical gain; and
      a tunnel junction;
   a top mirror formed on at least a portion of the epitaxial stack; and
   a bottom mirror formed on a bottom surface of the substrate.

10. The device of claim 9, wherein:
    a current is injected into the active region, and at least 10% of the current is converted into an optical mode due to stimulated emission from the active region;
    the optical gain structure is positioned approximately at an antinode of the optical mode; and
    the tunnel junction is positioned approximately at a node of the optical mode.

11. The device of claim 9, wherein an optical mode of the device is characterized by a mode amplitude caused by optical interference between the top mirror, the bottom mirror, and the intermediate multilayer mirror.

12. The device of claim 9, wherein:
    a lateral cross-sectional area of the tunnel junction is less than a lateral cross-sectional area of the device, to restrict electrical current to a predetermined portion of the device.

13. The device of claim 9, wherein the tunnel junction is associated with a differential contact resistivity below 1E-4 Ohm·cm2 at a current density of 1 kA·cm−2.

14. A semiconductor laser device, comprising:
    a substrate;
    a multi-layer structure, comprising epitaxial III-nitride layers, having a first surface in contact with a first surface of the substrate;
    a first mirror disposed over a second surface of the multi-layer structure;
    a second mirror disposed over a second surface of the substrate;

an intermediate mirror, characterized by a reflectivity in a range 10-50%, within the multi-layer structure;

an optical gain structure within the multi-layer structure;

a first optically resonant cavity within the multi-layer structure, bounded by the first mirror and the intermediate mirror, wherein the first optically resonant cavity includes the optical gain structure; and a second optically resonant cavity, bounded by the first and second mirrors, wherein the second optically resonant cavity includes the first optically resonant cavity, the second optically reflective layer, and the substrate.

15. The device of claim 14, wherein the thickness of the substrate is at least 10 um.

16. The device of claim 14, wherein the substrate includes a bulk gallium nitride (GaN) substrate.

17. The device of claim 14, wherein the first and intermediate mirrors are substantially planar and the second mirror is curved.

18. The device of claim 14, wherein the first mirror has a first reflectivity, the second mirror has a second reflectivity, the first and second reflectivities are higher than 99%, and the first reflectivity is higher than the second reflectivity.

19. The device of claim 14, having a single-pass substrate absorption above 1E-5, wherein the single-pass absorption is defined as single-pass normal-incidence absorption through the substrate for light at a peak emission wavelength of the optical gain region.

20. The device of claim 14, wherein the intermediate mirror is a multilayer reflector having at least 3 pairs of alternating low and high index layers.

21. The device of claim 14, emitting a stimulated emission carried by one or several optical modes, each mode having a first peak intensity in the first optically resonant cavity and a second peak intensity in the substrate, wherein the second peak intensity is less than 50% of the first peak intensity.

22. The device of claim 14, wherein:

the first optically resonant cavity has a thickness, between the first mirror and the intermediate mirror, within a range of 2-15 lambda/n, where, lambda is a lasing wavelength, and n is an optical index characteristic of the first optically resonant cavity.

23. The device of claim 14, wherein:

a first layer of the multi-layer structure has a first level of doping to improve lateral carrier diffusion and/or to reduce contact resistance;

a second layer of the multi-layer structure has a second level of doping to reduce optical absorption;

wherein the first level of doping is higher than the second level of doping.

24. The device of claim 14, wherein:

a total absorption for a resonant optical mode through all doped layers of the device is below 0.5%.

25. The device of claim 14, wherein the emitted light is carried by one or several optical modes, each optical mode having a useful round-trip loss through the output mirror and a detrimental round-trip loss through all other loss channels, wherein the detrimental round-trip loss is less than 1%.

26. An optical semiconductor laser device, comprising:

a substrate;

an epitaxial multi-layer structure having a first surface in contact with a first surface of the substrate and comprising an active region;

a first mirror disposed over a second surface of the multi-layer structure; and a second mirror disposed over a second surface of the substrate;

wherein a plurality of layers of the epitaxial multi-layer structure are configured to serve as an intermediate mirror and as an underlayer to reduce a density of non-radiative defects.

27. The device of claim 26, wherein the plurality of layers include an In-containing III-Nitride material.

28. The device of claim 26, wherein the plurality of layers include AlInN layers.

29. The device of claim 26, wherein the active region is characterized by a Shockley-Read-Hall lifetime tau, and the plurality of layers facilitate a value of tau longer than 10 ns.

* * * * *